US006570592B1

(12) United States Patent
Sajdak et al.

(10) Patent No.: US 6,570,592 B1
(45) Date of Patent: May 27, 2003

(54) SYSTEM AND METHOD FOR SPECIFYING TRIGGER CONDITIONS OF A SIGNAL MEASUREMENT SYSTEM USING GRAPHICAL ELEMENTS ON A GRAPHICAL USER INTERFACE

(75) Inventors: Gregory J Sajdak, Coloraado Springs, CO (US); Douglas James Beck, Colorado Springs, CO (US); Michael A. Upham, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/430,203

(22) Filed: Oct. 29, 1999

(51) Int. Cl.[7] ................................................. G06F 3/14
(52) U.S. Cl. ...................... 345/769; 345/835; 345/771; 345/440.1; 345/839; 345/773
(58) Field of Search ............................. 345/440.1, 771, 345/773, 965, 835, 839, 769, 94; 702/57, 66, 67, 68, 117

(56) References Cited

U.S. PATENT DOCUMENTS

| 5,371,851 | A | * | 12/1994 | Pieper et al. | ............... | 395/507 |
| 5,892,948 | A | * | 4/1999 | Aoki et al. | ................. | 395/701 |
| 5,953,009 | A | * | 9/1999 | Alexander | .................. | 345/348 |
| 6,259,993 | B1 | * | 7/2001 | Hori | ............................ | 702/30 |
| 6,327,544 | B1 | * | 12/2001 | Samuels | ..................... | 702/70 |

* cited by examiner

Primary Examiner—Kristine Kincaid
Assistant Examiner—Thomas T. Nguyen

(57) ABSTRACT

A system is disclosed for enabling a user to specify one or more trigger conditions by graphically creating a pictorial representation of the trigger conditions. The pictorial representation is presented on a display window of a graphical user interface of a logic analyzer and is accomplished using trigger-condition icons. Each icon represents a trigger condition of a signal or bus. The user specifies the trigger conditions by positioning the trigger-condition icons on the display window. The user does this by selecting, dragging, and dropping the trigger-condition icons onto the display window. The display window may include one or more name elements, each associated with a signal or a bus. The user may specify the trigger condition of a first signal or bus by selecting a trigger-condition icon and positioning it at a first position on the display window in horizontal alignment with the name element of the first signal or bus. Responsive to this action, the system displays a first trigger-condition element at the first position. The user may select the trigger-condition icon from a group of icons consisting of rising-edge icon, falling-edge icon, either-edge icon, low-level icon, high-level icon, don't care icon, bus icon, positive pulse icon, and negative pulse icon. The display window may include one or more vertically aligned constant time lines. The first position may be located on a first constant-time line, and the user may select other position on other constant-time lines. The user may specify a time-limit between the first and second constant-time lines, and or between the second and third constant-time lines. This specification may be that the time-limit is an indefinite time period, or that it is less than or greater than a user-specified time period. The system includes a trigger specifier that determines a combined trigger condition for a first state corresponding to the first constant-time line based on the first and second trigger-condition elements and one or more boolean expressions. These expressions may be predetermined, or they may be user-specified.

29 Claims, 29 Drawing Sheets

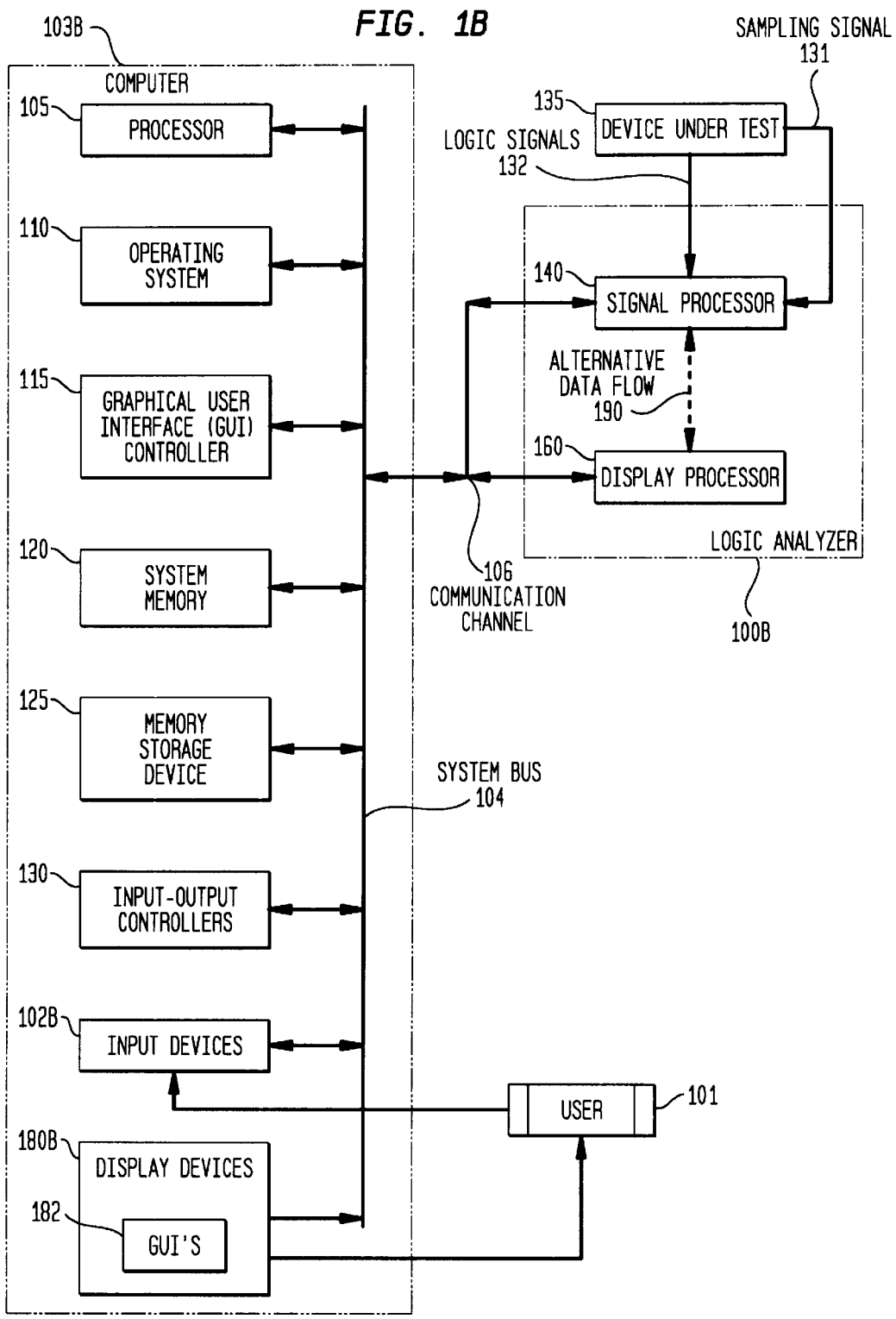

FIG. 14D

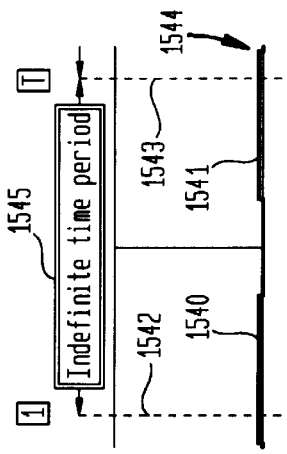
FIG. 15B
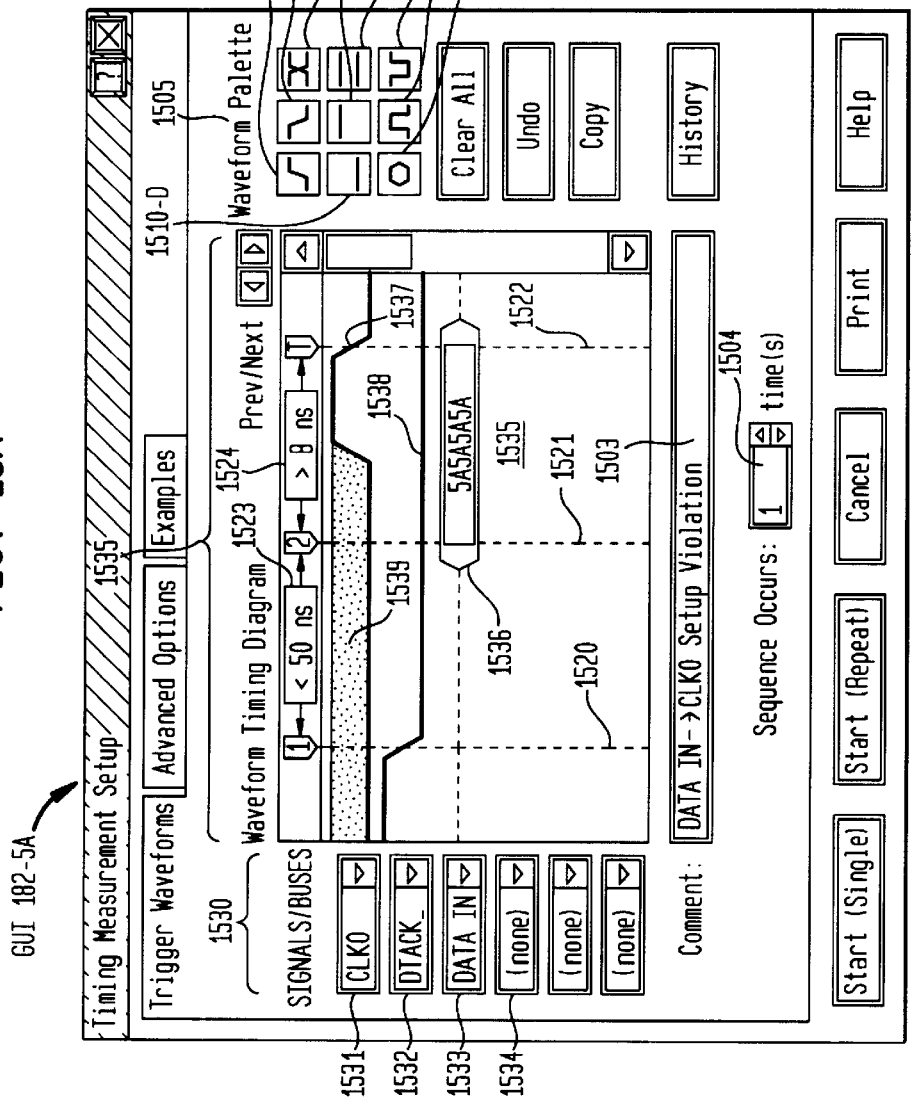
FIG. 15A
FIG. 15C

FIG. 15V
|  | Edge | High/Low | Pulse | Bus |
|---|---|---|---|---|
| Edge | OR | AND | OR | AND |
| High/Low | AND | AND | AND | AND |
| Pulse | OR | AND | OR | AND |
| Bus | AND | AND | AND | AND |
FIG. 15W
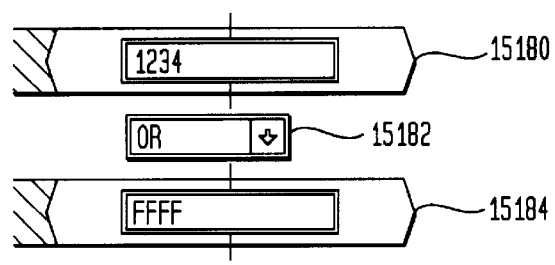
FIG. 15X
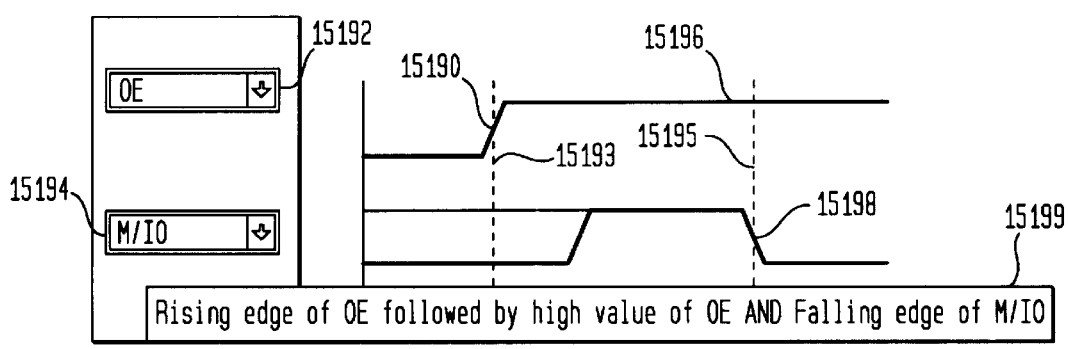

SYSTEM AND METHOD FOR SPECIFYING TRIGGER CONDITIONS OF A SIGNAL MEASUREMENT SYSTEM USING GRAPHICAL ELEMENTS ON A GRAPHICAL USER INTERFACE

RELATED APPLICATIONS

The following applications are related to the present application: U.S. patent application Ser. No. 09/430,108 entitled "System and Method for Manipulating Relationships Among Signals and Buses of a Signal Measurement System on a Graphical User Interface," assigned to the assignee of the present invention and filed concurrently herewith; U.S. patent application Ser. No. 09/430,197 entitled, "System and Method for Specifying Trigger Conditions of a Signal Mesurement Using Hierachical Structures On A Graphical User Interface," assigned to the asignee of the present invention and filed concurently herewith; U.S. patent application Ser. No. 09/432,840 entitled "System and Method for Defining and Grouping Signals and Buses of a Measurement System Using Selection Lists on a Graphical User Interface," assigned to the assignee of the present invention and filed concurrently herewith. The specification of the foregoing related applications are hereby incorporated herein by reference.

BACKGROUND

1. Field of the Invention

The present invention relates generally to signal measurement systems such as logic analyzers and digital oscilloscopes and, more particularly, to a system and method for specifying trigger conditions for signals and buses using a graphical user interface on a signal measurement system.

2. Related Art

Conventional logic analyzers and other signal measurement systems such as digital oscilloscopes allow a user to acquire and display digital signal data from a large number of logic signals (signals), such as those that travel over address, data and control lines of a device under test. A device under test may be a microprocessor, random access memory, or other types of chips or chip sets. A display device generally is used to allow the user to visualize the acquired signal data.

The signals typically are received from the device under test on physical electrical lines referred to as "channels." The channels may be physically assembled into groups called "pods." The received signals are sampled and digitized to form signal data. Digitizing is typically performed by comparing the voltage magnitude of each of these logic signal samples to a reference voltage threshold to determine the logic state of the signals received at each channel. Sampling may occur at one of a number of selectable rates, generally depending upon the frequency at which the sampled signals change logic states.

The resultant signal data are stored in a signal data memory generally having a fixed size, under the control of a sampling clock. The data typically are stored in a sequential manner so that consecutive signal samples are stored in consecutive memory locations. Due to the quantity of signal data, signal data memory is commonly implemented as a wrap-around buffer.

Selection of the portion of the data that is stored and subsequently presented on a display is determined by a user-defined trigger specification. The trigger specification is specified by two parameters, a trigger condition and a trigger position. The occurrence of the trigger condition indicates that data is to be stored. The trigger position determines how much data is stored before and/or after the trigger condition occurs.

The trigger condition may be specified using occurrences such as shift in a signal value from low to high (rising edge) or a shift from high to low (falling edge). Also, a trigger condition may be specified with reference to a signal state, such as a "logic high" state or a "logic low" state. These occurrences or states may be referred to as "events" for purposes of specifying a trigger condition. Alternatively, a trigger condition may be specified by requiring that a number of events occur simultaneously, or in a specified time sequence. Any of the logic signals received by the logic analyzer may be used to specify a trigger condition. The term "bus" conventionally is used to refer to a group of channels that are conceptually grouped together even though they need not be physically grouped together. Thus, for example, a bus may be defined as including channels A, B, and C to assist a designer in comparing and analyzing the signals present on those channels. To this end, the signals conceptually grouped together in the bus often are displayed together on a display device where they may be observed or measured by the designer. These signals may be displayed as waveforms. Also, the values of the signals in the bus at a particular instant, collectively referred to as the "bus value" at that time, may be displayed. For example, the logic analyzer may determine that the value of the signal A at a particular time is the binary value "0," the value of the signal B is "1" at that time, and the value of the signal C is "0" at that time. The bus consisting of those signals may then be said to have the binary value "010," which may also be expressed as a hexadecimal value, or a value in any other base.

Buses may be used to specify trigger conditions in a manner analogous to that in which signals are used. For example, a bus "event" may be defined as the occurrence of a bus value "equal," or "not equal," to a particular value. Referring to the previous example, a bus event for the bus consisting of channels A, B, and C may be defined as "equals 010." This event occurs when channels A, B, and C have the values noted above. In other known variations, a trigger condition may be specified as the occurrence of a bus value within, or, alternatively outside, a specified range of bus values.

After a trigger condition has been specified, the user may initiate the capture of signal samples. A trigger sequencer generally is used to compare each of the signals identified as contributing to the trigger condition to the specified trigger condition. When the trigger sequencer determines that the signal data matches the specified trigger condition, the trigger sequencer determines if trigger position is satisfied. If the trigger position has been selected to indicate that the display should include only signal data collected prior to occurrence of the trigger condition, then data collection typically ceases upon the occurrence of the trigger condition. Conversely, if the trigger position has been selected to indicate that the display should include only signal data collected subsequent to the occurrence of the trigger condition, the signal data memory generally is allowed to fill with data after the occurrence of the trigger condition. Alternatively, the user may chose a trigger position between these two positions, resulting in a data display that includes signal data that occurred both before and after the trigger condition. The signal data then may be sequentially read from the signal data memory and displayed to the user.

There are numerous conventional formats for displaying the signal data to the user. These formats vary depending on, among other things, the number of signals that are displayed, the manner in which signal data are grouped, the time axes used to display the signal data, the manner in which trigger conditions and trigger positions are shown, and so on.

Conventional signal measurement systems typically require the user to open a separate dialog box to specify and to alter the format in which the signal data are displayed. Aspects of the format that the user may wish to alter include, for example, changes in the groupings of signals into buses, renaming of signals and buses, or adding or removing signals or buses from the display. A drawback to these conventional systems is that the dialog box for changing the format of the display obscures the user's view of the signals that are being manipulated. A second drawback of using dialog boxes to alter the display is that they generally are not intuitive. That is, they typically require that the user learn a particular syntax and learn other techniques for changing the format of the display. Conventional systems thereby generally require that new users invest significant amounts of time learning how to manipulate the display formats. If this learning is not frequently used, it may be forgotten. The user must then re-learn the syntax and other particulars of display formatting at a subsequent time. Even expert and frequent users suffer from the inconvenience and distraction of having to open and operate the display formatting dialogue box separate from the data signal display.

SUMMARY

The present invention is directed in one embodiment to a system for enabling a user to specify one or more trigger conditions by graphically creating a pictorial representation of the trigger conditions. The pictorial representation is presented on a display window of a graphical user interface of a signal measurement system and is accomplished using trigger-condition icons. Each icon represents a trigger condition of a signal or bus. The signal measurement system may be a logic analyzer.

In some embodiments, the user specifies the trigger conditions by positioning the trigger-condition icons on the display window. The user does this by selecting, dragging, and dropping the trigger-condition icons onto the display window. The display window may include one or more name elements, each associated with a signal or a bus. The name elements may be user-specified, as by using combo boxes.

In these embodiments, the user may specify the trigger condition of a first signal or bus by selecting a trigger-condition icon and positioning it at a first position on the display window in visual association with the name element of the first signal or bus. Responsive to this action, the system displays a first trigger-condition element at the first position. The visual association of the trigger-condition icon with the name element may be accomplished by horizontal alignment; for example, by positioning the icon on a row occupied by the name element. In some implementations, however, the visual association with the name element may be by vertical alignment; i.e., by columns.

In these and other embodiments, the user may select the trigger-condition icon from a group of icons consisting of rising-edge icon, falling-edge icon, either-edge icon, low-level icon, high-level icon, don't care icon, bus icon, positive pulse icon, and negative pulse icon. In some implementations, when the user selects the trigger-condition icon to be a bus icon and positions it in visual association with a name element of a signal, the trigger-condition element is not displayed. Similarly, in some implementations, when the user selects the trigger-condition icon to be one of a group of icons consisting of a rising-edge icon, falling-edge icon, either-edge icon, low-level icon, high-level icon, positive pulse icon, and negative pulse icon, and positions it in visual association with a name element of a bus, the trigger-condition element is not displayed.

In these and other embodiments, the user may specify the trigger condition of a second signal or bus by selecting a trigger-condition icon and positioning it at a second position on the display window in visual association with the name element of the second signal or bus. This action thereby results in the displaying of a second trigger-condition element at the second position. In some implementations of those embodiment, the name element of the first signal or bus and the name element of the second signal or bus are associated in a hierarchical structure. This hierarchical structure may be vertically aligned, and the visual association with the name element may be by horizontal alignment.

The display window may include a first constant time line. The first position may be located on the first constant-time line. In these embodiments, the visual association to the name element may, but need not be, by horizontal alignment. When the association is by horizontal alignment, the first constant-time line may be vertically aligned. The user may specify the trigger condition of a second signal or bus by selecting a trigger-condition icon and positioning it at a second position on the display window in visual association with the name element of the second signal or bus and on the first constant-time line. The result of this action is that the system displays a second trigger-condition element at the second position.

The display window may include a second vertically aligned constant-time line positioned to the right of the first constant-time line. The user may specify the trigger condition of the first signal or bus by selecting a trigger-condition icon and positioning it at a second position on the display window in visual association with the name element of the first signal or bus and on the second constant-time line. The result of this action is that the system displays a second trigger-condition element at the second position. The system may include a display coordinator that connects the first and second trigger-condition elements based on predetermined rules so that the state of the first signal or bus is not ambiguous between the first and second constant-time lines.

Also, when the visual association with the name element is by horizontal alignment, the display window may include a third vertically aligned constant time line positioned to the right of the second constant-time line. The user specifies the trigger condition of the first signal or bus by selecting a trigger-condition icon and positioning it at a third position on the display window in visual association with the name element of the first signal or bus and on the third constant-time line. The result of this action is that the system displays a third trigger-condition element at the third position. The display coordinator may connect the second and third trigger-condition elements based on the predetermined rules so that the state of the first signal or bus is not ambiguous between the second and third constant-time lines.

The user may specify a time-limit between the first and second constant-time lines, and or between the second and third constant-time lines. This specification may be that the time-limit is an indefinite time period, or that it is less than or greater than a user-specified time period.

In some embodiments, the system includes a trigger specifier that determines a combined trigger condition for a first state corresponding to the first constant-time line based on the first and second trigger-condition elements and one or more boolean expressions. These expressions may be predetermined, or they may be user-specified.

In alternative embodiments, the invention is direction to a method for enabling a user to specify one or more trigger conditions on a display window of a graphical user interface of a signal measurement system. The method includes the steps of: (1) enabling a user to select a trigger-condition icon representing a trigger condition of a signal or bus; and (2) enabling the user to position the icon on the display window by dragging and dropping it.

The above embodiments are not necessarily inclusive or exclusive of each other and may be combined in any manner that is non-conflicting and otherwise possible, whether they be presented in association with a same, or a different, aspect of the invention. The description of one embodiment is not intended to be limiting with respect to other embodiments. Also, any one or more function, step, operation, or technique described elsewhere in this specification may, in alternative embodiments, be combined with any one or more function, step, operation, or technique described in the summary. Thus, the above embodiments are illustrative rather than limiting.

BRIEF DESCRIPTION OF THE DRAWINGS

The above and further advantages of the invention will be more clearly appreciated from the following detailed description when taken in conjunction with the accompanying drawings, in which like reference numerals indicate like structures or method steps, in which the leftmost one or two digits of a reference numeral indicate the number of the figure in which the referenced element first appears (for example, the element 240 appears first in FIG. 2, the element 1010 appears first in FIG. 10), rectangles generally indicate functional elements or method steps, parallelograms generally indicate data structures, diamond shapes generally indicate decision elements of a method, and wherein:

FIG. 1B is a functional block diagram of another embodiment of a logic analyzer in accordance with the present invention;

FIGS. 14A–14D are embodiments of graphical user interfaces in accordance with one technique for display of information from, and/or provision of trigger condition information to, a trigger specifier of the display processor of FIG. 6;

DETAILED DESCRIPTION

The attributes of the present invention and its underlying method and architecture will now be described in greater detail with reference to one embodiment of the invention, referred to as logic analyzer 100, aspects of which are illustrated in FIGS. 1 through 17. Logic analyzer 100 generates and stores sampled data representing logic signals from a device under test. Logic analyzer 100 also displays representations of the sampled data to a user based on user selections of logic signals and trigger conditions. The user makes these selections based on a graphical user interface (also sometimes referred to as a "display window," whether or not in a Windows operating system environment) that may include a hierarchical signal-organizing area, a signal display area, and a trigger specification area. Although the illustrated embodiment is directed to a logic analyzer, the invention is not so limited. For example, the invention may be directed to a network analyzer, spectrum analyzer, waveform generator, digital or analog oscilloscope, or another instrument or signal measurement system for testing or measuring the performance of devices that generate digital or analog signals.

Figure 1A:
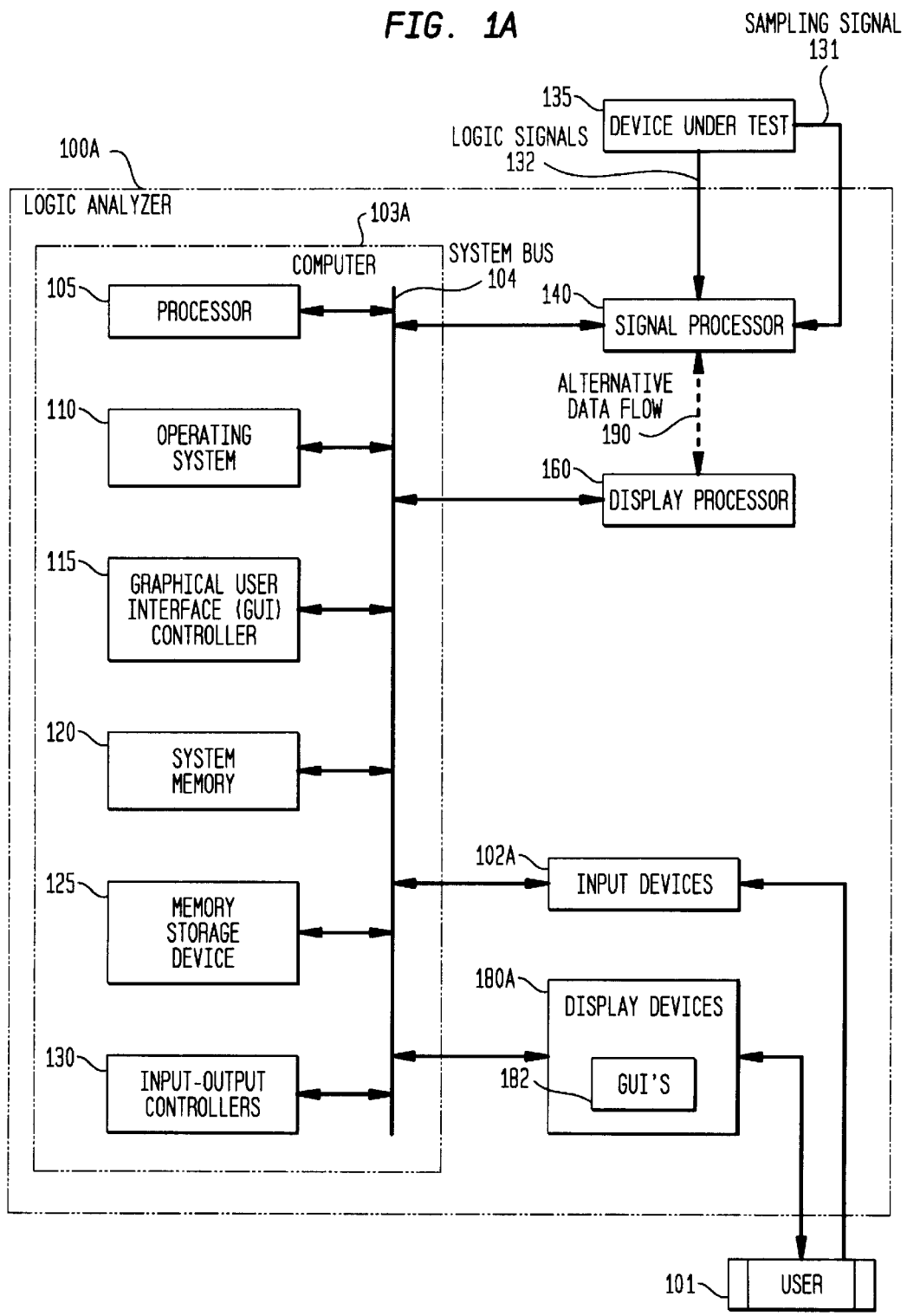
FIG. 1A is a functional block diagram of one embodiment of a logic analyzer in accordance with the present invention.

FIG. 1A is a functional block diagram of one embodiment of a logic analyzer in accordance with the present invention, referred to as logic analyzer 100A. As shown in FIG. 1A, logic analyzer 100A includes computer 103A that performs various conventional computing operations used to generate the graphical user interface and to support the functions of other elements of logic analyzer 100A. FIG. 1B is a functional block diagram of another embodiment in accordance with the present invention that is functionally similar to the embodiment of FIG. 1A except that computer 103B is not included in logic analyzer 100B. That is, computer 103B is external to logic analyzer 100B and is communicatively connected to logic analyzer 100B via communication channel 106 in accordance with any of a variety of known techniques, typically involving input-output controllers 130. For example, logic analyzer 100B may be connected to a parallel port of computer 103B. With respect to either of the illustrated embodiments, the graphical user interface is displayed to the user on one or more of display devices 180A or 180B of logic analyzer 100A or computer 103B, respectively. The user makes selections and provides other data by employing one or more of input devices 102 of logic analyzer 100. Hereafter, references to "logic analyzer 100" will be understood to refer to either logic analyzer 100A or logic analyzer 100B, unless the context otherwise requires. Similarly, references to "computer 103" will be understood to refer to either computer 103A or logic computer 103B, unless the context otherwise requires.

Logic analyzer 100 includes a signal processor 140 and a display processor 160. Signal processor 140 samples and digitizes logic signals from the device under test, compares the resulting sampled data to user-selected trigger conditions, and, when the sampled data match the trigger conditions and satisfy user-selected trigger position requirements, stores user-selected portions of the sampled data in a display memory. Display processor 160 enables a user to select various operating parameters of signal processor 140, to name and select signals for display, to determine groupings and hierarchical relationships among the signals, to specify trigger conditions using the groupings and hierarchical relationships, to specify trigger conditions using manipulations of graphical elements, to select particular signals or groups of signals for display, and to select a graphical type of display of sampled data. Display processor 160 also enables the sampled data to be displayed on a graphical user interface so that the sampled data is associated with representations of the signals that generated the data. These signal representations are organized according to the groups and hierarchical relationships selected by the user.

Signal processor 140 and display processor 160 may be implemented in hardware, software, firmware, or any combination thereof. In the illustrated embodiment, it generally is assumed for convenience that signal processor 140 is implemented in hardware and that display processor 160 is implemented in software. Thus, in the illustrated embodiment, software-implemented functional elements perform the operations of display processor 160. That is, the functional elements of the illustrated embodiment comprise sets of software instructions that cause the described functions to be performed. These software instructions may be programmed in any programming language, such as C++ or another high-level programming language. Display processor 160 may therefore be referred to as "a set of display-processing instructions," and its functional elements may similarly be described as sets of instructions. Illustrative embodiments of computer 103, signal processor 140, and display processor 160 are now described in greater detail, with reference to illustrative graphical user interfaces 182.

Computer 103, Input Devices 102, and Display Devices 180

Computer 103 may be a computing device specially designed and configured to support and execute some or all of the functions of signal processor 140 and/or display processor 160. Computer 103 also may be any of a variety of types of general-purpose computers such as a personal computer, network server, workstation, or other computer platform now or later developed. Computer 103 may be physically located in the same chassis or location as processors 140 and/or 160, or it may be physically remote from either or both processors and connected thereto by known networking or communication devices through known network or communication channels. Some functions of processors 140 and/or 160 may be implemented in software that is executed on computer 103. However, as noted, hardware or firmware, or any combination of software, hardware, and firmware, may also implement some or all of the functions of processors 140 and/or 160.

Computer 103 typically includes known components such as a processor 105, an operating system 110, a graphical user interface (GUI) controller 115, a system memory 120, memory storage devices 125, and input-output controllers 130. It will be understood by those skilled in the relevant art that there are many possible configurations of the components of computer 103 and that some components that may typically be included in computer 103 are not shown, such as cache memory, a data backup unit, and many other devices.

Processor 105 may be a commercially available processor such as a PA-RISC processor made by Hewlett-Packard Company, a SPARC® processor made by Sun Microsystems, a 68000 series microprocessor made by Motorola, an Alpha processor made by Digital Equipment Corporation, a Pentium® processor made by Intel Corporation, a PowerPC microprocessor, or it may be one of other processors that are or will become available.

Processor 105 executes operating system 110, which may be, for example, one of the DOS, Windows 3.1, Windows for Work Groups, Windows 95, Windows 98, or Windows NT operating systems from the Microsoft Corporation; the System 7 or System 8 operating system from Apple Computer; the Solaris operating system from Sun Microsystems; a Unix®-type operating system such as the HPUX version of the Unix® operating system made by Hewlett-Packard Company or another Unix®-type operating system available from many other vendors such as Sun Microsystems, Inc. or AT&T; the freeware version of Unix® known as Linux; the NetWare operating system available from Novell, Inc.; another or a future operating system; or some combination thereof. Operating system 110 interfaces with firmware and hardware in a well-known manner, and facilitates processor 105 in coordinating and executing the functions of various computer programs, such as GUI controller 115, and other computer programs that may be written in high level programming languages. Operating system 110, typically in cooperation with processor 105, coordinates and executes functions of the other components of computer 103. Operating system 110 also provides scheduling, input-output control, file and data management, memory management, and communication control and related services, all in accordance with known techniques.

System memory 120 may be any of a variety of known or future memory storage devices, including, for example, any commonly available random access memory (RAM), magnetic medium such as a resident hard disk or tape, an optical medium such as a read and write compact disc, or other memory storage device. Memory storage device 125 may be any of a variety of known or future devices, including a compact disk drive, a tape drive, a removable hard disk drive, or a diskette drive. Such types of memory storage device 125 typically read from, and/or write to, a program storage device (not shown) such as, respectively, a compact disk, magnetic tape, removable hard disk, or floppy diskette. Any of these program storage devices may be a computer program product. As will be appreciated, these program storage devices typically include a computer usable storage medium having stored therein a computer software program and/or data.

Computer software programs, also called computer control logic, typically are stored in system memory 120 and/or the program storage device used in conjunction with memory storage device 125. As noted, computer software programs, when executed by processor 105, enable computer 103 to perform the functions of display processor 160 of the illustrated embodiment. In other embodiments, one or more functional elements of signal processor 140 may also be implemented as computer software programs that are executed by processor 105. Accordingly, those computer software programs may be referred to as controllers of computer 103.

In some embodiments, the present invention includes a computer program product comprising a computer usable medium having control logic (computer software program, including program code) stored therein. The control logic, when executed by processor 105, causes processor 105 to perform some of the functions of the invention, as described herein. In other embodiments, some functions of the present invention are implemented primarily in hardware using, for example, a hardware state machine. Implementation of the hardware state machine so as to perform the functions described herein will be apparent to those skilled in the relevant arts.

Input-output controllers 130 could include any of a variety of known devices for accepting and processing information from a user, whether a human or a machine, whether local or remote. Such devices include, for example, modem cards, network interface cards, sound cards, or other types of controllers for any of a variety of known input devices 102 such as a keyboard, mouse, touch-screen display, touch pad, or microphone with a voice recognition device. Output controllers of input-output controllers 130 could include controllers for any of a variety of known display devices 180 for presenting information to a user, whether a human or a machine, whether local or remote. Display devices 180 could include, for example, a video monitor, printer, audio speaker with a voice synthesis device, network connection, or modem connection. Input-output controllers 130 could also include any of a variety of controllers for other types of known or future input or output devices such as a compact disk drive, a tape drive, a removable hard disk drive, a diskette drive, or another kind of removable storage device. If one of display devices 180 is a video monitor, it may be any of a variety of known or future video monitors that present a visual output using a cathode ray tube, a liquid crystal display, or another known or future visual-output component. Typically, the visual-output component is logically and/or physically organized as an array of picture elements, sometimes referred to as pixels.

Graphical user interface (GUI) controller 115 may be any of a variety of known or future software programs for providing graphical input and output interfaces between computer 103 and a user, and for processing user inputs. In some embodiments, GUI controller 115 may be incorporated in operating system 110. GUI controller 115 may also be implemented in hardware or firmware, or any combination of hardware, firmware, and software. To avoid confusion, references herein to a "GUI" are directed to one or more graphical user interfaces, such as various implementations of GUI's 182 of the illustrated embodiment, that are displayed on one of display devices 180 to a user 101. To be distinguished are references to a "GUI controller," such as GUI controller 115, that operates to display the GUI's to the user and to process input information provided by the user through the GUI's. As is well known in the relevant art, a user may provide input information using a GUI by selecting, pointing, typing, speaking, and/or otherwise operating, or providing information into, one or more of input devices 102 in a known manner. As is described in greater detail below, various implementations of GUI's 182 include graphical and/or textual data, such as waveforms of sampled logic signals, or numerical listings of the values of those signals. These data may be displayed to provide information to user 101 about the logic signals, and need not necessarily be selected or otherwise referenced by user 101 to provide input to logic analyzer 100. Thus, portions of GUI's 182 may provide output information from logic analyzer 100 to user 101, rather than enable user 101 to provide input information to logic analyzer 100.

In the illustrated embodiment, the functional elements of computer 103 communicate with each other, and with the other functional elements of logic analyzer 100, via system bus 104. Some of these communications may be accomplished in alternative embodiments using network or other types of remote communications, such as when computer 103 is not in the same location, or in the same chassis, as processors 140 or 160. Also, various other known communication buses, channels, and connections may also be used in a known manner instead of, or in conjunction with, system bus 104.

In the illustrated embodiment, user 101 is assumed to be a human, but it need not be so. User 101 may be a computer, a recording and playback device, or another type of machine.

Signal Processor 140

As noted, signal processor 140 samples and digitizes logic signals from the device under test, compares the resulting sampled data to user-selected trigger conditions, and, when the sampled data match the trigger conditions and satisfy user-selected trigger position requirements, stores user-selected portions of the sampled data in a display memory. Device under test 135 of the illustrated embodiment may be any of a variety of known or existing devices that produce, or have operations that may be assessed by measuring, logic signals or other types of analog or digital waveforms. For example, device under test 135 may be a microprocessor, random access memory, another type of chip or chip set, a data bus or address bus, or another input-output bus or other communication channel. For illustrative purposes, it is assumed that device under test 135 has a number of measurement points at which any conventional probe device may be connected to measure logic states represented by analog voltages. The illustrative analog voltages measured in this manner are hereafter referred to as logic signals 132. For convenience, logic signals 132 are shown in the Figures as a single data line, but it will be understood that each of logic signals 132 may be carried on a single wire or other communication channel (not shown) so that multiple wires or channels carry logic signals 132 from device under test 130 to signal processor 140. Alternatively, in other embodiments, some or all of logic signals 132 may be multiplexed so as to be carried over one communication channel in accordance with known techniques.

Figure 2:
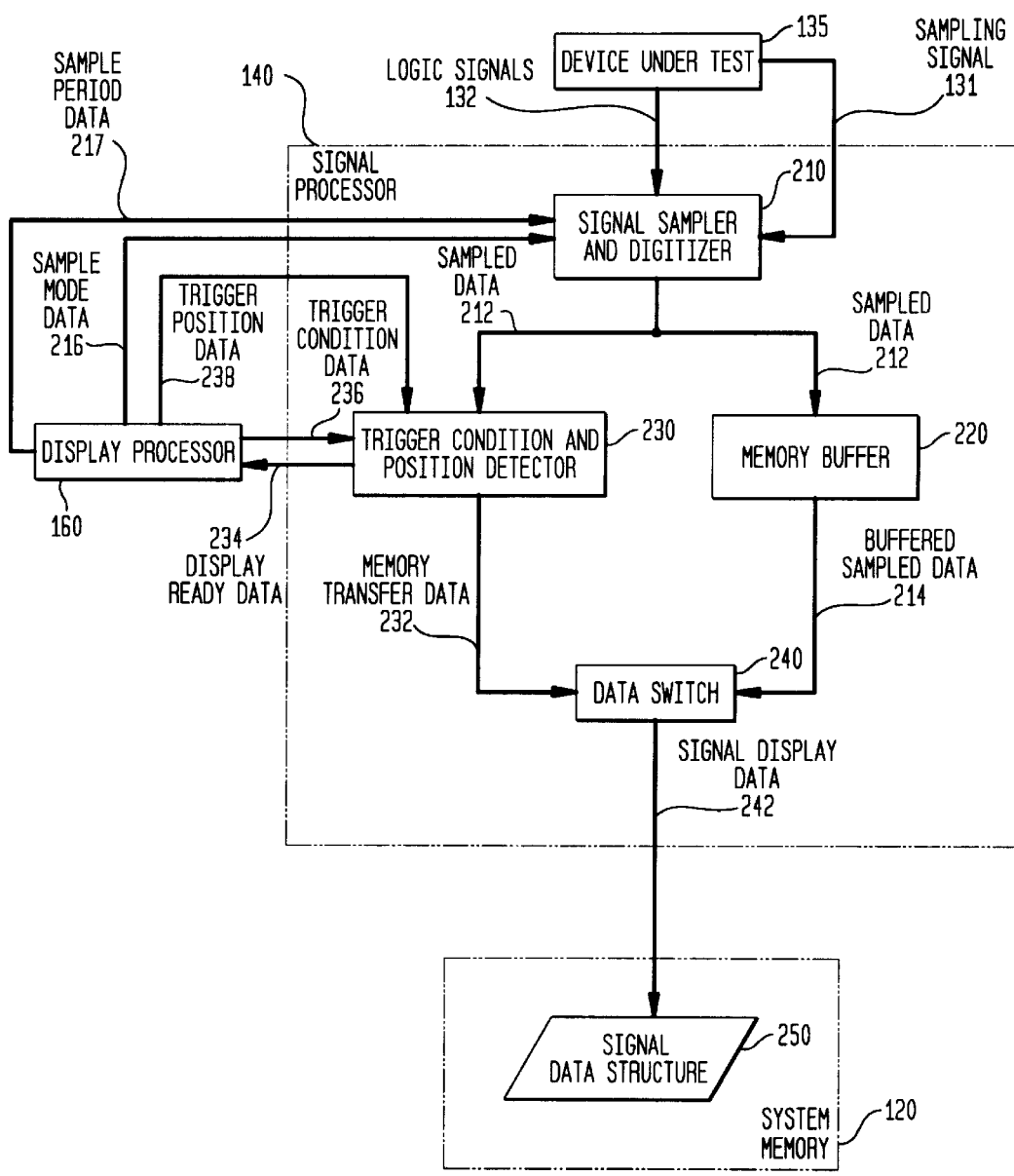
FIG. 2 is a functional block diagram of one embodiment of a signal processor of the logic analyzer of FIGS. 1A or 1B.

FIG. 2 is a functional block diagram of signal processor 140. As shown in FIG. 2, signal processor 140 includes sampler 210. Sampler 210 of the illustrated embodiment includes known or future electrical circuits, firmware, and/or software for receiving, sampling, and digitizing logic signals 132, and storing the results in memory.

Sampler 210 (hereafter, simply "sampler 21038 ) samples logic signals 132 at intervals referred to as sample periods. In one implementation of the illustrated embodiment, the sample periods are determined based on one or more signals generated by device under test 130, represented by sampling signal 131 in FIGS. 1 and 2. Sampling signal 131 may be one or more signals that indicate, for example, that the signals in a bus have attained a stable state. As another example, sampling signal 131 may be a clock signal generated by device under test 130. In these implementations, sampler 210 conventionally is said to be operating in a synchronous sampling mode, and logic analyzer 100 may be referred to as a state analyzer.

In other implementations, the sample period is a regular time interval based on sampling data selected or determined (hereafter, simply "selected") by user 101 and communicated to sampler 210 via computer 103. In these other implementations, sampler 210 conventionally is said to be operating in an asynchronous sampling mode, and logic analyzer 100 may be referred to as a timing analyzer. In the illustrated embodiment, it generally is assumed for convenience that sampler 210 is operating in an asynchronous sampling mode. Thus, sampling data 162 of FIG. 2 represents information regarding either the user-selected or computer-generated sample period. The generation of sampling data 162 is described in greater detail below in relation to the operations of sample specifier 610.

The digitizing operation of sampler 210 may be accomplished in accordance with any of a variety of known techniques, or ones to be developed in the future, for converting analog signals to digital signals. Alternatively, or in addition, the digitizing function of sampler 210 may include various conditioning operations such as removing channel noise, scaling, decoding, and/or decrypting logic signals 132. The data resulting from the sampling and digitizing operations of sampler 210 are represented in FIG. 2 by sampled data 212. As noted with respect to logic signals 132, it will be understood that sampled data 212 is shown in FIG. 2 as a single data line for purposes of clarity and convenience. However, sampled data 212 may include multiple, parallel, data lines; for example, one data line corresponding to each of the sampled and digitized representations of each of the multiple logic signals 132. Also, as with logic signals 132, the multiple sampled data 212 may be multiplexed onto one or more lines. The representation in the illustrated embodiment of multiple data lines by a single data line may not hereafter be referred to, but will be understood to be implicit.

Signal processor 140 also includes a memory buffer 220. In accordance with known techniques, sampler 210 stores sampled data 212 in memory buffer 220. For convenience, the data typically are stored in a sequential manner under the control of a clock (not shown) internal to signal processor 140 so that consecutive signal samples are stored in consecutive memory locations. Due to the quantity of sampled data 212, signal data memory is commonly implemented as a "wrap-around," also called "circular," buffer; i.e., a memory of a determined, limited, size so that when the buffer is full, additional data is stored in the memory locations holding the oldest stored data, which is thereby lost.

Signal processor 140 also includes trigger condition and position detector 230 (hereafter, simply "detector 230") that receives sampled data 212 from sampler 210 and, using any of a variety of known circuits and/or methods, determines when a trigger condition is satisfied in sampled data 212. Detector 230 also determines whether sampler 210 should continue to generate samples in order to satisfy data requirements related to a trigger position specified by user 101. The techniques by which user 101 specifies the trigger condition and the trigger position are described below in relation to the operations of trigger specifier 640.

Figure 3:
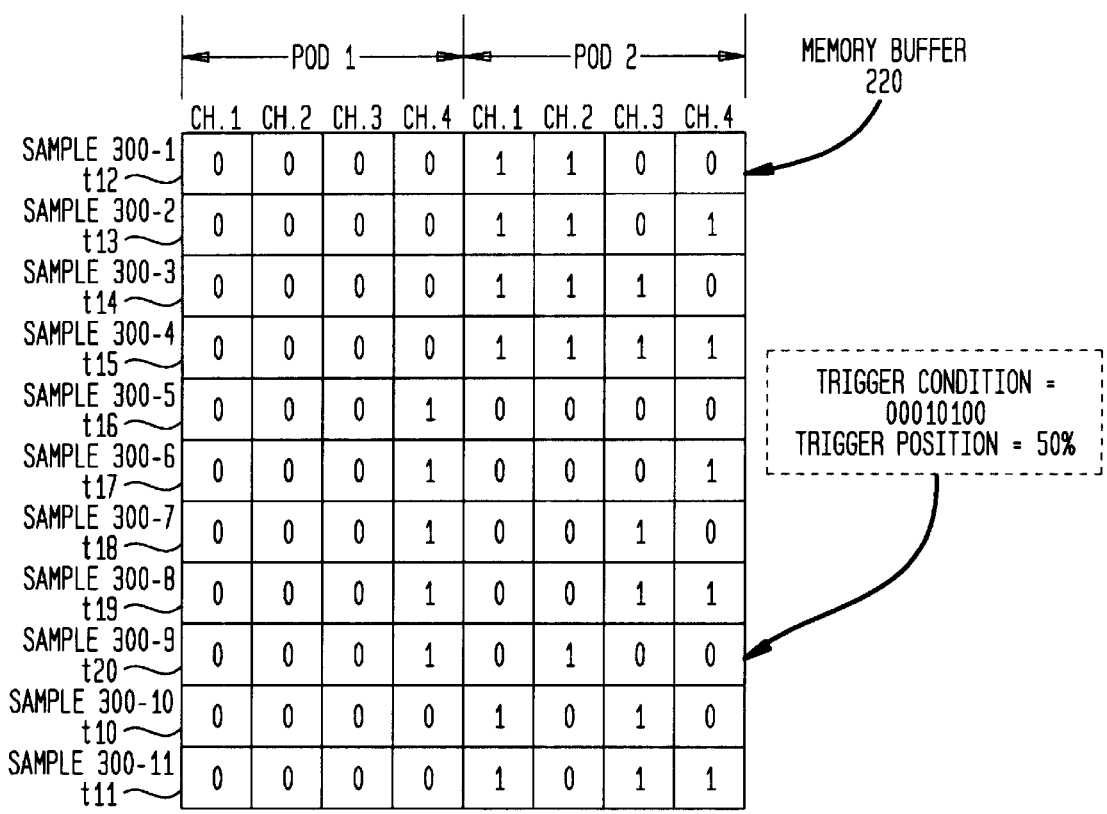
FIG. 3 is a simplified schematic representation of one embodiment of a memory buffer of the signal processor of FIG. 2.

FIG. 3 is a simplified schematic representation of memory buffer 220 that illustrates the operations of detector 230. In the illustrated embodiment, memory buffer 220 is organized in an array format, but it need not be so. It is assumed for illustrative purposes that sampler 210 generates sampled data 212 that are derived from eight logic signals 132. Sampler 210 stores these samples in wrap-around memory buffer 220. As shown in FIG. 3, it is assumed that four of the eight signals are provided to sampler 210 over channels 1 through 4 of an illustrative pod 1, and the other four are provided over channels 1 through 4 of an illustrative pod 2.

In the illustrated embodiment, it is not necessary that each of the eight channels be active; that is, user 101 may not have connected some of the channels to device under test 135, or user 101 may have connected a channel but may not be interested in the signals communicated over the channel. Nonetheless, it is assumed for convenience that memory buffer 220 of the illustrated embodiment is configured for potentially storing data related to all eight channels. Thus, for example, the first column of memory buffer 220, labeled "Ch. 1" under "Pod 1" in FIG. 3, is reserved for data that may or may not be received over channel 1 of pod 1, and so on for the other channels of pod 1 and the four channels of pod 2. Thus, in the illustrated embodiment, the memory location of data related to each of the eight channels, i.e., sampled data from each of logic signals 132, is predetermined. However, other arrangements may be used in other embodiments. For example, only data obtained over operative channels may be stored in memory buffer 220, and the correspondence between data from a channel and the identification of that channel may be established in a look-up table (not shown).

It is further assumed for clarity and convenience that memory buffer 220 is configured for storing eleven samples of each of the eight channels. These eleven samples are represented by the eleven rows labeled sample 300-1 through sample 300-11, generally and collectively referred to hereafter as samples 300. As will be evident to those skilled in the relevant art, memory buffer typically is much larger than shown in this illustrative example; that is, the number of samples typically is much larger than eleven. As is also evident, the number of samples generally depends on various design and/or operational factors such as the durations and resolutions of the waveforms to be displayed to user 101.

For illustrative purposes, it is assumed that sampled data 212 of sample 300-1 was sampled by sampler 210 at time "t12," sampled data 212 of sample 300-2 was sampled one sample period "T" later, at time "t13," and so on, up to an illustrative current time t20. Samples 300-10 and 300-11 in this example were sampled prior to sample 300-1, at times t10 and t11, respectively. The value of sampled data 212 for each of the eight channels for each sample is represented by either a "0" for a low logic level, or "1" for a high logic level.

Figure 4:
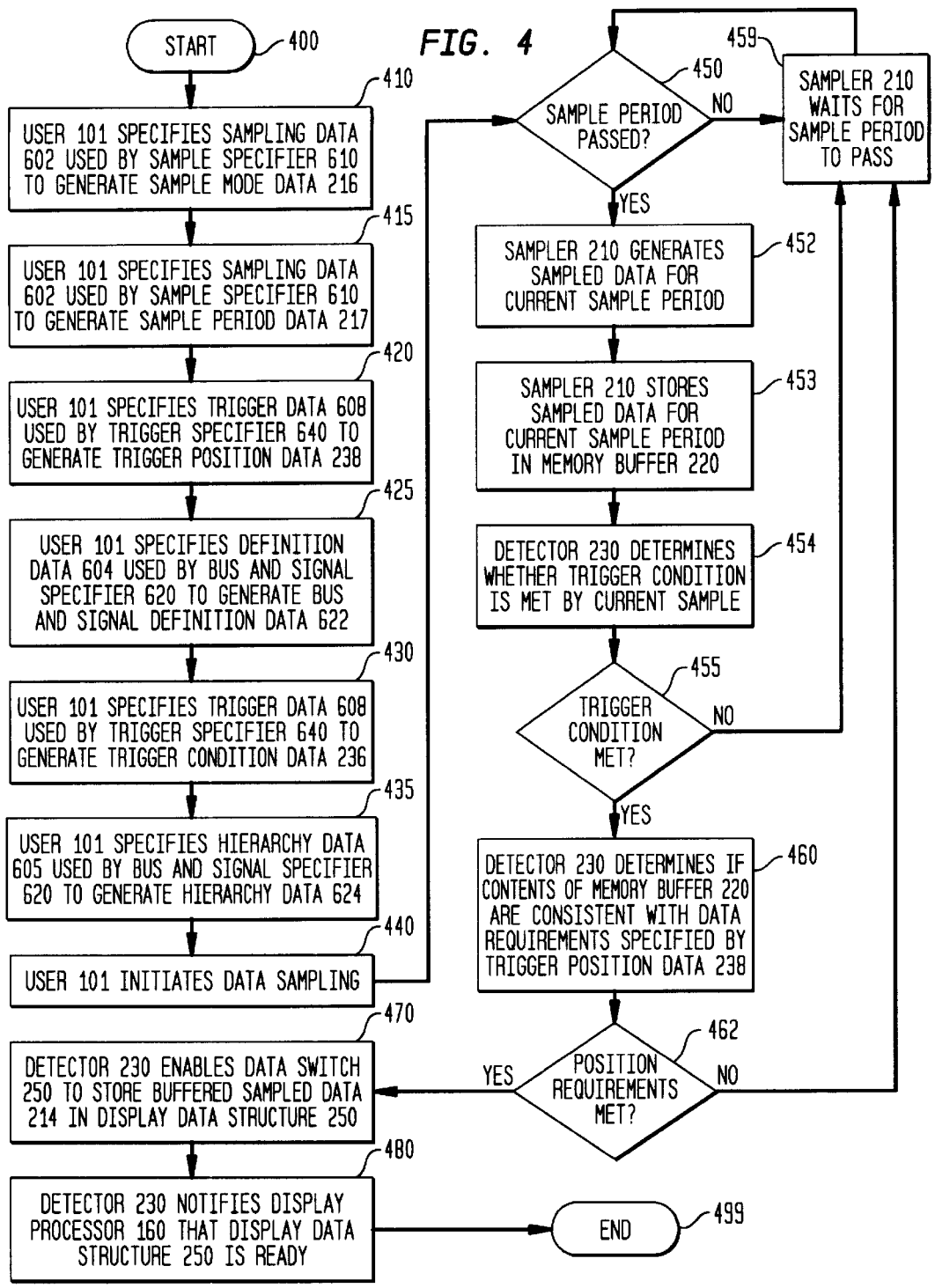
FIG. 4 is a flow diagram of one embodiment of a method for using and implementing the logic analyzer of FIGS. 1A or 1B.

FIG. 4 is a simplified flow chart representing, among other things, one of a number of possible methods for storing sampled data 212 in memory buffer 220. Some of the method steps shown in FIG. 4 relate to elements of logic analyzer 100 not included in signal processor 140, and are discussed below in relation to those other elements. In particular, it is assumed for illustrative purposes that user 101 has specified that the sampling mode is asynchronous, the sample period is "T," and the trigger position is 50 percent, in accordance with steps 410, 415 and 420, respectively. Further, it is assumed that user 101 has specified trigger condition data 236 (see step 430) to indicate that the trigger condition is met when channels 1 through 4 of pod 1 have the values 0, 0, 0 and 1, respectively, and channels 1 through 4 of pod 2 have the values 0, 1, 0, and 0, respectively.

Memory buffer 220 of FIG. 3 is shown at a time when 20 sample periods have passed, i.e., sampler 210 has stored sampled data 212 in memory buffer 220 at times t1 through t20. Because memory buffer 220 is a wrap-around memory, the samples stored at times t12 through t20 have overwritten the samples previously stored at times t1 through t9, respectively. For each of the sample periods between t1 and t20, sampler 210 has acquired each of the eight logic signals 132, generated a digitized sample of each of the eight signals, and stored the sample in a corresponding row of samples 300 of memory buffer 220, as indicated by decision element 450 and steps 452 and 453 of FIG. 4.

For each of the sample periods indicated by times t1–t19, detector 230 compares trigger condition data 236 with the corresponding samples 300 of sampled data 212 in memory buffer 220 and, it is illustratively assumed, determines that the trigger condition has not been met (see step 454 and decision element 455). Thus, for each of those sample periods, sampler 210 waits for the sample period to pass (see step 459) and then generates the next sample of the eight signals, stores the samples, and provides detector 230 with sampled data 212 so that it may make the trigger condition determination (see decision elements 450 and 455, and steps 452, 453, and 454).

At the time illustrated in FIG. 3, i.e., t20, the current sampled data (sample 300-9 of FIG. 3, which is highlighted for ease of reference) corresponds to the trigger condition assumed in the present example. Thus, as indicated by step 460, detector 230 then determines if the contents of memory buffer 220 are consistent with the data requirements specified by trigger position data 238. As noted, it is illustratively assumed that user 101 has specified that the trigger position is 50 percent; i.e., that the trigger condition occurs at the mid-point of the sampled data to be displayed. Because memory buffer 220 is a wrap-around buffer, the largest number of samples that may be displayed in this illustrative example is eleven since, after sample 300-11 is stored, the next sample overwrites the data previously stored in sample 300-1. Thus, in this example, the mid-point of the sampled data is that point at which there are five samples available for display that occurred prior in time to the occurrence of the trigger condition, and there are five samples available for display that occurred subsequent to the occurrence of the trigger condition.

Assuming that it is desirable to retain the maximum amount of information, it is evident that samples 300-4 through 300-8 should therefore be retained and that an additional five samples subsequent to sample 300-9 should be obtained; i.e., samples should be obtained up to and including time t25 (not shown). Detector 230 employs any of a variety of known techniques to determine the additional number of samples to obtain, if any (see step 460). Sampler 210 thus processes an additional five samples over the subsequent five sample periods for each of the eight channels. The first two of these five samples are shown in FIG. 3 as samples 300-10 and 300-11. The remaining three samples overwrite the data shown in FIG. 3 for samples 300-1 through 300-3, and are not shown in FIG. 3. As another example, it may be assumed that user 101 had selected the trigger position to be 90 percent, meaning that 90 percent of the displayed data is data that had been sampled prior to the time at which the trigger condition had been met. In that case, detector 230 would determine that an additional one or two samples (depending on how rounding is done) should be obtained. Returning to the example of a trigger position of 50 percent, detector 230 determines that the trigger position requirement has been met after the additional five samples subsequent to sample 300-9 are obtained; i.e., at time t25 (see decision element 462).

Signal processor 140 also includes data switch 240 that enables and/or manages the transfer of data from memory buffer 220 to signal data structure 250 (hereafter, simply data structure 250). This data as moved or copied from memory buffer 220 is represented as buffered sampled data 214 in FIG. 2, and the data as moved or copied into data structure 250 is represented as signal display data 242. More specifically, when detector 230 determines that the trigger position requirement has been met, it communicates this condition to data switch 240, or enables data switch 240 in response to this condition, in accordance with any of a variety of known techniques (see step 470). This communication or enablement is illustratively represented in FIG. 2 by memory transfer data 232. Memory transfer data 232 of the illustrated embodiment may also include address information to facilitate data switch 240 in moving or copying data from memory buffer 220 to data structure 250 in a convenient format or order. For example, data switch 240 may store the moved or copied information in sequential memory locations of data structure 250 corresponding to the temporal sequence in which the samples were obtained. For example, with reference to the assumed selection of a 50 percent trigger position, samples 300-4 through 300-11, and then samples 300-1 through 300-3, may be stored in sequential memory locations in data structure 250. Those skilled in the relevant art will be aware of various techniques that may be employed to enable detector 230 to determine memory transfer data 232 and to communicate data 232 to data switch 240. Various techniques also are well known in accordance with which data switch 240 may employ data 232 to move or copy data from memory buffer 220 to data structure 250.

In the illustrated embodiment, detector 230 also indicates to display processor 160 that the appropriate display information has been entered into data structure 250, as represented by display-ready data 234. In alternative embodiments, data switch 240 or sampler 210 may provide this indication. Also, in alternative embodiments, sampler 210 may provide display-ready data 234.

Figure 5:
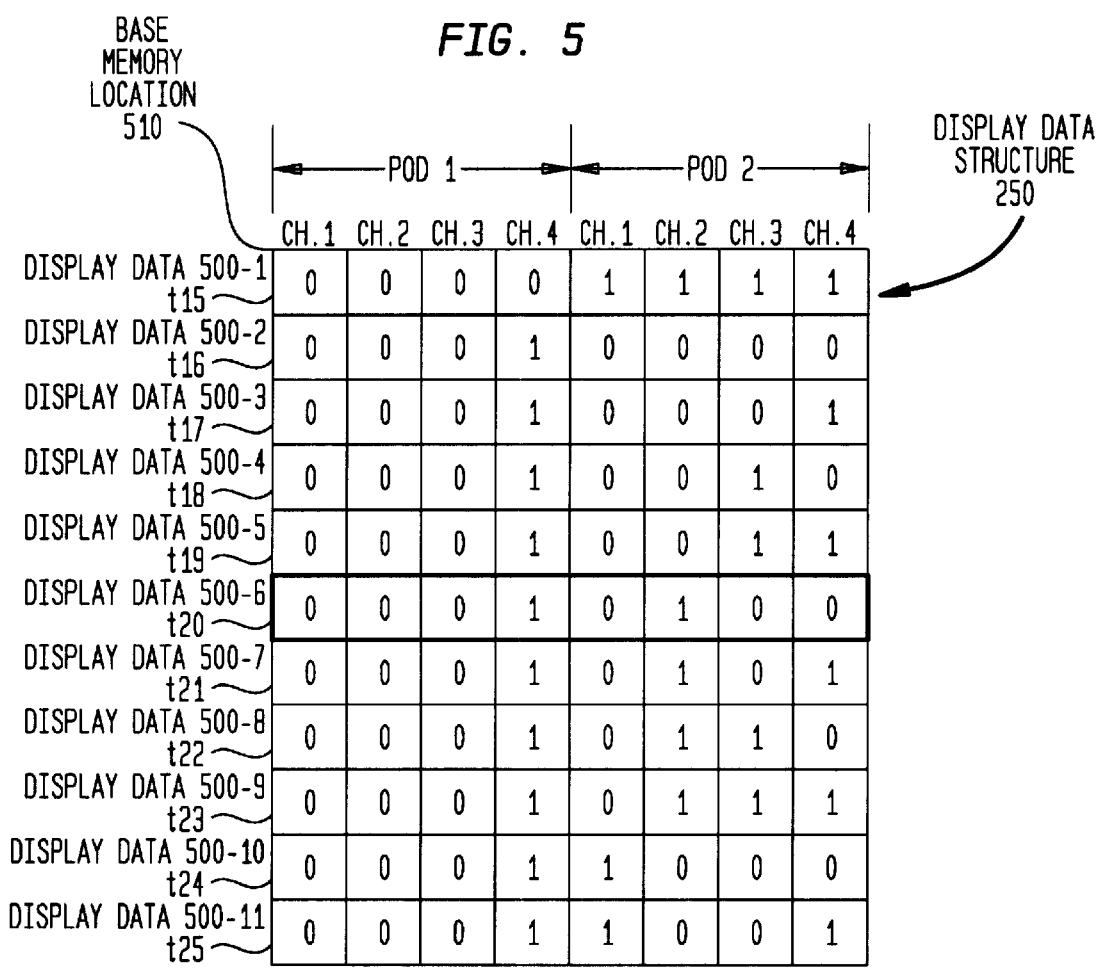
FIG. 5 is a simplified schematic representation of one embodiment of a display data structure for storage of display data by the signal processor of FIG. 2.

FIG. 5 is a schematic representation of one of many possible embodiments of data structure 250. As indicated schematically in FIG. 2 of the illustrated embodiment, the data in data structure 250 is stored in system memory 120 of computer 103. (Hereafter, it will simply be said that data structure 250 is "located" in system memory 120.) In alternative embodiments, data structure 250 may be located in another local or remote computer, in a memory device in signal processor 140, in distributed memory, or in accordance with any of a variety of known techniques for storing data. For illustrative purposes, data structure 250 is shown in FIG. 5 as being organized in an array format similar to that shown with respect to memory buffer 220. That is, sampled data from the eight illustrative signals obtained at the same time "t," i.e., during the same sample period, are arranged in a single row. The first of these rows is labeled "display data 500-1," the second is labeled "display data 500-2," and so on through the eleventh row labeled "display data 500-11." These rows may generally and collectively be referred to as display data rows 500.

As noted above with respect to the organization of memory buffer 220, it is illustratively assumed that memory locations are reserved in data structure 250 for data from each of the illustrative eight channels irrespective of whether those channels are operative. Thus, it is predetermined in the illustrated embodiment that the column of data labeled "Ch. 1" under "Pod 1" in FIG. 5 is reserved for signal display data 242 related to channel 1 of pod 1, and so on for the other seven channels. As will be evident to those skilled in the relevant art, an advantage of this arrangement is that it facilitates identification of data related to a particular channel. For example, the memory location of the first sample of display data from the first of the illustrative eight signals has a location in system memory 120 that may be determined in accordance with known techniques. This memory location is referred to as base memory location 510. Because it is illustratively assumed that memory locations are reserved for data from each of the eight channels, the memory location of the next sample of display data from the first of the eight signals may readily be calculated by adding an offset of eight memory locations to base memory location 510. Equivalently, it may be said that data structure 250 has an array organization so that sampled data from a particular signal obtained at sequential times, i.e., in sequential sample periods, are arranged in a single column.

Data structure 250 may be arranged or organized in many other ways in other embodiments, as will be evident to those skilled in the relevant art. For example, an additional row may be provided in data structure 250 (not shown) in which are stored identifiers from a look-up table (not shown) that identify the data in that column has having been obtained over a particular channel. Various types of hash tables may also be used. These alternative embodiments of data structure 250 may be advantageous with respect to reducing the amount of storage in system memory 120 required for data structure 250.

As noted, it is assumed for convenience that data switch 240 has stored signal display data 242 into data structure 250 in an order corresponding to the temporal sequence in which the samples were obtained. Thus, the first row in data structure 250, containing display data 500-1, was obtained at time t15, corresponding to samples 300-4 of memory buffer 220 as shown in FIG. 3. As noted, samples 300-4 was determined by detector 230 to be the first sample of sampled data 212 to be retained in memory buffer 220 based on the illustrative assumption that user 101 selected a 50 percent trigger position. Thus, display data 500-2 through 500-6 correspond to samples 300-5 through 300-9, obtained at times t16 through t20, respectively, of FIG. 3. Display data 500-7 through 500-11 correspond respectively to sampled data 212 entered into memory buffer 220 at times t21 through t25; i.e., during sample periods subsequent to that shown in FIG. 3. Display data 500-6, containing the sampled data that matched the trigger condition, is highlighted in FIG. 5 to more clearly show that its location in data structure 250 corresponds to the 50 percent trigger position selected by user 101.

Display Processor 160

Logic analyzer 100 also includes display processor 160 that is assumed for convenience to be implemented in software in the illustrated embodiment. Thus, display processor 160 could be shown in FIG. 1 as being included in computer 103 in the same manner as other functional elements, such as operating system 110 or GUI controller 115, may be implemented in software and therefore included in computer 103. In FIG. 1, display processor 160 is shown as being external to computer 103 to indicate that display processor 160 need not initially be located in computer 103. For example, display processor 160 may be in the form of one or more executable files, or files that may be transformed into executable files, that are transferred to computer 103 from a remote location over a network, locally over a connector cable, or on programmable media read by one of input devices 102. Also, as noted, display processor 160 may, in alternative embodiments, by implemented in hardware, firmware, software, or any combination thereof that operates partially or completely independently from computer 103. In those, or other, embodiments, display processor 160 may communicate directly with signal processor 140, as indicated by alternative data flow line 190 of FIG. 1.

It will be understood by those skilled in the relevant art that the functions ascribed to display processor 160, if implemented in software, typically are performed by processor 105 of computer 103 executing the set of display-processing instructions, typically in cooperation with operating system 110 of computer 103. Henceforth, the fact of this cooperation among processor 105, operating system 110, and display processor 160 may not be repeated or further described, but will be understood to be implied. It will also be evident to those skilled in the relevant art that, if implemented in software, display processor 160 may be loaded into system memory 120 and/or memory storage device 125 through one of input devices 102. All or portions of display processor 160 may also reside in a read-only memory or similar device of memory storage device 125, such devices not requiring that display processor 160 first be loaded through input devices 102. It will be understood by those skilled in the relevant art that display processor 160, or portions of it, may be loaded by processor 105 in a known manner into system memory 120, or cache memory (not shown), or both, as advantageous for execution. User 101 initiates execution of display processor 160 in accordance with well-known techniques, such as selecting it from a Start menu in a Windows 95 or 98 operating system environment.

Sample Specifier 610

Figure 6:
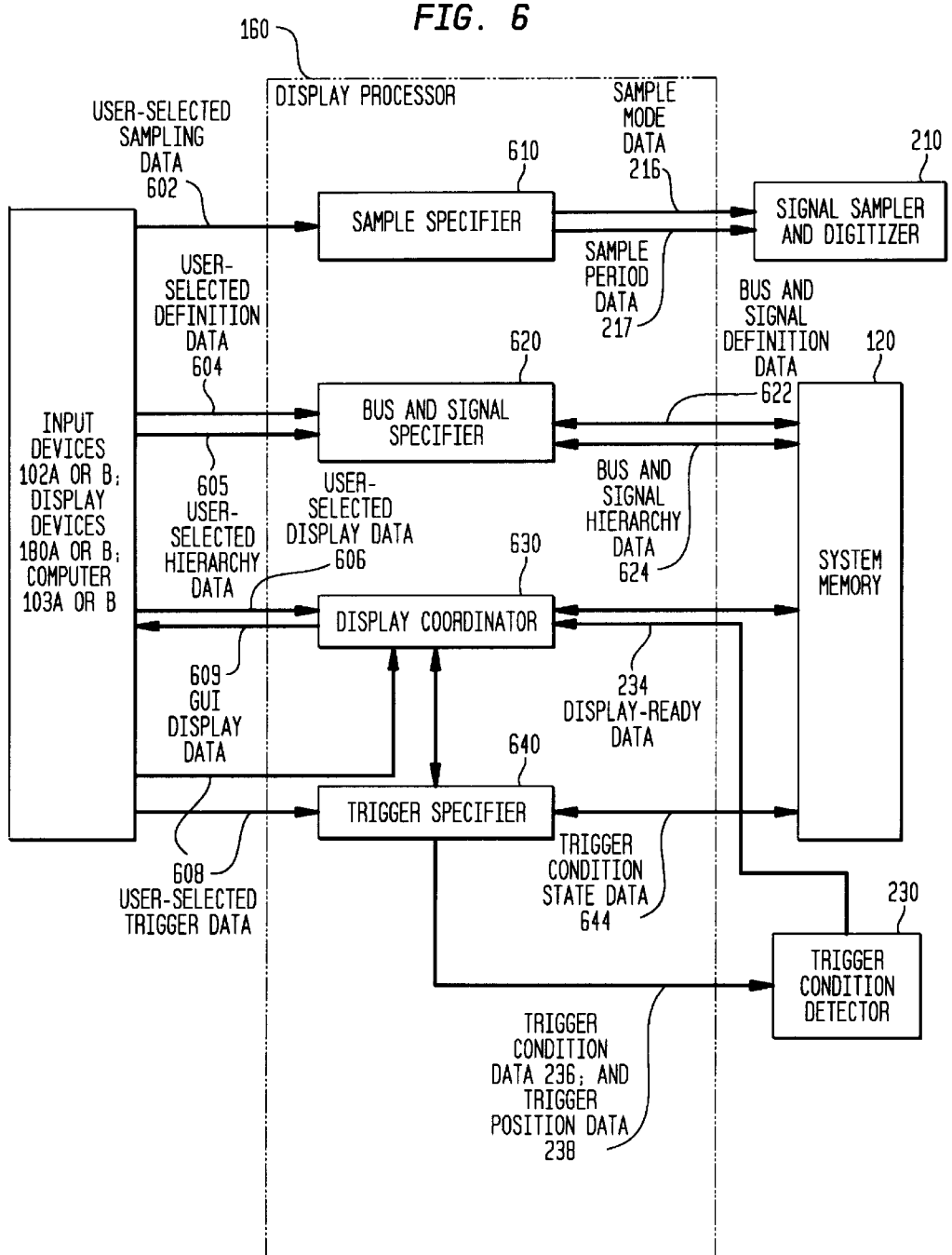
FIG. 6 is a functional block diagram of one embodiment of a display processor of the logic analyzer of FIGS. 1A or 1B.
Figure 7:
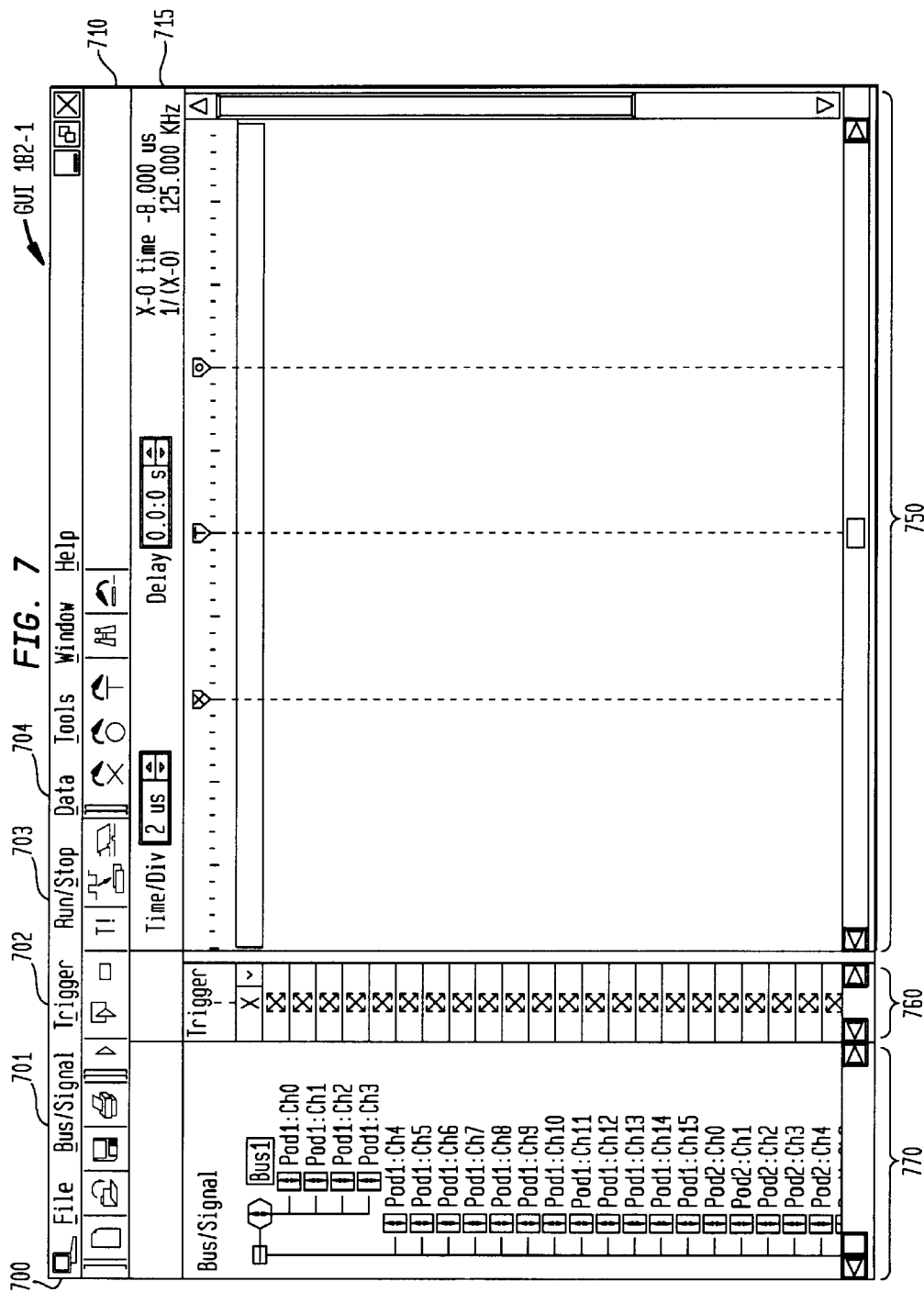
FIG. 7 is one embodiment of an initial graphical user interface for display of information from, and/or provision of information to, the display processor of FIG. 6.

FIG. 6 is a functional block diagram of display processor 160. As shown in FIG. 6, display processor 160 includes sample specifier 610 that processes user selections of sample mode, sample period, and related data, represented by user-selected sampling data 602. Sample specifier 610 thereby provides sampler 210 with sample mode data 216 and sample period data 217 that sampler 210 uses to generate sampled data 212 as described above. In the illustrated embodiment, user 101 makes these selections using one of graphical user interfaces (GUI's) 182 displayed to user 101 on one of display devices 180. FIG. 7 is a graphical representation of one embodiment of an initial page of GUI's 182, referred to as GUI 182-1, from which user 101 may make these selections.

GUI 182-1 of the illustrated embodiment is a graphical user interface generated in accordance with well-known techniques typically employed in accordance with a Windows 95 or 98 operating system from Microsoft Corporation. Other graphical user interfaces, generally and collectively referred to as GUI's 182, will also be illustrated in other figures as they may typically be generated in accordance with a Windows 95 or 98 operating system. However, it will be understood that these illustrations are exemplary only, and that many other graphical user interfaces, employing a Windows operating system or any other operating system, may be employed. GUI controller 115 is any type of known or future software, firmware, hardware, or combination thereof for displaying information in a graphical user interface and receiving information therefrom as provided by user 101. GUI controller 115 may be integrated with or within operating system 110, or may operate in cooperation with operating system 110. Therefore, although it is illustratively assumed that operating system 110 of the present embodiment is a Windows 95 or 98 operating system, it need not be so in alternative embodiments.

As will be understood by those skilled in the relevant art, GUI's 182 are generated by GUI controller 115, in cooperation with operating system 110 and processor 105, in response to selections made, and information provided, by user 101. User 101 employs one of input devices 102 in cooperation with input-output controllers 130, system bus 104, and possibly other components of computer 103. GUI's 182 described below typically are divided into various display areas. In some implementations, these areas may be splitter panes in a window environment so that, in accordance with techniques well known in the art, user 101 may resize the panes by, for example, selecting and dragging their borders. Also, these panes may have slide bars associated with them so that, again in accordance with known techniques, user 101 may scroll horizontally and/or vertically to display information not initially shown in the panes. In some implementations, the panes may be separately expanded (maximized) to fill all or much of the screen of display device 180.

Figure 8A:
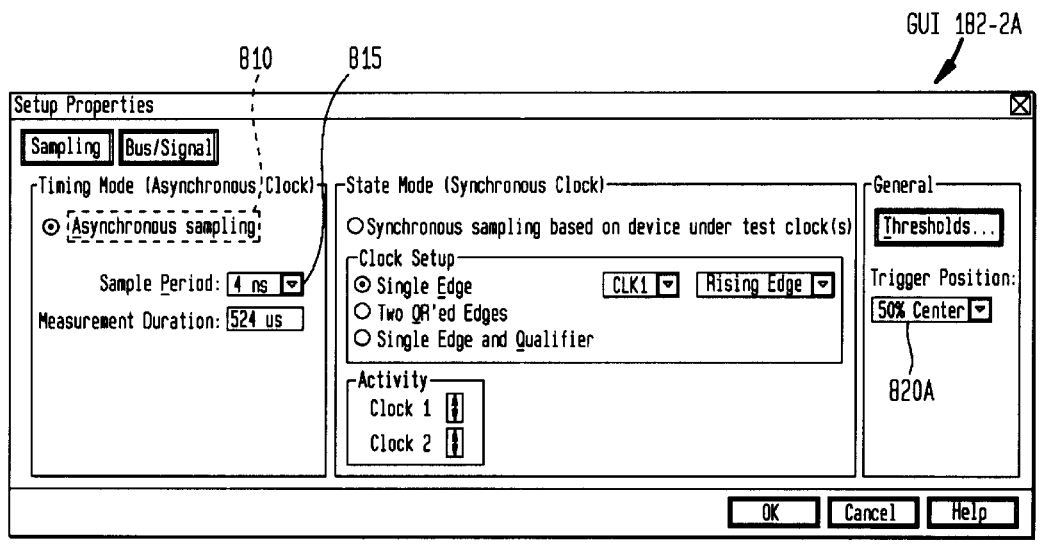
FIGS. 8A and 8B are two embodiments of graphical user interfaces for display of information from, and/or provision of information to, a sample specifier and trigger specifier of the display processor of FIG. 6.
Figure 8B:
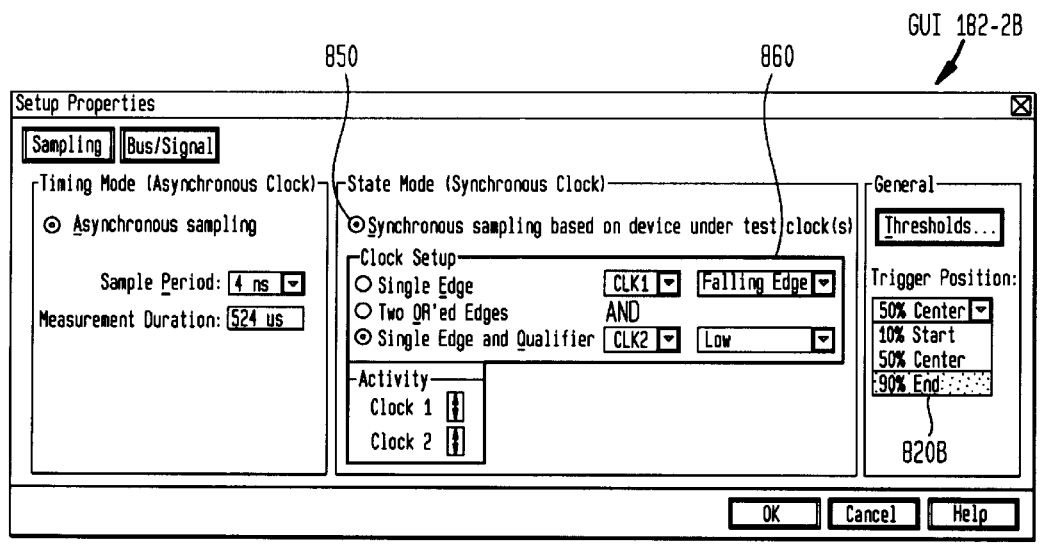

GUI 182-1 includes a display window having three main areas: signal display area 750, trigger specification area 760, and bus/signal hierarchy area 770, to be discussed below. GUI 182-1 also includes a menu bar 700 of a type well known in the art. One element of menu bar 700 is data menu 704. User 101 may select data menu 704 using one of input devices 102 in a known manner so that a pull-down menu is displayed. User 101 may then select one element of the pull-down menu (not shown) to display a sampling set-up dialogue box, two of many possible embodiments of which are shown in FIGS. 8A and 8B and labeled GUI 182-2A and GUI 182-2B. Alternatively, display processor 160 may automatically display GUI's 182-2A and 2B to user 101 when user 101 begins working with a new file, ie., when user 101 executes display processor 160 and applies it to analyze device under test 135.

GUI's 182-2A and 2B enable user 101 to specify user-selected sampling data 602 for the purposes noted above with respect to steps 410 and 415, respectively, of FIG. 4, and the operations of sampler 210. In particular, user 101 may select the sample mode (also referred to as timing mode) by activating either option button 810 as shown in FIG. 8A or option button 850 as shown in FIG. 8B. The presentation of these option buttons, and the collection of user selections therefrom, are accomplished in accordance with techniques well known in the art. By activating option button 810, user 101 indicates that sampler 210 is to operate asynchronously. In this case, user 101 may also select box 815 that provides, in a well-known manner, various sample periods. (These types of graphical elements are often referred to as "combo boxes.") Typically, as shown in combo box 815, a default value (four nanoseconds in this illustration) is provided. Alternatively, user 101 may type in or otherwise select a sample period. By activating option button 850 as shown in FIG. 8B, user 101 indicates that sampler 210 is to operate synchronously. In this case, user 101 may also select various settings in clock-setup and activity area 860 to specify the conditions under which sampler 210 acquires logic signals 132 for sampling. These conditions are based on one or more signals provided by device under test 135, referred to as "CLK1" and "CLK2" in illustrative area 860 as shown in FIG. 8B. For example, using a combination of the option buttons and combo boxes included in area 860, user 101 may specify sample period data 212 so that sampling is done on the falling or rising edge, or both, of CLK1 or CLK2, or any combination thereof. Also as illustrated in area 860, user 101 may select a "single edge and qualifier" button so that sampling is done, for example, when CLK1 has a falling edge and CLK2 is in the low logic state.

Bus and Signal Specifier 620

Display processor 160 also includes bus and signal specifier 620 that processes user30 selected names of signals and/or buses, as well as user-selected additions, deletions, and groupings of signals and/or buses (see step 425 of FIG. 4). Bus and signal specifier 620 (hereafter, simply "signal specifier 620") thereby generates data that is used to hierarchically display the names of buses and/or signals (sometimes referred to herein as "bus-name elements" for buses and "signal-name elements" for signals) together in the same display window with visually associated representations of their sampled signal data (sometimes referred to as "bus-data elements" for buses and "signal-data elements" for signals) in various embodiments of GUI's 182. In alternative embodiments, the signal data need not be sampled data and thus the signal-data elements need not represent sampled data. Also, in some embodiments of GUI's 182, the bus-name and signal-name elements, optionally with the sampled-data elements, may be displayed together on the same display window with visually associated representations of user-specified trigger data ("trigger-condition elements").

For convenience and clarity of description, the functions of signal specifier 620 are now more specifically described with reference to the following four operations. It will be understood that one or all of these operations may be merged and/or carried out in various orders in alternative embodiments. In one operation, signal specifier 620 acquires user-selected definition data 604 and, in a second operation, processes this information to generate bus and signal definition data 622 (hereafter, simply "definition data 622") for storage in bus/signal definition data structure 1010. In a third operation, signal specifier 620 acquires user-selected hierarchy data 605 and, in a fourth operation, processes this information to generate bus and signal hierarchy data 624 (hereafter, simply "hierarchy data 624") for storage in hierarchy display data structure 1040. These four operations are now described in turn.

Figure 9A:
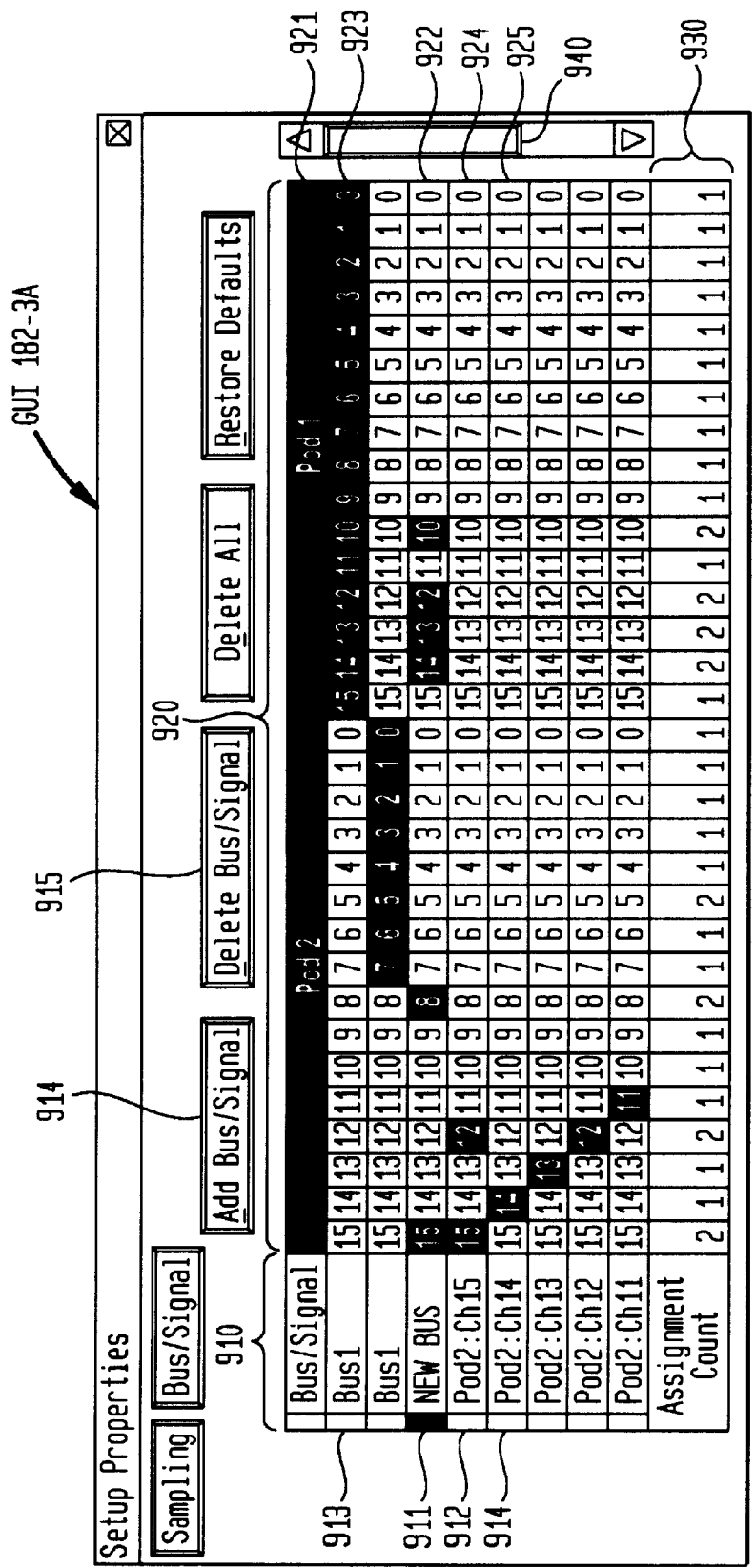
FIGS. 9A and 9B are two embodiments of graphical user interfaces for display of information from, and/or provision of information to, a bus and signal specifier of the display processor of FIG. 6.
Figure 9B:
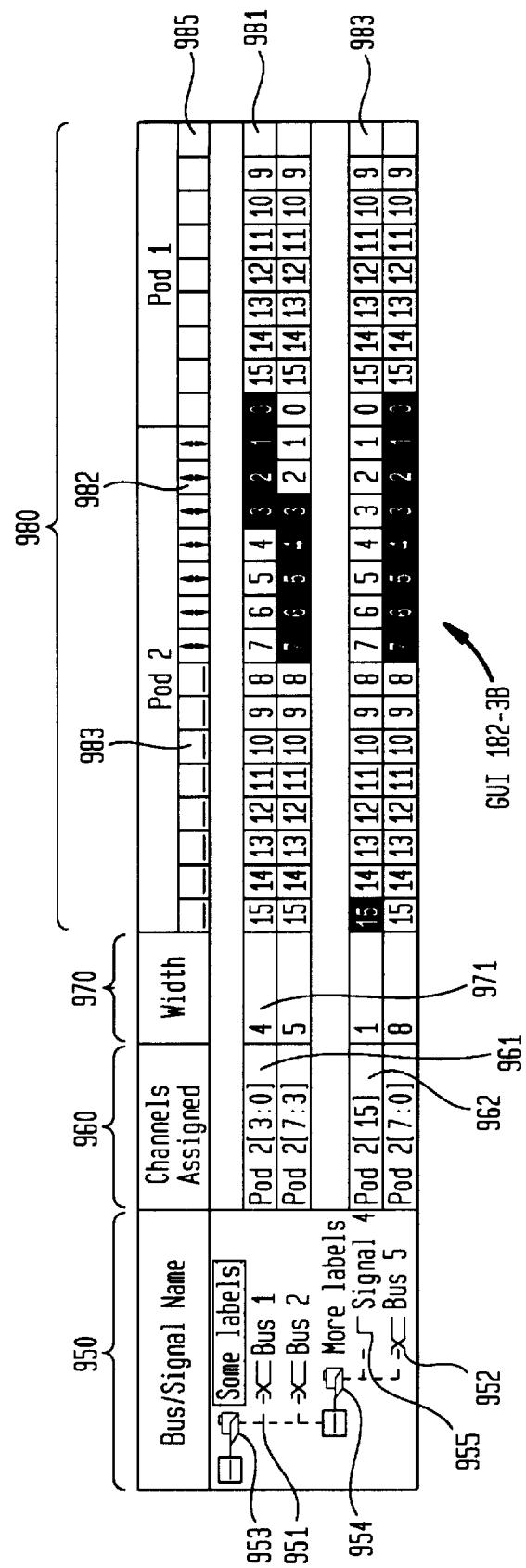

(1) Acquiring user-selected definition data 604: FIGS. 9A and 9B are illustrative graphical user interfaces for generating user-selected definition data 604. These graphical user interfaces are sometimes referred to herein as "horizontal-selection-lists." GUI 182-3A of FIG. 9A includes a display window having three principal areas: bus/signal-naming area 910, signal-specification area 920, and assignment-count area 930. GUI 182-3A (and GUI 182-3B of FIG. 9B) are shown for an illustrative configuration of logic analyzer 100 in which there are 32 channels for acquiring logic signals 132. These illustrative 32 channels are divided into two pods of 16 channels each, labeled channels 0 through 15. Thus, logic signals 132 may consist of 32 signals in this example; each acquired over a separate one of the channels. Additional channels, not shown, may also be provided for acquiring clock signals from each of the pods.

It is illustratively assumed that bus/signal-naming area 910 initially includes default entries for the names of all of the 32 channels, one or more arbitrarily defined buses, and one clock signal associated with each of the pods (not shown). For example, the signal acquired over channel 15 of pod 2 may have a default name that is descriptive of this association, such as "Pod2:Ch15," as shown by label 912. Thus, as shown in bus-signal naming area 910, default names for two default buses ("Bus1" and "Bus2") may be provided together with default names for the 32 signals that may be acquired. (The name "NEWBUS" shown in element 911 is not a default bus name, but is added by user 101, as described below.) In some implementations, specifier 620 may provide an entry and a default name only for those channels on which sampler 210 determines that a signal is present. This determination may be made, for example, based on whether the logic level on a channel changes between logic levels as opposed to being constant at a high or low level, or in accordance with other known techniques for determining whether a signal is present. As described in greater detail below with respect to FIG. 11, specifier 620 generates the default signal and/or bus names in the illustrated embodiment by generating records, one for each name, in bus/signal definition data structure 1010 and storing the default name in a designated field (name label field 1115) of each record.

User 101 may change any of the bus or signal names in area 910. For example, user 101 may change label 912 to be more descriptive of the signal that is acquired over channel 15 of pod 2. This user-defined name may be provided by user 101 in accordance with any of a variety of known techniques. For example, user 101 may select or click on label 912 using a mouse or other pointer device, select and delete the default name, and type in a new name, or simply type over the selected default name.

User 101 may also add or delete entries from area 910 in accordance with any of a variety of known techniques. For example, user 101 may select command button 914 to add a bus or signal, or select command button 915 to delete a bus or signal. Command button 914 operates in accordance with well-known techniques by, for example, inserting a new default label, or empty label, in area 910. This insertion typically is done above or below an active label that may be selected by user 101, thus providing user 101 with control over the location of the insertion. The darkened box on the left side of label 911 indicates that label 911 is active, typically because user 101 has selected it. Thus, in this example, if user 101 clicks on command button 914, a new label (not shown) is inserted above label 911. Clicking on command button 915 similarly may delete the active label.

Associated with each of the labels in bus/signal-name area 910 is a horizontal list, or row, of signal identifiers in signal-specification area 920. In this example, this association is accomplished by horizontally aligning a label in area 910 with a row of signal identifiers in area 920. In alternative embodiments, the association may be made by matching colors or highlights, aligning the labels vertically with a column of signal identifiers, providing connector elements, or using other techniques. In the illustrated embodiment, there is a signal identifier in each row of area 920 for each of the 32 possible signals that may be acquired over the 32 channels illustratively assumed to be available in logic analyzer 100. In alternative implementations, a signal identifier may be shown only for those channels having active signals. A pod identifier, displayed in pod identification sub-area 921 of area 920, together with the signal identifiers in each of the rows of area 920, serve in the illustrated embodiment to uniquely specify each signal in each row. Thus, associated with each label in area 910 and row in area 920 there are 32 signal identifiers consisting of the numbers 0 through 15 for pod 1, and 0 through 15 for pod 2. Area 920 therefore may be said to be divided into two sub-areas, one for the signals in pod 1 and one for the signals in pod2, as indicated by the pod identifiers in sub-area 921.

As noted, a bus is a group of two or more signals. In the example shown in FIG. 9A, specifier 620 has generated a default bus having the name "Bus1" as shown by label 913. By default in this illustrative example, Bus1 consists of all 16 signals of pod 1, as indicated by the reverse fields (i.e., black background and white foreground) of signal identifiers 0–15 of row 923 under the "Pod1" sub-area of area 920. Signal identifiers that are shown in reverse field will hereafter be referred to simply as being "specified," and those shown with ordinary fields (white background and black foreground) will be referred to as "not specified." In this manner, each signal identifier will be displayed so that user 101 may readily ascertain whether or not the signal associated with each signal identifier has been specified for inclusion in the bus associated with that row. Many other techniques may be used to make this distinction clear to user 101, such as using different colors, highlighting, gray scales, and so on, to distinguish between specified, and not specified, signal identifiers. As shown in FIG. 9A, the 16 signals of pod 2 are not specified in row 923. Therefore, bus 1 is defined by these default selections as consisting of the 16 signals of pod 1 and none of the signals of pod 2.

In order to define a bus consisting of a particular combination of two or more signals, user 101 may change a default specification or current specification of an existing bus, and/or add and define a new bus. For example, it is assumed that user 101 has added a new bus by inserting a label 119 and naming it "NEWBUS" as described above. When a new label is inserted, specifier 620 generates a new record, object, or other type of data entry (hereafter, simply "record") in bus/signal-definition data structure 1010, and updates hierarchy display data structure 1040, as described below. In accordance with known techniques, display coordinator 630 provides for the display of a row of default signal identifiers to be associated with the new bus label. (Similarly, when user 101 deletes an active label, the signal identifiers associated with that label are eliminated in accordance with known techniques.) Thus, row 922 is inserted in horizontal alignment with label 911. It will be assumed for convenience that each of the 32 signal identifiers in row 922 is initially not specified when the new row is inserted, although it may be otherwise in alternative embodiments. Thus, user 101 selects two or more of the 32 signals in order to define the bus. In some implementations, if user 101 does not select at least one signal for inclusion in NEWBUS, then a record for NEWBUS is not generated in bus/signal definition data structure 1010 and the label NEWBUS is not displayed when user 101 again accesses GUI 182-3A.

User 101 may select signals to be included in NEWBUS by clicking on, or otherwise selecting, two or more of the signal identifiers in row 922 of area 920. For example, to select signals from pod 1 to include in NEWBUS, user 101 may click individually on the signal identifiers 15, 8, and 5 in row 922, as shown in GUI 182-3A. As user 101 makes these selections, the identifiers are shown in reverse field to provide feedback to user 101 that they have been specified for inclusion in NEWBUS. These operations may be accomplished in accordance with any of a variety of known techniques. For example, in a Windows operating system environment in which Visual Basic or a similar high-level programming language is used, the clicking or selecting of a signal identifier is an "event" that may activate certain procedures, such as ones to display the specified identifier in reverse field. The event also activates procedures according to which specifier 620 records in an appropriate data structure or object that the signal associated with the specified signal identifier has been added to NEWBUS, as described below in relation to FIG. 10.

Various other procedures may be employed, and events thereby recognized, in order to make it easier and quicker for user 101 to select signals to include in NEWBUS. For example, rather than individually clicking on signal identifiers 14, 13, 12, and 10 of pod 2 in row 922, user 101 may effectuate the same selection by clicking on identifier 14, dragging a cursor (i.e., by moving the mouse while holding down a mouse button, or by employing a similar procedure using another pointing device, keyboard, or other input device), and releasing the mouse button when identifier 10 is selected. This event, in accordance with known techniques, denotes all of identifiers 14 through 10 as being specified. In order to change the state of identifier 11 from specified to not specified, user 101 may click on it. In the illustrated embodiment, a signal identifier changes state when it is selected. Thus, clicking on a specified identifier changes its state to not specified, and vice versa. As yet another example, user 101 may drag the cursor from identifier 15 of row 922 in the pod 2 sub-area to identifier 0 of row 922 in the pod 1 sub-area, thereby temporarily specifying that all 32 signals are included in NEWBUS. User 101 could then change the states of some of the signal identifiers in row 922 by clicking individually on them, by dragging the cursor over groups of identifiers (such as 14-9 of pod 2 and 9-0 of pod 1), or by a combination of these procedures. In any of these ways, user 101 thus specifies that NEWBUS consists of those logic signals of logic signals 132 that are associated with signal identifiers 15, 8, and 5 of pod 2, and signal identifiers 14, 13, 12, and 10 of pod 1, as shown in row 922. That is, NEWBUS consists of the sampled data acquired over channels 15, 8, and 5 of pod 2, and channels 14, 13, 12, and 10 of pod 1.

In the illustrated embodiment, some or all of signals 132 are represented in GUI 182-3A by default entries including a label indicative of the signal and a default specification of the corresponding signal identifier. For example, label 914, "Pod2:Ch14," of the illustrated embodiment is a default label associated with the default specification of signal identifier 14 of row 925 in the pod 2 sub-area. This circumstance, i.e., in which a particular signal is named in area 910 and its corresponding channel is specified in the associated row of area 920, is hereafter referred to as a "one-to-one signal-to-channel association." Other of these associations are shown in GUI 182-3A for channels 11, 12, and 13 of pod 2. These one-to-one signal-to-channel associations may be useful because user 101 may wish to change a label so that it is indicative of the signal acquired over the corresponding channel, but is no longer indicative of the channel. For example, user 101 may wish to change label 914 from "Pod2:Ch14," which is indicative of the channel, to "high bit of counter 1" (not shown), which is indicative of the signal acquired on that channel. User 101 may nonetheless readily ascertain that the signal named "high bit of counter 1" is acquired on channel 14 of pod 2 by looking at row 925 of GUI 182-3A and observing that signal identifier 14 of pod 2 for that row is specified. Similarly, user 101 may ascertain that the signal named "high bit of counter 1" is not included in NEWBUS because signal identifier 14 of pod 2 for row 922 is not specified.

As shown in GUI 182-3A, user 101 has specified signal identifiers 15 and 12 of pod 2 to be included in a bus associated with label 912. Label 912 displays the text "Pod2:Ch15," which typically indicates that it is associated with a particular signal: the signal acquired over channel 15 of pod 2. However, by definition, a group of two or more signals is a bus. Therefore, user 101 has effectively grouped two signals, those associated with channels 15 and 12 of pod 2, into a bus that retains the name "Pod2:Ch15." User 101 may change the name in order to make clear that it refers to a bus, but need not.

Unlike areas 910 and 920, assignment count area 930 of GUI 182-3A of the illustrated embodiment does not include elements that are user-selectable. Rather, using the data structures generated by specifier 620 and any known summing technique, specifier 620 causes a count to be displayed in area 930 indicating how many times each signal is included in a signal and/or bus. For example, because the signals corresponding to signal identifiers 14, 13, and 12 of pod 1 are included in both NEWBUS (row 922) and Bus1 (row 923), the count for each of these signals is "2." The count for the signal corresponding to signal identifier 8 of pod 2 is shown as "2," although only one specification of that signal appears in the portion of GUI 182-3A shown in FIG. 9A. This apparent disparity occurs because an additional specification is not shown in FIG. 9A that user 101 may cause to be displayed by use of vertical scroll bar 940.

GUI 182-3B of FIG. 9B is a horizontal selection list for naming signals and buses, and for defining buses, that is similar to GUI 182-3A. GUI 182-3B has four sub-areas: bus/signal hierarchy area 950, channel assignments area 960, width area 970, and signal-specification area 980. Selections may be made in signal-specification area 980 in the same manner as described above with respect to signal-specification area 920. The number of signals in a bus is shown in width area 970. For example, a width of "4" is shown in width element 971 to indicate that there are four signals in Bus 1. The four specified signals are shown in reverse field in row 981 of area 980. Bus 1 is identified by name label 951. User 101 may change the names in bus/signal hierarchy area 950 according to known techniques, as noted above with respect to area 910. Area 960 provides text readout of the bus definitions for easy reference and/or verification by user 101. For example, the entry "Pod 2[3:0]" in channel-assignment element 961 is formatted in a manner well known to those skilled in the relevant art to indicate that the signals in bus 1 are those acquired over channels 3 through 0 of pod 2. Similarly, in accordance with known formats, an entry such as "Pod 2[15, 13:10, 3:0]" (not shown) would indicate that the signals in the associated bus are acquired over channels 15, 13-10, and 3-0 of pod 2. The generation of text entries in area 960 is made by display coordinator 630 as described below, and/or in accordance with any of a variety of known techniques for retrieving, formatting, and displaying information from a data structure. The signal identifiers in row 981, width element 971, and text readout element 961, are all horizontally aligned with name label 951 to indicate that they are associated with Bus. As noted above with respect to the horizontal alignment of elements in GUI 182-3A, other techniques may be used in alternative embodiments to indicate this association.

GUI 182-3B includes three additional display features not included in the illustrated embodiment of GUI 182-3A.

(These additional features may, however, be included in alternative embodiments of GUI 182-3A, and features unique to the illustrated embodiment of GUI 182-3A may be included in alternative embodiments of GUI 182-3B.) One of these features is shown in the illustrated embodiment as channel activity row 985 of signal-specification area 980. Each display element of row 985, such as illustrative elements 982 or 983, is vertically aligned with signal identifiers for a particular channel. For example, element 982 is vertically aligned with the column of identifiers for signals acquired over channel 1 of pod 2, and element 983 is similarly associated with channel 10 of pod 2. The display elements of row 985 display graphical representations of the activity of the associated channel. For example, a vertical double arrow, such as shown in element 982, indicates that there is activity, i.e., there is a signal consisting of both high and low logic levels, on channel 1 of pod 2. A low horizontal line, such as shown in element 983, indicates that there is no activity, i.e., there is no signal, on channel 10 of pod 2. A high horizontal line indicates a logical high. Any other graphical representation, or another status indicator such as color, highlighting, shading, and so on, may be used in alternative embodiments for the same purposes. As noted above with respect to GUI 182-3A, sampler 210 may employ any of a variety of known or future techniques for determining whether there is activity on a channel, and this information may be provided to specifier 620 in accordance with known or future techniques. For example, a look-up table or other data structure or object may be used to record a correlation between a channel identifier and an activity indicator that, in the illustrated embodiment, may be a binary number or Boolean value indicating one of the two activity states.

The other features of GUI 182-3B that are not included in the illustrated embodiment of GUI 182-3A are the tree structure by which the name labels of bus/signal hierarchy area 950 are organized, and the correlation with the name labels of graphical elements indicating trigger conditions. As indicated by folder icon 953 and other graphical elements in area 950 of GUI 182-3B, bus and signal names may be displayed in a conventional user-expandable and collapsible tree structure of folders. For example, as shown in area 950, Bus1 and Bus2 may be included in a folder 953 having the name "some labels." The minus-sign graphic adjacent to folder 953 indicates, in a conventional manner, that folder 953 is expanded. By clicking on folder 953, user 101 collapses folders 953 in a known manner so that the name labels "Bus1" and "Bus2," and their associated channel assignment texts, widths, and signal specifiers, are not displayed (not shown). The minus-sign graphic changes to a plus-sign graphic (not shown) to represent that folder 953 is collapsed, also in accordance with known techniques. Similarly, folders may be included within folders. For example, folder 954 is included, along with Bus1 and Bus2, within folder 953. The data used by display coordinator 630 to generate this tree structure of folders, and to generate a tree structure of buses and signals, as well as techniques for obtaining and storing the data, are described below in relation to the operations of hierarchy processor 640. Techniques for associating data, or files of data, with folders are well known in the art.

Adjacent to each bus and signal name in area 950 is a graphic indicating whether the name refers to a bus or a signal. For example, trigger graphic 952 is indicative of a bus and trigger graphic 955 is indicative of a signal. "Signal 4" is the name user 101 entered to represent the signal acquired on channel 15 of pod 2. This association is indicated by the horizontal alignment of the name label "signal 4," the channel assignment text 962, and the signal specifiers in row 983.

Other graphical user interfaces that user 101 may employ to define buses are described below in relation to the operations of bus and signal specifier 620 related to hierarchical grouping, as shown in FIGS. 12A–12G. Briefly, in these interfaces user 101 selects two or more signal name labels from a tree structure and then applies what may be referred to as a "Group into Bus" command button to group them together in a new bus that user 101 may then name. Selecting the bus and then applying an "Ungroup from Bus" command button breaks down the bus into its constituent signals. User 101 may add one or more signals and/or buses to the new bus (and/or to an existing bus) by selecting the signals and/or buses and dragging them to the vicinity of the name label of the new bus or, if the bus is expanded, to the vicinity of the tree structure of the name labels its constituent signals or buses. Similarly, user 101 may remove one or more signals and/or buses from an expanded new bus by selecting them and dragging them away from the tree structure of the new bus.

Figure 10:
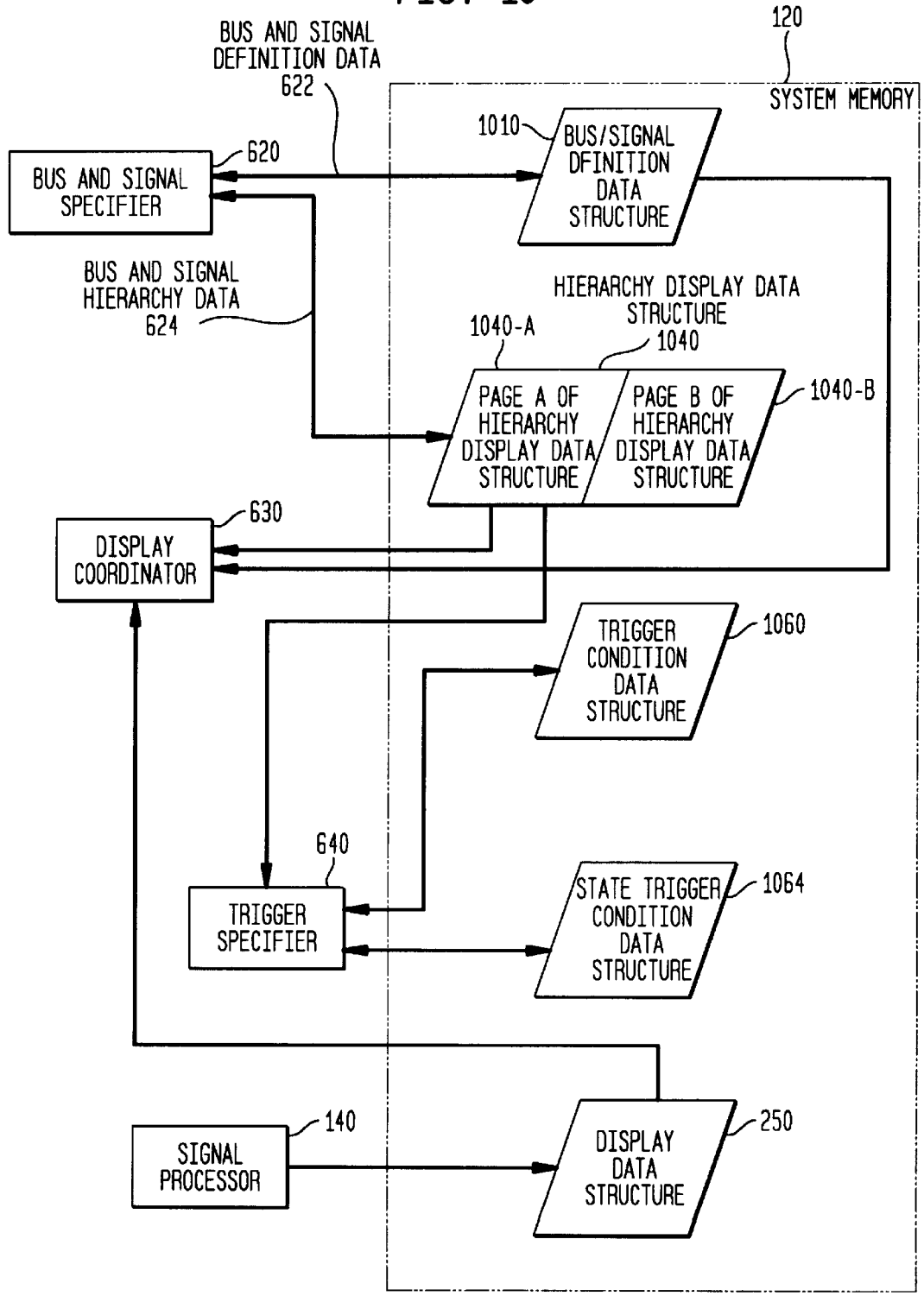
FIG. 10 is a schematic representation of illustrative embodiments of data structures for storing information generated by the display processor of FIG. 6 in a system memory of a computer of the logic analyzer of FIGS. 1A or 1B.

(2) Generating and Storing Bus and Signal Definition Data 622: FIG. 10 is a schematic representation of illustrative embodiments of data structures for storing information generated by display processor 160. In the illustrated embodiment, these data structures are located in system memory 120, but it need not be so in alternative embodiments. For example, one or more of these data structures could be located in memory devices included in display processor 160, in a computer system external to logic analyzer 100, and so on. Also, these data structures could be combined into a single data structure, or arranged in combinations other than those shown. One of the data structures included in system memory 120 is bus/signal definition data structure 1010.

Figure 11:
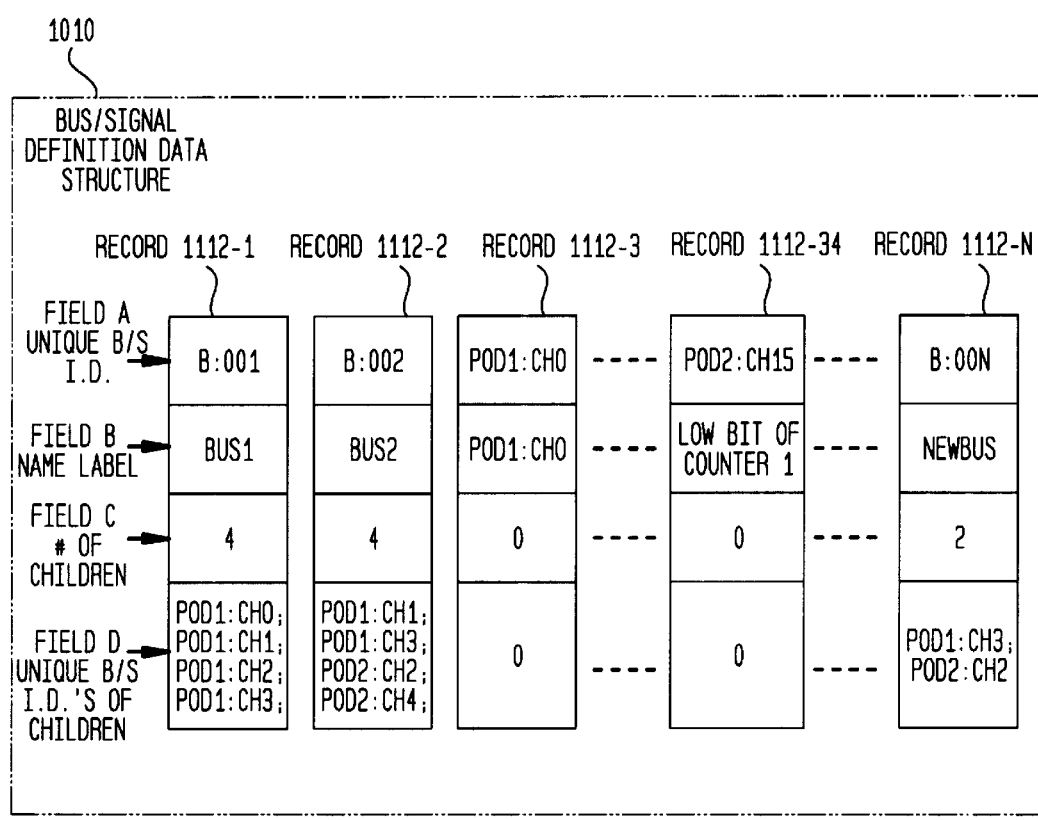
FIG. 11 is a schematic representation of one embodiment of a bus/signal definition data structure of the data structures of FIG. 10.

FIG. 11 is a simplified schematic representation of one embodiment of data structure 1010. In the illustrative embodiment, specifier 620 generates a default record 1112 for each signal that may be acquired by logic analyzer 100, i.e., 32 records for the 32 signals in the present example. It is illustratively assumed that specifier 620 also generates a default record for each of two default buses having the default names "Bus1" and "Bus2." A first of records 1112 is referred to as record 1112-1, a second record is referred to as record 1112-2, and so on. In the illustrated embodiment, the default buses and the 32 signals are associated with the default records by a predetermined order that may be stored in a look-up table or otherwise calculated or determined in accordance with known techniques. In particular, the two default buses are respectively associated with the first two records, records 1112-1 and 1112-2. The 32 signals are respectively associated with the next 32 records, i.e., records 1112-3 through 1112-34, as shown in FIG. 11. Specifier 620 may generate additional records corresponding to new buses and/or signals that user 101 may specify, such as record 1112-N that also is shown in FIG. 11.

Each record has four fields in the illustrated embodiment. One field in each record, referred to generally and collectively as fields A, contains a unique identifier for the bus or signal that is associated with that record. Thus, field A of record 1112-1 contains a unique identifier that associates record 1112-1 with the first default bus. Field A of record 1112-2 contains a unique identifier that associates that record with the second default bus, field A of record 1112-3 contains a unique identifier that associates that record with the signal on channel 1 of pod 1, and so on. In alternative embodiments, any of a variety of other known techniques may be used to associate each record with default buses and signals and with any new buses or signals that user 101 may specify.

Each of fields B of records 1112 contains either a default name label or a user-selected name label for the bus or signal that is identified in field A of that record. Thus, field B of record 1112-1 contains the default name label "Bus 1," field B of record 1112-3 contains the default name label "Pod1:CH1," field B of record 1112-N contains the user-selected name label "NEWBUS," and so on. It is now illustratively assumed that user 101 changes the name "Bus1" to "M/IO" using, for example, GUI 182-3A. As described above, this new name is provided to, or accessible by, specifier 620 in user-selected definition data 604. Specifier 620 implements the name change by changing field B of record 1112-1 from "Bus1" to "M/IO" (not shown). Similarly, it is illustratively assumed that user 101 has changed the default name of the signal acquired over channel 15 of pod 2 to the name "Low Bit of Counter 1." As shown in FIG. 11, specifier 620 therefore has changed the name label stored in field B of record 1112-34 from the default value of "Pod2:Ch15" to the new user-selected name. In the same manner, when user 101 adds a new signal or bus, specifier 620 generates a new record and stores a unique identifier in field A and a default or user-selected name in field B, as shown by record 1112-N of FIG. 11.

Each of fields C of records 1112 contains the number of "children," if any, of the signal or bus that is identified in field A of that record. As used herein, the signals of a bus are that bus's children. The bus may be referred to as the "parent" of those children. As noted, specifying that a signal has a child is equivalent to specifying that that signal is a bus having itself and the child as children. Also, specifying that a bus only has one child is equivalent to specifying that the bus is a signal. For convenience and clarity, it will therefore be assumed hereafter that a signal does not have children and that a bus has at least two children. In accordance with the illustrative examples discussed in relation to FIG. 9A, bus 1 has a default setting such that all 16 channels of pod 1, and none of the channels of pod 2, are included in Bus1. It is now illustratively assumed that user 111 changes this default setting by changing the states of signal identifiers 0–3 of pod 1 in row 923 from "not specified" to "specified," and by changing the state of all 16 signal identifiers of pod 2 in row 923 from specified" to "not specified," in the manner described above with respect to FIG. 9A. These changes are included in user-selected definition data 604 provided in accordance with any of variety of known techniques to specifier 620. Specifier 620 then accesses the record associated with bus1, i. e., record 1112-1, and changes field C of that record from its default setting of "16" (not shown) to "3," as shown in FIG. 11. Similarly, it is illustratively assumed that user 101 changes the default settings of bus 2 from the configuration shown in FIG. 9A (channels 0–7 of pod 2 are specified) so that channels 0–3 of pod 1 are specified. Specifier 620 thus accesses record 1112-2 and changes field C of that record from the default setting of "8" to the new setting of "3" as shown in FIG. 11.

In a similar manner, specifier 620 updates fields C of buses with respect to which user 101 has changed the default identities of the buses' children, has specified that one or more or the children previously identified as being part of the bus is to be removed from the bus, and/or has added one or more new children. In particular, for each of records 1112 pertaining to a bus, field D contains a unique identifier of each of that bus's children. Conveniently, the children may be identified by the same unique identifier assigned to them in row A of their respective records. For example, as shown in field D of record 1112-1, because user 101 has specified that the signal acquired over channel 0 of pod 1 is included in Bus1, the unique identifier in field A of the record associated with that signal (i.e., field A of record 1112-3) is included in field D of record 1112-1. The other children of Bus1 are similarly identified in field D of record 1112-1. The unique identifiers of children are shown in fields D of the illustrative example as text strings (e.g., "Pod 1:Ch0") separated by semi-colons. As will be evident to those skilled in the relevant art, many other techniques may be used to identify signals and buses, identify the children of buses, and store this information in a data structure. For example, pointers to addresses, or indirect addresses, may be used to link buses with their children.

(3) Acquiring user-selected hierarchy data 605: FIGS. 12A–12H are simplified representations of portions of one or more of GUI's 182 that user 101 may employ to generate user-selected hierarchy data 605, and also to generate user-selected definition data 604 in alternative ways to those described above. The vertically aligned tree structures shown in FIGS. 12A–12H are shown for convenience as including only signal and bus name labels, and structurally related graphical elements such as expansion control buttons. It will be understood, however, that the name labels in all of these tree structures generally are accompanied in GUI's 182 by associated graphical elements providing information to user 101 about the signal or bus named in the label (hereafter referred to for convenience as "associated graphical elements"). For example, the name label tree structures in FIGS. 12A–12H are similar to those shown in bus/signal hierarachy area 950 of GUI 182-3B in which each bus or signal name label is horizontally aligned with associated graphical elements in areas 960, 970 and 980 providing definition and other information as described above with respect to FIG. 9A. Also, FIGS. 12A–12H are similar to the tree structures shown in bus/signal hierarchy area 770 of GUI 182-1 in which each bus or signal name label is horizontally aligned with associated graphical elements showing trigger conditions for that signal or bus in trigger specification area 760 and representations of the sampled signals in signal display area 750 (however, no sampled signals are shown in GUI 182-1). In alternative embodiments, any of the tree structures in FIGS. 12A–12H could be horizontally oriented instead of vertically oriented as shown. In those alternative embodiments, the associated graphical elements would be vertically aligned with the name labels in the horizontally oriented tree structure. An example is shown in GUI 182-4C of FIG. 14D.

Figure 12A:
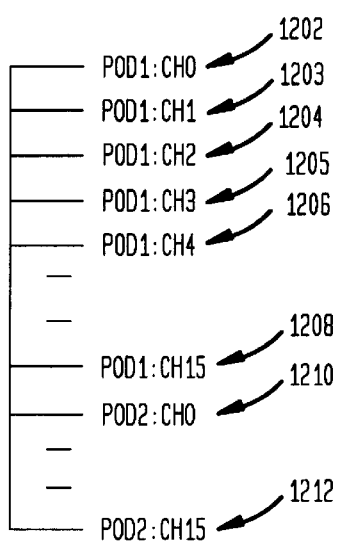
FIGS. 12A–12H are simplified graphical representations of embodiments of bus and signal name labels arranged in hierarchical tree structures for display to a user on graphical user interfaces of the logic analyzer of FIGS. 1A or 1B.
Figure 12B:
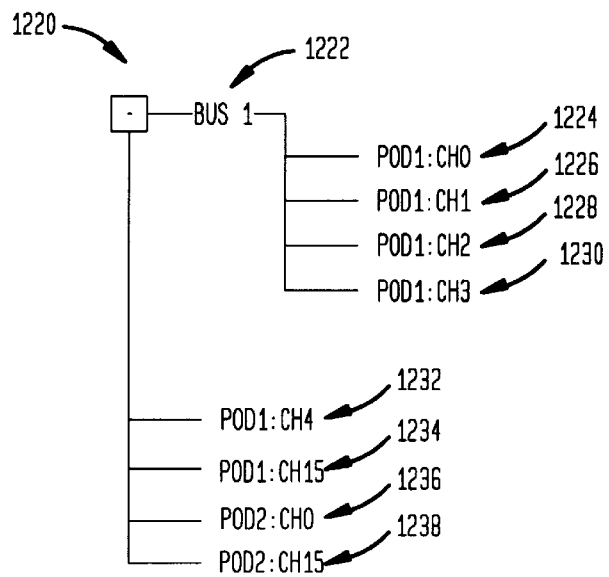

FIG. 12A is an illustrative embodiment of a graphical user interface showing name labels in a vertically oriented tree structure. There is one name label for each of the 32 signals that, in accordance with the previous illustrative assumption, may be acquired by logic analyzer 100. This tree structure is one that may initially be displayed to user 101; for example, it may be displayed to allow user 101 to begin defining buses using 32 default signal name labels generated by specifier 620. An alternative initial display of a tree structure might include one or more default buses generated by specifier 620, such as shown in FIG. 12B. FIG. 12A shows a situation in which specifier 620 has not generated any default buses, and user 101 has not specified any new buses.

User 101 may conveniently employ the graphical user interface of FIG. 12A to group two or more of the 32 signals represented by name labels 1202 through 1212 into one or more buses. One technique for generating a hierarchy of buses and signals is begun when user 101 selects two or more of the signal name labels by any of a variety of known or future techniques for selecting graphical elements in a graphical user interface. For example, user 101 may employ any of the following well known techniques for making selections in a Windows operating environment: select a range of name labels by clicking on one to signify the beginning of a range and drag the cursor to another name label to designate the end of the range; hold down the "control" key on a keyboard of input devices 102 and selectively click on two or more name labels; select one name label to signify the beginning of a range, hold down the "shift" key on the keyboard and click on another name label to select all name labels between and including the two as being in the range; and so on.

It is assumed for illustrative purposes that user 101 selects signal name labels 1202–1205. These labels may, as in this example, be shown in bold (or otherwise highlighted or identified in alternative embodiments) to provide visual feedback that user 101 has selected them. In this manner, user 101 specifies that the signals corresponding to the selected labels, 110 i.e., those acquired over channels 0–3 of pod 1 in this example, are to be grouped together in a bus. To effectuate this grouping, user 101 activates an appropriate control, such as by clicking a right mouse button to display a list of commands. User 101 may select from this list an appropriate command, referred to for convenience hereafter as a "Group Into Bus" command. Any of a variety of other known techniques may be employed for activating the grouping of the selected signals. For convenience, these techniques for selecting and grouping signal name labels (and, as noted but not shown in FIGS. 12A–12H, their associated graphical elements) may hereafter generally and collectively be referred to as "grouping" techniques. As just illustrated, a grouping technique may be used to define a bus, and thus may serve as an alternative to the definition of buses using graphical user interfaces such as GUI's 182-3A and 3B described above. Moreover, specifier 620 generates and stores bus and signal definition data 622 derived from a grouping technique in the same manner as described above with respect to GUI's 182-3A and 3B. That is, with respect to the present example, it is assumed that "Bus1" is the bus uniquely identified by the entry "B:001" in field A of record 1112-1, as shown in FIG. 11. (Alternatively, if specifier 620 has not provided for a first default bus, then it may generate a new record for the bus specified by user 101.) Specifier 620 stores the unique identifiers for the four selected signals, i.e., those acquired over channels 0–4 of pod 1, in field D of record 1112-1 (or the new record if one was generated for Bus1), and stores the number "4" in field C of that record, as shown in FIG. 11.

Figure 12C:
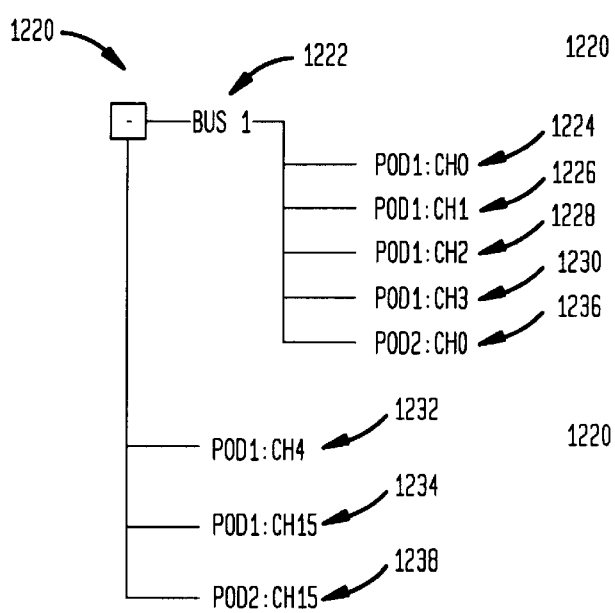
Figure 12D:
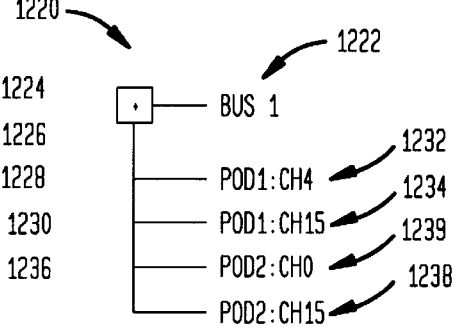
Figure 12E:
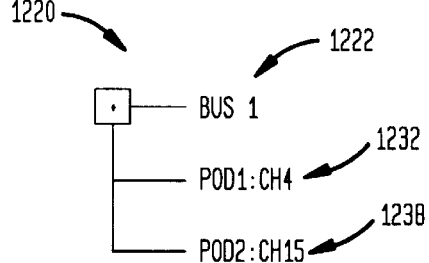

The resulting grouping of channels 0–3 of pod 1 into a bus is shown in the hierarchical tree structure of FIG. 12B. The manner in which this display is generated is described below in relation to FIGS. 10 and 13. FIG. 12B is a tree structure having two levels. The first level consists of signal name labels of signals that are not grouped into a bus (i.e., labels 381232–1238) and the name labels of buses (i.e., label 1222). The second level consists of the name labels of signals that are grouped into a bus. The tree structure ties the second-level signal name labels to the name label of the bus in which they are included. In alternative embodiments, more than two levels may be displayed. That is, a bus may include as a child another bus that itself has children (i.e., grandchildren of the first bus), and so on for as many levels as user 101 determines are usefully displayed. For example, FIG. 12H shows a three-level tree structure.

The second-level name labels, i.e., the children of a first-level bus, are displayed when the first-level bus is in an "expanded" mode. In accordance with well known techniques for expanding and collapsing tree structures, name label 1222 of Bus1 of FIG. 12B has associated with it an expansion control button 1220. The minus sign in button 1220 indicates that Bus 1 is in the expanded mode, as shown. User 101 may, as is well known in the art, collapse Bus 1 so that name labels 1224–1230 (and their associated graphical elements) are not visible by selecting button 1220, which then changes to a plus sign. Many other techniques are possible in alternative embodiments for enabling user 101 to specify whether the children of a bus are to be displayed.

User 101 may also "ungroup" Bus1. That is, as implemented in the illustrated embodiment, user 101 may eliminate Bus1 so that its former children are no longer associated together in Bus1. Using one of many techniques for accomplishing this task, user 101 may first select Bus 1 and/or one or more of its children by, for example, clicking in or near the area that extends from and above name label 1230 to name label 1222. (This area vertically defined by the children of a bus that is expanded is hereafter referred to as the area "in the vicinity" of the bus. As is evident, in an embodiment in which the tree structure is horizontal, the vicinity is horizontally defined by the positions of the children of the bus.) If Bus1 were collapsed, then user 101 could select it by clicking on or near its name label 1222. In either case, user 101 may then activate what may be referred to as an "Ungroup from Bus" command by clicking on a right mouse button and selecting from a list of commands, or in many other ways that will be evident to those skilled in the art. To the same end, user 101 may also use GUI's 182-3A or 3B to select the state of all signal identifiers associated with Bus1 so that they are "not specified." In response to any of these, or other, techniques, specifier 620 may eliminate the record in bus/signal definition data structure 1010 associated with the "ungrouped" bus. Alternatively, the record is retained but specifier 620 changes the entries in fields C and/or D to "0," or to another value or state that indicates that there are no children of that bus.

Returning to FIG. 12B in which an expanded Bus1 is displayed to show its four children, it is now assumed that user 101 wishes to add a signal to Bus 1. This task could be accomplished using GUI's 182-3A or 3B by selecting the signal identifier corresponding to the signal to be added, as described above. FIGS. 12B and 12C illustrate an alternative technique for adding a signal to Bus1 by manipulating the displayed tree structure. It is assumed that user 101 wishes to add the signal named "Pod2:Ch0" (name label 1236) to Bus1. Referring to FIG. 12B, user 101 selects this signal in any of a variety of known ways, such as by clicking the mouse button while the cursor is on or near label 1236 (or, in alternative embodiments, by clicking on or near its associated graphical elements). In accordance with known techniques, label 1236 may then be highlighted to provide visual feedback to user 101, as shown by the bold type for label 1236 in FIG. 12B. While continuing to hold the mouse button down, user 101 then drags the cursor to the vicinity of Bus1. Visual feedback, such as one or more arrows or bars moving vertically along or beside the tree structure (not shown) according to the vertical position of the cursor, may be provided to assist user 101 in moving the cursor to the vicinity of Bus1. When the cursor has arrived in the vicinity of Bus1, user 101 may release the mouse button, thereby indicating that the signal associated with label 1236 is to be added to Bus1.

The result of this illustrative manipulation is shown in FIG. 12C. Bus1 now has five children, including the signal associated with Pod2:Ch0. In the illustrative embodiment, signals of pod1 are displayed before the signals of pod2, and, within the pods, the channels are displayed in ascending numerical order from top to bottom. However, it need not be so in alternative embodiments. User 101 may position a signal name label before or after any other signal name label by dragging and dropping at the desired location, or by any of a variety of similar techniques. The manner in which specifier 620 generates hierarchy data 624 to enable the display of FIG. 12C, including the ordering of children, is described below. Specifier 620 adds the signal having the name label "Pod2:Ch0" to Bus1 in the same manner as described above. That is, specifier 620 adds the unique identifier for that signal to field D of record 1112-1 of Bus1, and increments the number of children in Bus1 as indicated in field C of that record.

User 101 may wish to include the signal named Pod2:Ch0 displayed in the first level of the tree shown in FIG. 12C even though user 101 has added this signal to Bus1. This duplicative display of a signal may be useful, for example, if user 101 wishes to switch between expanded and collapsed modes of Bus1 but wishes to retain in any event a display of the data representing the sample of the signal acquired over channel 0 of pod 2. To accomplish this end, user 101 may, for example, employ GUI 182-3A and select control button 914 ("Add Bus/Signal"). As described above, a new default name label is then inserted in bus/signal-name area 910 that user 101 may then change to "Pod2:Ch0," or any other name descriptive of this signal. User 101 also selects the signal identifier in area 920 that corresponds with channel 0 of pod 2. Specifier 620 acts on this new user-selected definition data 604 by adding a new record to bus/signal definition data structure 1010. This new record has in field B the name assigned by user 101 to the new signal, and specifier 620 stores in field A an identifier indicating that the signal associated with this new record is the same signal as is associated with the record having the identifier "Pod2:Ch0." Thus, as shown in FIG. 12D, the signal acquired over channel 0 of pod 2 may be included in a collapsed Bus1 and thus not displayed as part of the bus, yet still be displayed as a first-level name label (label 1239). This second instantiation of the name label associated with the signal acquired over channel 0 of pod 2 is hereafter referred to as a "duplicate signal name label."

User 101 may also wish to include a particular signal in more than one bus. For example, in addition to adding the signal acquired over channel 0 of pod 2 to Bus1, as just described, user 101 may wish to add the same signal to a second bus. User 101 may readily indicate this intention by using one of GUI's 182-3A or 3B or another embodiment of a bus and signal-defining interface. For example, with respect to GUI 182-3A of FIG. 9A, user 101 may select or add a bus other than Bus1 and then, in the row aligned with that other bus, select the signal identifier in area 920 for the signal acquired over channel 0 of pod 2. This procedure may be repeated for as many existing or new buses as desired. Also, user 101 may accomplish the same end using FIG. 12D by dragging the duplicate signal name label 1239 near or onto the name label of a second bus (not shown) or, if the second bus is expanded, into the vicinity of the second bus. This process may be repeated as many times as desired in order to include the signal in a multitude of buses. In any of these cases, specifier 620 adds the unique identifier of the added signal to field D of the record for each bus in bus/signal definition data structure 1010 to which the signal has been added.

User 101 may indicate an intention to delete any signal or bus by employing control button 915 of GUI 182-3A as noted above, or by any of a variety of other known techniques. For example, user 101 may select a bus or signal name label in area 950 of GUI 182-3B and then activate an appropriate delete command in a pull-down menu or list of commands displayed in response to a right mouse button click or other event. Specifier 620 responds by either deleting the corresponding record of the bus in bus/signal definition data structure 1010 or entering "0" values in fields C and D of that record, as noted above. When user 101 indicates that a signal is to be deleted, specifier 620 may respond by eliminating the record for that signal in bus/signal definition data structure 1010. Alternatively, specifier 620 may employ any of a variety of known techniques, such as search and compare techniques, to locate each record in bus/signal definition data structure 1010 that contains the unique identifier of the deleted signal in field D and delete the identifier from those fields. Also, in alternative embodiments, specifier 620 may use field D of a record for a signal (such as field D of records 1112-3 or 1112-34 in FIG. 11) to store the unique identifiers of each parent of that signal, if any. Specifier 620 may then access the records corresponding to each of the unique identifiers of those parents (i.e., buses) and delete the unique identifier of the deleted signal from field D of those bus records.

As an alternative to deleting a signal or bus, or for other purposes, user 101 may wish to hide the signal or bus; i.e., prevent it from being displayed. User 101 may cause specifier 620 to implement this action by any of a variety of known techniques. For example, user 101 may click on or otherwise select the signal or bus to be hidden and then select what will be referred to as a "Hide" command button from a pull-down menu or from a list of commands displayed in response to a right button mouse click. For example, it is assumed that user 101 has selected the signal name labels 1234 and 1239 (corresponding to the signal acquired over channel 15 of pod 1 and channel 0 of pod 2, respectively) as shown in FIG. 12D. These selections may be highlighted in accordance with known techniques to provide visual feedback to user 101 that the command to hide the selections has been received. FIG. 12E shows the same tree structure as that of FIG. 12D after specifier 620 has implemented the command to hide the two selected signal name labels (and, typically, associated graphical elements, such as the signals' trigger conditions and/or representations of their sampled signals). The actions of specifier 620 in implementing the indication to hide a signal or bus is described below in relation to hierarchy display data structure 1040.

Figure 12F:
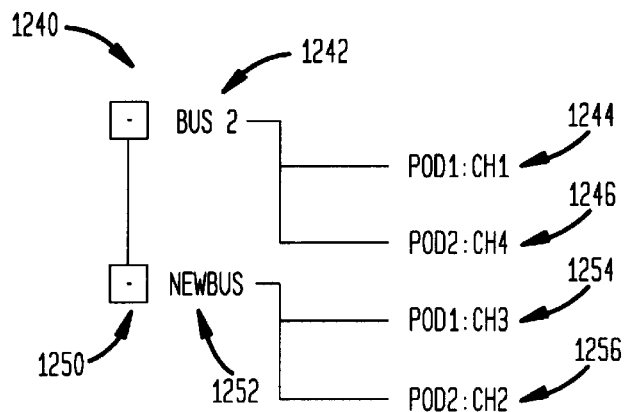
Figure 12G:
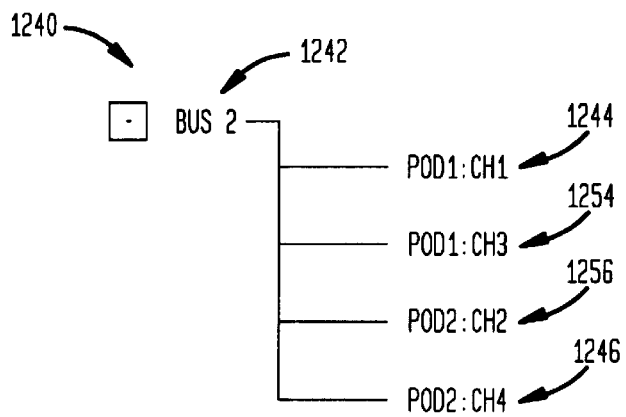
Figure 12H:
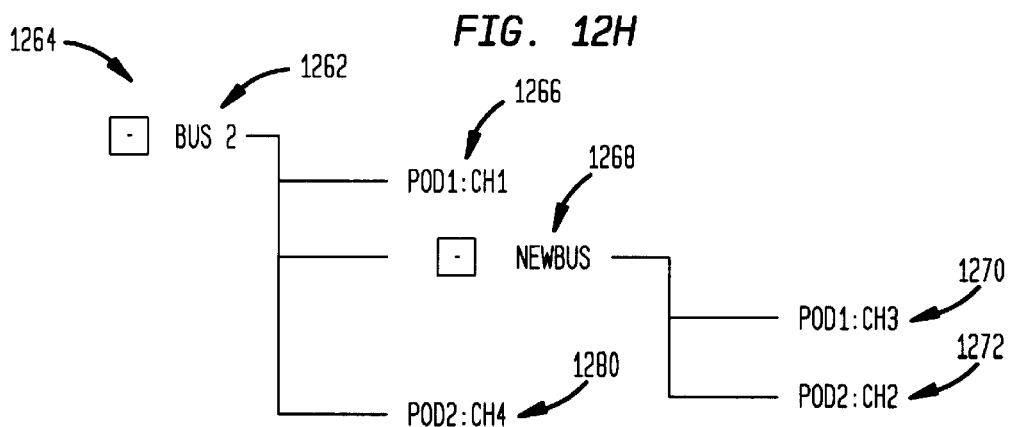

FIGS. 12F and 12G provide an example of merging one bus into another in accordance with the illustrated embodiment. The first level of the tree structure of FIG. 12F consists of two buses, represented by bus name labels 1242 and 1252. It is assumed that user 101 has defined these buses, as described above, so that the bus named "Bus2" consists of the signals named "Pod1:Ch1" and "Pod2:Ch4," as respectively shown by second-level signal name labels 1244 and 1246. The bus named "NEWBUS" consists of the signals named "Pod1:Ch3" and "Pod2:Ch2," as respectively shown by second-level signal name labels 1254 and 1256. It is now assumed that user 101 wishes to merge NEWBUS into Bus1. User 101 may indicate this intention by selecting bus name label 1252 by clicking the mouse button while the cursor is on or near label 1252. The label may then be highlighted in accordance with known techniques to provide visual feedback to user 101 that it has been selected. Without releasing the mouse button, user 101 then drags the cursor to the vicinity of Bus2 and releases the button.

In one illustrated embodiment, the merger deletes NEW-BUS and the children of NEWBUS become children of Bus2. As shown in FIG. 12G, the children are arranged in order by pod and channels within pods. In an alternative embodiment, shown in FIG. 12H, NEWBUS may be retained and become a child of Bus2. In this alternative embodiment, the child NEWBUS may be expanded or collapsed if Bus2 is expanded. Also, if expanded, the children of NEWBUS are represented by third-level signal name labels 1270 and 1272 that are indented or otherwise distinguished from other levels in accordance with any of a variety of known techniques for representing multiple-level tree structures.

Figure 13:
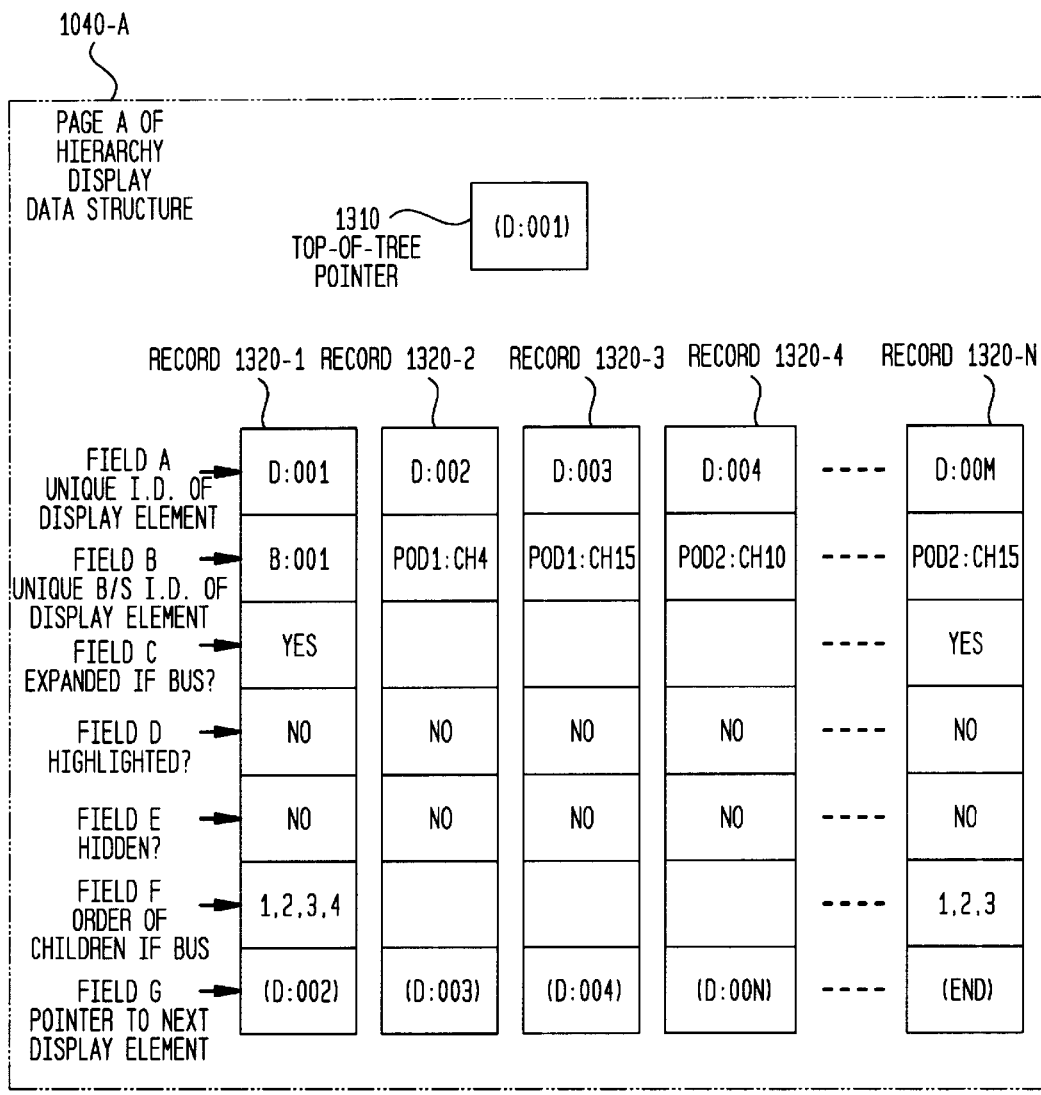
FIG. 13 is a schematic representation of one embodiment of a hierarchy display data structure of the data structures of FIG. 10.

(4) Generating and Storing Bus and Signal Hierarchy Data 624: FIG. 13 is a simplified schematic representation of a portion of hierarchy display data structure 1040 of FIG. 10. In response to user-selected hierarchy data 605, specifier 620 stores bus and signal hierarchy data 624 in data structure 1040. Display coordinator 630 uses this data, together with data in data structures 1010 and 1060, to generate various configurations of hierarchical tree structures of name labels and their associated graphical elements, such as described with respect to FIGS. 7, 9B, and 12A–12H.

In some embodiments, different hierarchical tree structures are available for display with respect to different ones of GUI's 182. For example, one tree structure as determined by user 101 may be employed to display bus and signal name labels and their associated graphical elements in GUI 182-3A in order to define buses. Another tree structure, as also determined by user 101, may be employed in GUI 182-1 to show trigger conditions and sampled waveforms. In these embodiments, specifier 620 may store data describing each of the various tree structures in separate areas of data structure 1040, hereafter referred to as "pages" of data structure 1040. Any of a variety of other known techniques may be used to maintain data for different tree structures, such as by using separate data structures. Hereafter, for clarity and convenience, references generally will be limited to only an illustrative "page A" of data structure 1040, referred to as page 1040-A. It will be understood, however, that known techniques may be employed so that one page is used to store hierarchy data 624 generated as a result of user-selected hierarchy data 605 generated when user 101 is accessing a first of GUI's 182, another page stores hierarchy data 624 generated when user 101 is accessing a second of GUI's 182, and so on. Also, in some embodiments, the same tree structure may be used for all of GUI's 182 having a tree structure. In those embodiments, data structure 1040 typically is not divided into pages.

As shown in FIG. 13, page 1040-A is organized into records, such as record 1320-1, 1320-2, and so on, generally and collectively referred to as records 1320. Other pages of data structure 1040, such as page 1040-B of FIG. 10, are similarly organized in the illustrated embodiment. As will be evident to those skilled in the relevant art, the organization of data structure 1040 into records is illustrative only and there are many ways to organize data structures. Each record contains data related to the display characteristics of a particular bus or signal name label. It will be understood, but may not hereafter be explicitly noted, that the display characteristics of a bus or signal name label generally are applied in accordance with known techniques to the display of that label's associated graphical elements. For example, if a signal name label is hidden, the associated graphical elements of that label typically are also hidden; if the order of a first name label is changed with respect to other name labels, the order of the first label's associated graphical elements is correspondingly changed with respect to the order of the other labels' associated graphical elements; and so on. For convenience, a particular instantiation of a display of a name label and its associated graphical elements may hereafter be referred to as a "display element." Thus, a name label and its associated graphical elements may be related to more than one display element. For example, a signal name label and its associated graphical elements may be shown once as a second-level display element within a first-level bus, and once as a first-level display element.

It is assumed for illustrative purposes that specifier 620 generates a default record 1320 for each signal that may be acquired by logic analyzer 100, i.e., 32 records for the 32 signals in the present example, as well as a default bus, Bus1. This illustratively assumed default status corresponds to the default status assumed with respect to FIG. 12B. FIG. 12B thus will be used to describe the structure and use of page 1040-A. Each of records 1320 has seven fields in the illustrated embodiment. One field in each record, referred to generally and collectively as fields A, contains a unique identifier of the display element associated with that record. Specifier 620 assigns this unique identifier in accordance with any of a variety of known techniques.

Specifier 620 stores in Fields B the unique bus/signal identifier provided in fields A of bus/signal definition data structure 1010 of the bus or signal that is associated with the display element of the respective record in page 1040-A. For example, specifier 620 stores in field B of record 1320-1 the unique identifier, "B:001," which is stored in field A of record 1112-1 to identify the bus having the name "Bus138" in field B of that record, as shown in FIG. 11. In this manner, the display element uniquely identified by the identifier "D:001" in field A of record 1320-1 is associated with the name label "Bus1" and with the other information about Bus1 contained in record 1112-1. Similarly, specifier 620 associates the display element identified by the identifier "D:002" in field A of record 1320-2 with the signal acquired over channel 4 of pod 1 by storing in field B of record 1320-2 the unique identifier "Pod1:Ch4" stored in field A of record 1112-7 of data structure 1010, as indicated (but only implicitly shown by ellipses) in FIG. 11. The association between the unique bus/signal identifiers stored in fields B of records 1320 and in fields A of records 1112 may be made in accordance with any of a variety of known techniques, for example, by search and compare techniques. Alternatively, as will be evident to those skilled in the relevant art, fields B of records 1320 may contain pointers to, or indirect addresses of, the corresponding records 1112 of data structure 1010. As noted, records 1112-3 through 1112-34 are respectively associated with the 32 signals that may be acquired in the illustrated embodiment of logic analyzer 100. That is, by use of a look-up table or other known technique, specifier 620 provides that the information stored in record 1112-3 is that associated with the signal acquired over channel 0 of pod 1, and so on. Thus, record 1320-2 is linked through the unique signal identifier "Pod1:Ch4" in field B with the signal definition data 622 in record 1112-7 of data structure 1010 and thence with the signal display data 242 related to the signal acquired over channel 4 of pod 1, as stored in signal data structure 250. Many other known techniques for making these series of associations or linkages may be used in alternative embodiments.

Based on user-selected hierarchy data 605, specifier 620 stores in fields C of records 1320 a value or indicator of whether a display element is to be displayed in expanded or collapsed form (and thus whether the expansion control button is to contain a minus sign or a plus sign, respectively).

This field typically is not utilized with respect to signals because they typically are not expanded. Similarly, based on user-selected hierarchy data 605, specifier 620 stores in fields D and E of records 1320 values or indicators of whether a display element is, respectively, to be highlighted or hidden. In some embodiments, specifier 620 stores in fields F values or indicators that specify an order in which to display the children of a bus. Fields F thus generally are not used for records pertaining to signals. Nor are fields F generally used in embodiments in which an order of display of children is predetermined, such as the order by pod and channel number described above with respect to FIG. 12C.

Specifier 620 stores in fields G in the illustrated embodiment an address of, or pointer to, the next display element. For example, the entry "[D:002]" in field G of record 1320-1 indicates that, after the display element associated with record 1320-1 is displayed, the display element associated with the record having the unique display element identifier "D:002" is to be displayed. Specifier 620 stores in the record corresponding to the last display element to be displayed a value or indicator that the end of the display has been reached. Page 1040-A also includes a top-of-tree pointer 1310 that identifies in a similar manner the record associated with the first display element to be displayed. Thus, as will be evident to those skilled in the relevant art, specifier 620 may construct a hierarchical tree structure of display elements by starting at top-of-tree pointer 1310 and following the pointers in fields G of the records pointed to until an end indicator is reached. Many other techniques could be employed to associate display elements with each other and with the records in data structure 1010. As one of many examples, a three-dimensional numerical array could be used in which two dimensions associate display elements with each other, and the third dimension associates the two-dimensional array elements with records in data structure 1010.

Some illustrative examples are now described of the operations of specifier 620 in storing and/or changing data in illustrative page A of data structure 1040 in response to user-selected definition data 605. References to a name label in FIGS. 12A–12H will be understood to be a convenient reference to the display element that consists of the label and its associated graphical elements. Not all possible operations are described, as their implementation will be evident to those skilled in the relevant art based on the preceding descriptions, the examples of FIGS. 11, 12A–12H, and 13, and/or the following examples.

It is first illustratively assumed that user 101 has generated user-selected definition data 604 and user-selected hierarchy data 605 in the manner described above with respect to FIG. 12B. In particular, user 101 has defined Bus1 as having four children consisting of the signals acquired over channels 0–3 of pod 1. As noted, specifier 620 therefore has generated a corresponding record for Bus1(if one does not already exist in the case in which Bus1 is a default bus) in data structure 1010-A and also generates a corresponding record for Bus1 in page 1040-A (if default records have not already been generated). Name label 1222 for Bus1 either occupies the top of the tree structure by default, or user 101 moves it there. If user 101 moves it there, specifier 620 responds to this hierarchy data by storing in top-of-tree pointer 1310 a pointer to the record corresponding to Bus1in page 1040-A. In accordance with the previous example shown in FIG. 13, this record is record 1320-1. It is assumed that user 101 has specified expansion button 1220 to be in the expanded mode; thus, specifier 620 stores a value indicating expansion in field C of record 1320-1. Specifier 101 similarly sets values for fields D and E of that record based on the hierarchy data 605 generated by user 101.

Specifier 620 sets an order for display of the children of Bus1 in field F of record 1320. The entry "1, 2, 3, 4" in that field as shown in FIG. 13 represents one of many techniques for establishing the order of displaying children. The numeral "1" indicates in this illustrative scheme that the first child to be displayed is the one that is first listed in field D of the record in data structure 1010 for Bus1, i.e., the child identified by the unique signal identifier "Pod1:Ch0." The second, third, and fourth children to be displayed are similarly determined. If the first child to be displayed, as indicated by user-selected hierarchy data 624, were to be the signal associated with the name label 1228 of FIG. 12B (i.e., the signal acquired over channel 2 of pod 1), then the first numeral entered by specifier 620 in field F of record 1320-1 would be "3." If one of the children is a bus, then the order of display of the children of that bus (i.e., the third-level signals) may be indicated in a similar manner. For example, if the second child of Bus1 were a bus having five children, then specifier 620 could store the order specified by user 101 of Bus1, its children, and its grandchildren in field F of record 1320-1 using notation such as "1, 2(1, 2, 3, 4, 5),3, 4."

Having thus stored information in record 1320-1 for the display of the first-level display element corresponding to Bus1 (as well as its children and possibly further descendents), specifier 620 stores in field G of that record a pointer to the next first-level display element. In accordance with the information provided by user 101 as indicated by FIG. 12B, that next element is the one associated with the signal acquired over channel 4 of pod 1. Specifier 620 thus stores in field G of record 1320-1 a pointer to the display element associated with record 1320-2. Specifier 620 stores appropriate data in fields B-F of record 1320-2 in the manner described above with respect to record 1320-1. Specifier 620 stores in field G of record 1320-2 a pointer to the next first-level display element, as determined by hierarchy data 605. This process is repeated until the record corresponding to the last first-level display element is reached. As shown in FIG. 12B, this last display element is the one having signal name label 1238 that is associated with channel 15 of pod 2. Thus, specifier 620 stores in field G of record 1320-N an end-of-display value.

As another example, it is assumed that user 101 selects name label 1236 in its position as a first-level signal (as shown in FIG. 12B) and moves it into Bus1 (as shown in FIG. 12C), thus making the signal associated with name label 1236 a second-level child of Bus1. In accordance with known techniques applicable to graphical user interfaces, specifier 620 acquires definition data 604 and hierarchy data 605 representing these user-selected changes. As will now be evident to those skilled in the relevant art, specifier 620 makes the following changes in data structure 1010 of FIG. 11 and page 1040 of FIG. 13 in order to implement these user-selected actions. Specifier 620 accesses the record in page 1040-A of the bus into which user 101 has moved the signal, i.e., record 1320-1 in this example. From field B of this record, specifier 620 determines that name label 1222 is associated with the bus associated with the unique identifier "B:001," i.e., Bus1. Specifier 620 accesses the record in data structure 1010 identified by "B:001," i.e., record 1112-1. Specifier 620 changes the number of children in field C from "4" to "5." Specifier 620 also determines the unique identifier of the signal associated with the name label 1236 (determined in the same manner as the unique identifier of Bus1 was determined) and adds this unique identifier to the identifiers of the children of Bus1 in field D of record 1112-1. Specifier 620 also changes the record in page 1040-A corresponding to the display element representing Bus1, i.e., record 1320-1. In particular, field F of that record is changed to specify the order of the five children of Bus1. Also, because name label 1236 is no longer displayed in the first level, the pointer in field G of record 1320-3 (associated with name label 1234) is changed so that it points not to the record associated with name label 1236 (as shown in FIG. 13) but to the record associated with name label 1238 (i.e., to record 1320-N).

Trigger Specifier 640

Display processor 160 also includes trigger specifier 640 that processes user-selected trigger data 608 and thereby provides trigger condition and position detector 230 with trigger condition data 236 and trigger position data 238. More specifically, trigger specifier 640 optionally applies ambiguity-resolution rules to trigger data 608, and generates therefrom one or more trigger condition states that are included in trigger condition data 236. The trigger condition states enable trigger condition and position detector 230 to determine whether a user-specified trigger condition has occurred. Trigger specifier 640 also provides display coordinator 630 with trigger condition data 236 so that this data may be included in graphical form in various embodiments of GUI's 182.

(1) Acquiring aspects of user-selected trigger data 608 pertaining to trigger position: GUI's 182-2A and 2B of FIGS. 8A and 8B provide illustrative examples of how user 101 may specify aspects of user-selected trigger data 608 pertaining to trigger position. This trigger-position information is used for the purposes noted above with respect to steps 420 and 460 of FIG. 4 and the operations of trigger condition and position detector 230. With respect to the particular configuration of GUI's 182-2A, user 101 may select a trigger position by selecting an entry such as "50%—Center," from box 820A. An expanded version of this trigger selection box is shown as box 820B of FIG. 8B, in which the additional selections "10%—Start," and "90%—End," are visible because user 101 has selected the down-arrow icon of the combo box. If user 101 does not make a selection, a default value may be used. Many other methods of selection are possible, such as user 101 typing in a value, selecting a value using a slider, or using other techniques well known in the relevant art.

(2) Acquiring aspects of user-selected trigger data 608 pertaining to trigger conditions:

FIGS. 14A–14D are graphical representations of illustrative embodiments of GUI's 182 that user 101 may employ to specify aspects of user-selected trigger data 608 pertaining to trigger conditions. This trigger-condition information is used for the purposes noted above with respect to steps 430 and 454 of FIG. 4 and the operations of detector 230. User 101 may access the graphical user interfaces shown in FIGS. 14A–D by any of a variety of known techniques, such as by selecting an appropriate command from a pull-down menu activated from bar 1401. Also, display coordinator 630 may present one these graphical user interfaces when user 101 initiates the use of logic analyzer 100.

Figure 14A:
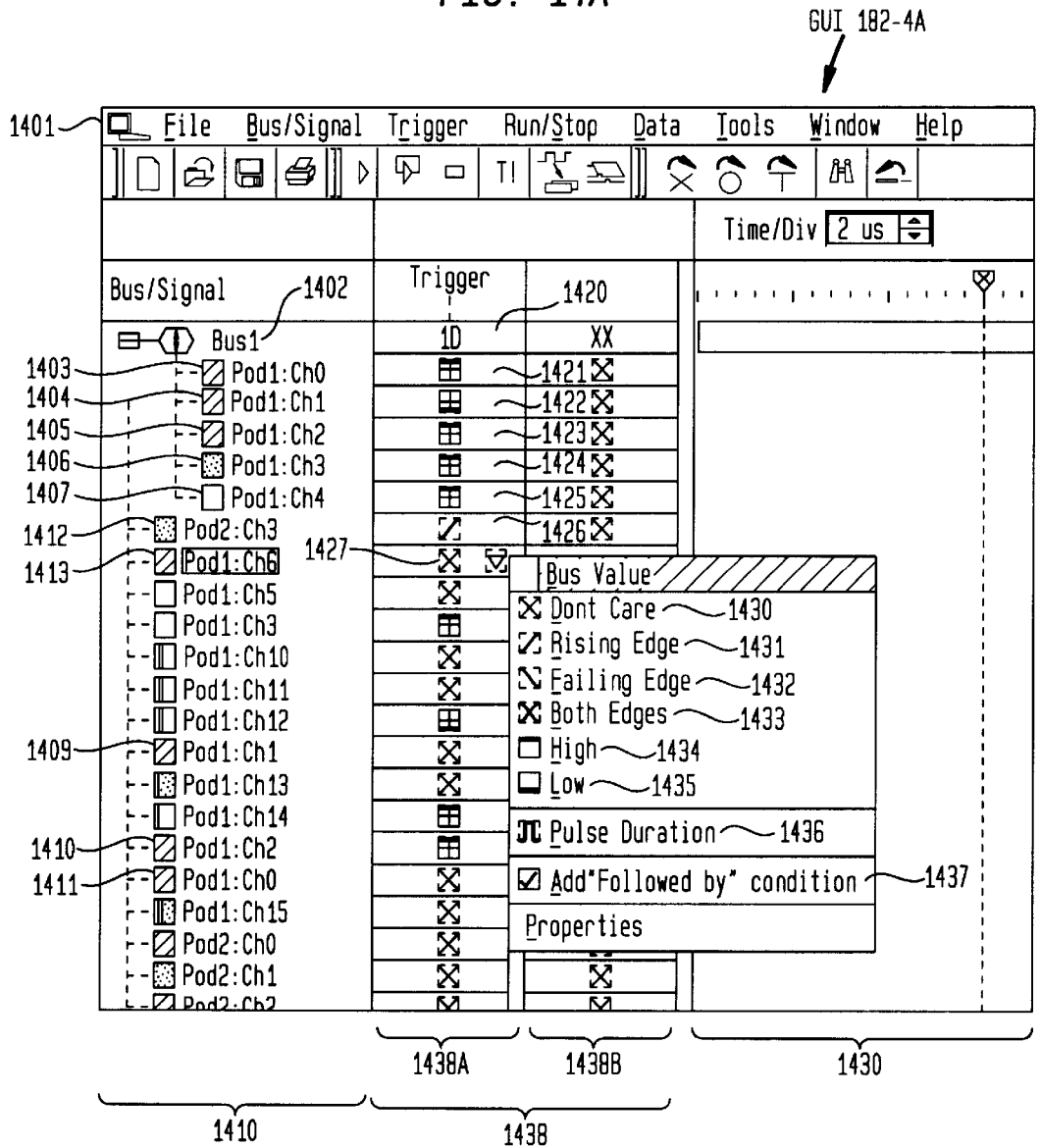

FIG. 14A shows an illustrative GUI 182-4A that includes a display window having three main display areas: bus-signal hierarchy area 1410; trigger specification area 1438; and signal display area 1430 (which correspond, respectively, to areas 770, 760, and 750 of FIG. 7). Hierarchy area 1410 initially displays default signals and buses, and is revised to display buses defined by user 101 and changes in the order of buses and/or signals, as described above. GUI 182-4A shows an illustratively example in which user 101 has defined a Bus1 (name label 1402) having five children consisting of the signals acquired over channels 0–4 of pod 1, as indicated by name labels 1403–1407. Horizontally aligned with each of these name labels are user-specified trigger conditions, if any, such as shown in trigger condition combo box 1420 associated by alignment with Bus1, and as shown in trigger condition combo boxes 1421–1425 associated by their respective alignments with the signals acquired over channels 0–4 of pod 1. User 101 has also specified a trigger condition for the signal acquired over channel 3 of pod 2, as indicated by trigger condition combo box 1426 that is horizontally aligned with name label 1412. The manner in which user 101 has specified these trigger conditions may be illustrated with respect to name label 1413 of the signal that is acquired over channel 6 of pod 1.

As indicated in GUI 182-4A by highlighting, user 101 has selected name label 1413 by, for example, clicking on it. Alternatively, user 101 may have clicked on the trigger condition combo box 1427 that is horizontally aligned with name label 1413. Either action, in accordance with known techniques, activates trigger condition combo box 1427 so that it displays a down arrow. By clicking on the down arrow, user 101 causes the display, in accordance with known techniques, of a list of trigger condition choices 1430–1437. Any of a variety of other known techniques could be employed to provide user 101 with these choices. Each of trigger condition choices 1430–1436 has adjacent to it an icon that graphically describes the choice. For example, the icon adjacent to trigger condition choice 1430 is a grayed box with a gray "X" in it. This icon is intended to suggest the "Don't Care" condition, as is made explicit by the name of choice 1430. A "Don't Care" condition means that user 101 intends that the trigger condition should not depend on the value of the signal associated with that choice. In contrast, user 101 may select trigger condition choice 1434 by clicking on it, by pressing "Alt-H" on the keyboard as indicated by the underlined "H" in "High," or in other known ways. As graphically suggested by the icon and explicitly indicated by the word "High," selection of this choice means that part of the trigger condition specified by user 101 is that the signal acquired over channel 6 of pod 1 be in the high logic state at the same time as other signals or buses are in specified trigger conditions as indicated in sub-area 1438A. Similarly, selecting trigger condition choice 1435 specifies that the signal is in the low logic state, choice 1431 means that the signal is changing logic states from low to high (a rising edge), choice 1432 means that the signal is changing logic states from high to low (a falling edge), and choice 1433 means that the signal is either changing from high to low or from low to high (both edges).

In the manner just described with respect to the signal associated with name label 1413, user 101 specifies trigger conditions for each of the signals in Bus1. Because some of the signals in Bus1 are also shown in GUI 182-4A as first-level signals external to Bus1 (those associated with name labels 1408–1411), display coordinator 630 has replicated for each of these signals the trigger condition choices that user 101 specified for them in combo boxes 1421–1424. Alternatively, user 101 may have specified the trigger condition choices in one or more of the combo boxes horizontally aligned with name labels 1408–1411 and display coordinator 630 would replicate them for the corresponding signals within Bus1.

Bus trigger condition 1420 that is associated with Bus 1 by horizontal alignment with its name label is not user-selectable in the illustrated embodiment. Rather, display coordinator 630, in accordance with known techniques, calculates bus trigger condition 20 to represent numerically the trigger conditions of its children, if possible. In the illustrated embodiment, this numerical representation is shown in hexadecimal notation, but any other base or type of representation could be used in alternative embodiments. Thus, the hexadecimal digits "1" and "D" are calculated from the following sequence of high and low logic states for trigger conditions 1424–1421, respectively: high, high, low, high (1, 1, 0, 1=D), and from the logic state for trigger condition 1425: high (1=1). As is evident, a hexadecimal representation is not possible if at least one of trigger conditions 1421–1424 is neither a high nor a low logic state, but, rather, is one of the other choices 1430–1433. If this is the case, then any arbitrary non-hexadecimal symbol may be used to indicate this condition. For example, bus trigger condition 1420 may be shown as "1$." If trigger condition 1425 is also changed to one of choices 1430–1433, bus trigger condition may be changed to "$$," or it may be eliminated, indicating that numerical representation of the bus trigger condition is not possible.

Figure 14B:
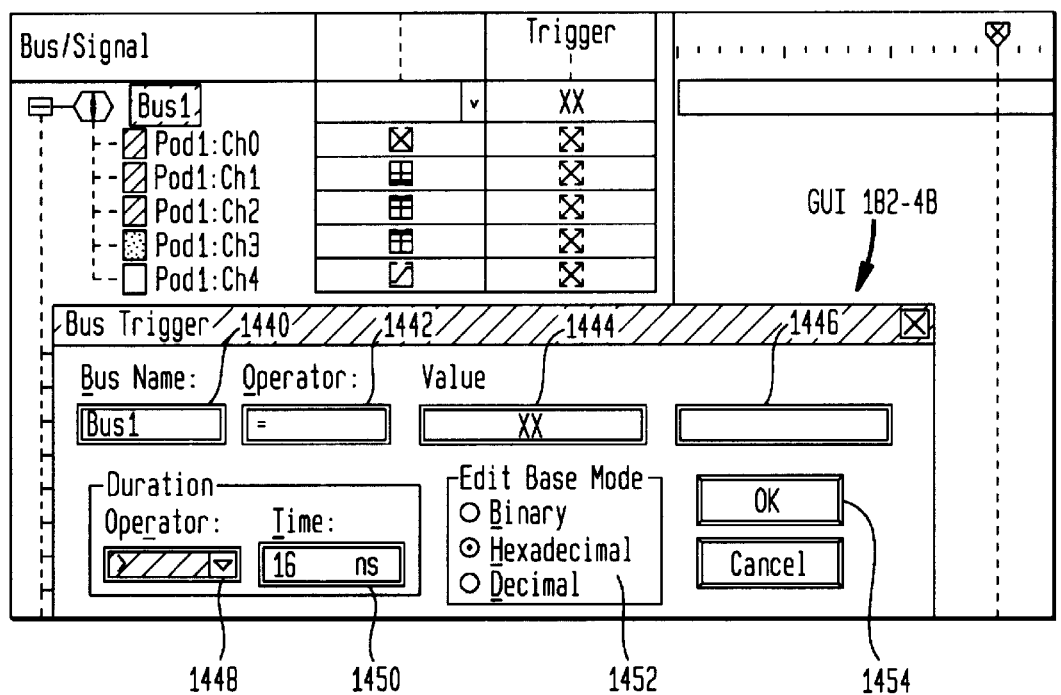

User 101 may also specify some variations of bus trigger condition 1420 directly rather than be setting the trigger conditions of each of its children. The bus trigger conditions that user 101 may directly set are, in the illustrated embodiment, those for which the trigger condition of each of the bus' children are either a high or a low state. User 101 may initiate a direct specification technique by clicking on, or otherwise selecting, trigger condition combo box 1420. In the illustrated embodiment, this action causes a bus-trigger dialogue box to be displayed in accordance with known techniques. An illustrative bus-trigger dialogue box, labeled GUI 182-4B, is shown in FIG. 14B. In this embodiment, GUI 182-4B is superimposed on GUI 182-4A so that user 101 can refer to the information in GUI 182-4A when making selection in GUI 182-4B. User 101 may reposition GUI 182-4B, in accordance with known techniques, if it obscures information that user 101 wishes to simultaneously observe in GUI 182-4A. GUI 182-4B includes a bus name label 1440, an operator combo box 1442, a first value text box 1444, a second value text box 1446, a duration operator combo box 1448, a duration time text box 1450, a numerical base option button area 1452, and an OK command button 1454. As is customary, user 101 selects the OK command button to finalize the other choices available in GUI 182-4B.

Bus name label 1440 typically is not user-selectable and merely provides visual feedback to user 101 of the name of the bus the trigger of which user 101 is specifying. When user 101 selects the down arrow in operator combo box 1442, a list of operators such as "=," "Not=," "In Range," or "Not In Range" are shown. If user 101 selects the operator "=," user 101 may then enter in first value text box 1444 a hexadecimal digit representing the bus trigger condition. (If user 101 selects the binary or decimal option button in area 1452, rather than the hexadecimal option button, then the number entered in text box 1444 is in that other base.) The number of "X's" in text box 1444 indicates to user 101 that two hexadecimal digits are to be entered, as would be the case for a bus having between five and eight children, inclusive. For example, user 101 may enter the hexadecimal digits "1" and "D" to specify the same trigger condition for Bus1 that was specified in the example provided above with respect to the selection of trigger conditions separately for the children of Bus1. That is, the bus trigger condition is satisfied when the signals acquired over channels 0–4 of pod 1 have, at the same time, the states high, low, high, high, and high, respectively.

It is now assumed that user 101 selects the operator "Not=" from operator combo box 1442. User 101 may then enter in text box 1444 a number indicating the states of the signals acquired over channels 0–3 of pod 1, such as "1D." By virtue of the "Not=" operator, user 101 thereby specifies that the bus trigger condition is satisfied when the signals acquired over channels 0–4 of pod 1 are simultaneously in any combination of states other than high, low, high, high, and high, respectively.

User 101 is now assumed to have selected the operator "In Range" from operator combo box 1442. In this case, both text box 144 and text box 1446 are available for textual input from user 101. (In contrast, text box 1446 is shown in GUI 182-4B as shaded to indicate that, when the "=" operator is selected, it is not available for textual input.) The bus trigger condition is then satisfied when the signals acquired over channels 0–4 of pod 1 are simultaneously in any combination of states that equals a number equal to or between the numbers entered by user 101 in text boxes 1444 and 1446. For example, if user 101 enters the hexadecimal digits "1C" and "1E," then the trigger condition for Bus1 will be satisfied for any of the following combinations of states corresponding respectively to the signals acquired over channels 0–4 of pod 1, and no others: low, low, high, high, high (1C); high, low, high, high, high (1D); and low, high, high, high, high (1E). Similarly, user 101 may select the operator "Not In Range" from operator combo box 1442. The bus trigger condition is then satisfied when the signals acquired over channels 0–4 of pod 1 are simultaneously in any combination of states that does not equal a number equal to or between the numbers entered by user 101 in text boxes 1444 and 1446.

Duration operator combo box 1448 enables user 101 to specify a trigger condition such that specified states of the children of Bus1 must persist for more than, or, alternatively, less than, a specified period of time. User 101 specifies the period of time using duration time text box 1450, and specifies the nature of the condition using duration operator combo box 1448. For example, as shown in GUI 182-4B, user 101 has selected the operator ">," signifying "greater than," and has accepted a default time duration of 16 nanoseconds. (As noted, user 101 could have replaced this default time duration by typing over it in text box 1450, or in other known ways.) By making these selections, user 101 specifies that the specified states of the children of Bus1 must persist for at least 16 nanoseconds. That is, if user 101 has specified that operator 1442 is "=" and first value 1444 is "1D," then the signals acquired over channels 0–4 of pod 1 must be in the low, high, high, high, and high states together for at least 16 nanoseconds to satisfy the bus trigger condition. Conversely, if user 101 has selected the "<" operator from duration operator combo box 1448, and illustratively assuming that the same signal states have been selected, then the bus trigger condition is satisfied only if those states are contemporaneously maintained for less than 16 nanoseconds. (Either the "<" or the ">" symbol may include an "equal to" condition, but this refinement typically is of little practical consequence since precise measurements of time periods generally are not expected or required.)

Figure 14C:
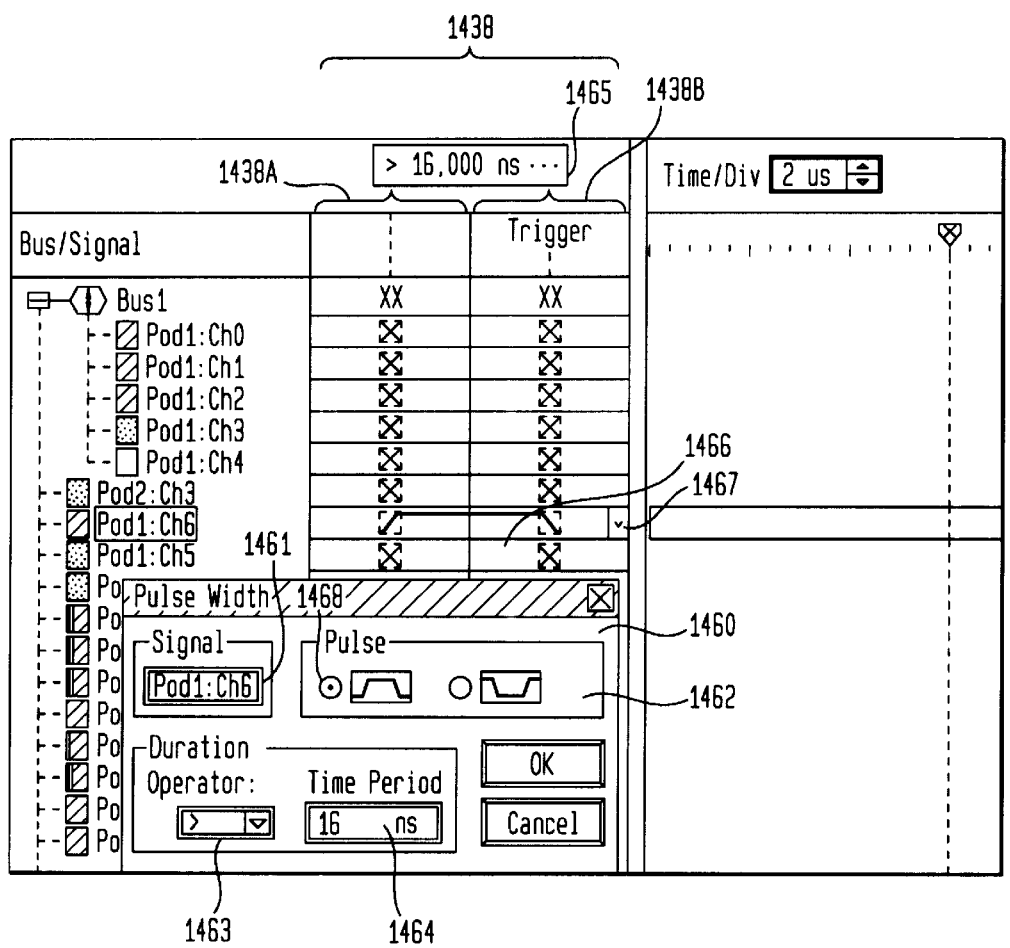

User 101 may also specify trigger condition duration using both of sub-areas 1438A and 1438B of trigger specification area 1438 of GUI 182-4A of FIG. 14A. Continuing the previous example in which user 101 selects a trigger condition for the signal acquired over channel 6 of pod 1, it is now assumed that user 101 selects trigger condition choice 1436, labeled "Pulse Duration." User 101 selects choice 1436 to indicate that the trigger condition associated with that signal is a pulse. In the illustrated embodiment, a pulse width dialogue box opens when user 101 selects choice 1436 so that user 101 may specify the sense (positive or negative) and duration of the pulse that will satisfy the trigger condition for the signal. Any of a variety of other known techniques may be employed to enable user 101 to specify the sense and duration of the pulse. With respect to the illustrated embodiment, an illustrative pulse width dialogue box 1460 is shown in FIG. 14C. Box 1460 includes signal name label 1461 that generally is not user-selectable but provides user 101 with visual feedback providing the name of the signal with respect to which user 101 is specifying the trigger condition. Box 1460 also includes area 1462 in which are displayed two option buttons associated respectively with an icon of a positive pulse and a negative pulse. It is assumed that user 101 specifies option button 1468 indicating a positive pulse. Box 1460 also includes time period text box 1464 and pulse duration operator combo box 1463. User 101 may accept the default setting in text box 1464 or type in, or otherwise select, a different time period for the duration of the positive pulse. Also, in a manner similar to that described above with respect to duration operator combo box 1448 of FIG. 14B, user 101 may use combo box 1463 to specify whether the positive pulse must persist either for a period greater than (">") or less than ("<") the time duration indicated in text box 1464. User 101 finalizes the choices made in box 1460 by any known technique, such as clicking on the "OK" button. In the illustrated embodiment, box 1460 is closed when user 101 finalizes the choices.

To provide a continuing visual indication of the choices made in box 1460, display coordinator 630 provides that pulse symbol 1466 is displayed in trigger specification area 1438. Pulse symbol 1466 is that of a positive pulse because user 101 selected option button 1468, but would be a negative pulse if the selection had been otherwise. Sub-area 1438A in this embodiment represents the beginning of a time period associated with one or more trigger conditions, and sub-area 1438B represents the end of that time period. Thus, pulse symbol 1466 is shown as starting (i.e., its rising edge is shown) in sub-area 1438A and ending (i.e., its falling edge is shown) in sub-area 1438B. The pulse duration and associated operator (">" in this example) specified by user 101 in dialogue box 1460 are displayed in duration box 1465 (shown in this embodiment above and between sub-areas 1438A and 1438B) to provide further visual feedback of the duration and nature of the pulse trigger condition associated with the signal acquired over channel 6 of pod 1. In the illustrated embodiment, display coordinator 630 uses known techniques to eliminate the trigger selections for Bus1when user 101 selects a pulse trigger condition for the signal acquired over channel 6 of pod 1. This is done as a matter of convenience because, as will be appreciated by those skilled in the relevant art, user 101 typically defines a pulse as a trigger condition to the exclusion of trigger conditions that might be specified for other signals or buses. Thus, to avoid possible confusion about whether the bus trigger condition or the pulse trigger condition is controlling, or how they are combined, the illustrated embodiment eliminates the possibility of this combination. For similar reasons of convenience and avoidance of ambiguity, display coordinator 630 does not permit user 101 to specify more than one edge condition in sub-area 1438A or more than one edge condition in sub-area 1438B. However, these restrictions need not be applied in alternative embodiments.

Trigger condition choice 1437, shown in FIG. 14A, provides another technique by which user 101 may specify that a trigger condition extends for a period of time. For example, it is illustratively assumed that user 101 specifies trigger condition choice 1434 in combo box 1427 so that the trigger condition for the signal acquired over channel 6 of pod 1 is specified to be that of a high logic state. It is also assumed for clarity that this signal is the only signal for which user 101 has specified a trigger condition. If user 101 does not select the check box of choice 1437, the trigger condition is defined solely by the high logic state of the signal acquired over channel 6 of pod 1. Typically, therefore, sub-area 1438B need not be displayed since the only specified trigger condition occurs in sub-area 1438A. However, it is now assumed that user 101 selects the check-box of choice 1437. Display coordinator 630 then causes sub-area 1438B to be displayed in addition to sub-area 1438A, in accordance with known techniques. User 101 may then specify another one of trigger condition choices 1430–1435 in sub-area 1438B for the same signal. In this case, display coordinator 630 causes a box similar to duration box 1465 to be displayed so that user 101 may enter a duration and operator (such as "<" or ">") to tie together the trigger conditions of the signal specified in sub-areas 1438A and 1438B. Alternatively, user 101 may leave the duration as undetermined.

Figure 14D:
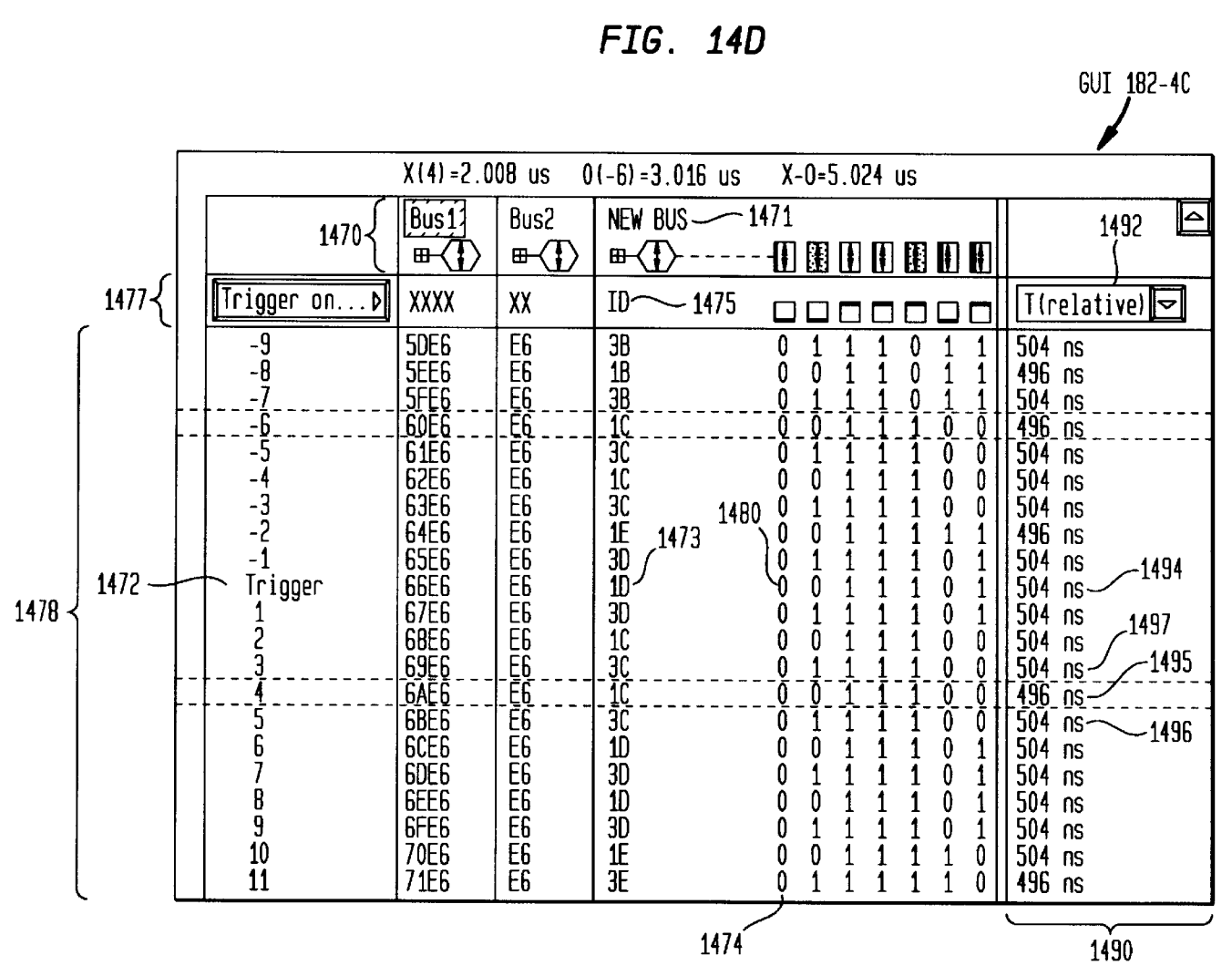

The foregoing techniques by which user 101 may specify trigger conditions for buses and/or signals have been illustrated with respect to bus/signal name labels arranged in a vertical hierarchy. The trigger conditions, and other associated graphical elements, have been described as associated with the name labels by horizontal alignment. As noted, however, other configurations are possible. FIG. 14D shows an illustrative GUI 182-4C in which the bus/signal name labels are displayed in a horizontally disposed hierarchy, referred to as bus-signal hierarchy area 1470. This bus-signal hierarchy may be functionally equivalent in all respects to a vertically aligned bus-signal hierarchy, such as the one described above with respect to area 1410 of FIG. 14A. Also included in GUI 182-4C are trigger specification area 1477, which may be functionally equivalent to trigger specification area 1438 of FIG. 14A. However, area 1477 is displayed as a horizontal row, whereas area 1438 is displayed as a vertical column. As described with respect to area 1438, user 101 may enter the hexadecimal digits "1D" to specify trigger condition 1475 of NEWBUS. The association between trigger condition 1475 and the name label NEWBUS is made by their vertical alignment in this embodiment.

GUI 182-4C also includes signal display area 1478, which is similar to signal display area 1430 of FIG. 14A. Signal display area 1478 displays lists of numbers representing the logic states of the signals and buses at various times, as specified in time specification area 1490. These numbers are referred to herein as "signal display list items," and may be displayed in any numerical base. For example, signal display list item 1473 displays the hexadecimal digits "1D." As previously noted, these numbers indicate the states of the signals of NEWBUS (there are seven children in this example) at the sample time indicated by the horizontally aligned time entry 1494. Time entry 1494 is a relative time; i.e., it shows the time between samples, or the sample period. In this embodiment, user 101 may select time combo box 1492 to change the relative times shown in area 1490 to absolute times. These absolute times are typically shown in relation to the sample time at which the trigger condition occurred. Thus, if user 101 selects absolute time from combo box 1492, time 1495 would be shown as "0.0 ns," time 1497 would be shown as "−8 ns," and time 1496 would be shown as "8 ns." That is, the signal display list items in trigger row 1472 are assumed to have been sampled at time zero, items above trigger row 1472 are those that were sampled prior to the occurrence of the trigger condition, and items below trigger row 1472 are those that were sampled after the occurrence of the trigger condition. In this embodiment, the representations of the states of each of the seven children, i.e., their signal display list items, are shown as binary numbers, such as the item 1480 for one of the children of NEWBUS as sampled at the occurrence of the trigger condition.

Additional techniques by which user 101 may specify trigger conditions for buses and signals are now described with reference to FIGS. 15A–15X. These techniques advantageously rely predominantly on graphical, rather than textual, manipulations. FIG. 15A is one embodiment of a graphical user interface referred to as GUI 182-5A. GUI 182-5A includes three principal areas: waveform palette area 1505, waveform workspace area 1535, and bus/signal name area 1530. Generally speaking, user 101 "draws" a waveform specifying a trigger condition for a bus or signal by selecting and dragging one or more symbolic trigger conditions from waveform palette area 1505 into waveform workspace area 1535 in horizontal alignment with the name of the corresponding bus or signal in name area 1530. These actions by user 101 constitute aspects of user-selected display data 606 shown in FIG. 6 that may be acted upon by display coordinator 630, in accordance with known techniques, to generate, via GUI display data 609, the waveforms and other aspects of GUI 182-5A and related graphical user interfaces. It will be understood that GUI 182-5A and its resulting waveforms, and the other graphical user interfaces and waveforms of FIGS. 15A–15U, 15W, and 15X, are illustratively only and that many variations are possible to implement the operations that these Figures illustrate.

Waveform palette area 1505 in the illustrative embodiment of GUI 182-5A includes nine symbolic trigger conditions, 1510-A through 1510-I, hereafter generally and collectively referred to as trigger-condition icons 1510. Trigger-condition icon 1510-A represents a rising edge, icon 1510-B represents a falling edge, icon 1510-C represents either a rising or falling edge, icon 1510-D represents a low logic state, icon 1510-E represents a high logic state, icon 1510-F represents a "Don't Care" condition (the trigger condition does not depend on the logic state of the signal or bus), icon 1510-G represents a bus trigger condition, icon 1510-H represents a positive pulse, and icon 1510-I represents a negative pulse. Any of these icons, when dragged and dropped by user 101 onto workspace 1535, result in what hereafter may be referred to as a "trigger-condition element."

Bus/signal name area 1530 includes a column of name combo boxes, such as combo boxes 1531–1534. User 101 may click on the down arrow of any of the combo boxes to see a list of name labels of all default and user-defined buses and/or signals, as well as a "none" choice. By selecting one of these choices, user 101 initiates known procedures that result in the selected name label, or the "none" selection, appearing in the combo box. If user 101 selects a name label of a bus or signal, then user 101 may generate a waveform that describes a trigger condition for that signal or bus by dragging and dropping appropriate ones of trigger-condition icons 1510 into approximate horizontal alignment with the name label. Hereafter, for convenience, a trigger-condition element generated in this manner, that is horizontally aligned in workspace 1535 with a name label, will be said to be in the same row as that label. Thus, in the illustrated embodiment, user 101 may associate a trigger-condition icon with a signal or bus by dragging the icon into or near (hereafter, simply "into") the same row as the name label that identifies the signal or bus. Other techniques for establishing this association may be used in alternative embodiments, such as by using vertical or other alignment, colors, connectors, shadings, and so on. In the illustrated embodiment, each row is associated with only one signal or with one bus. Thus, if user 101 drags more than one trigger-condition icon into the same row, they are all assumed to be intended to apply to the signal or bus associated with that row.

If the "none" selection is chosen, as is shown in combo box 1534, and user 101 drags a trigger-condition icon into the corresponding row, the action will have no affect unless or until user 101 chooses a name of a signal or bus from the combo box. In some implementations, display coordinator 630 may, using known techniques, cause an error warning to be displayed, cause the cursor to change to a "prohibited" symbol, or otherwise advise user 101 that a trigger-condition element has been placed in a row that is not associated with a signal or bus. Display coordinator 630 may similarly advise user 101 when other types of impermissible combinations or placements of trigger-condition elements have been made. For example, in the illustrated embodiment, trigger-condition icon 1510-G is used for a bus and not for a signal. If user 101 attempts to drag and drop icon 1510-G into a row associated with a signal, then display coordinator 630 may change the cursor to indicate the error. Similarly, trigger-condition icons 1510-A through E, H, and I are used for signals and not for buses. If user 101 drags one of these signal icons into a row associated with a bus, then an appropriate error message and/or cursor change, or other indication, may be made. Also, if user 101 changes one of the combo boxes in area 1530 so that a signal name is replaced by a bus name, or vice versa, display coordinator 630 may provide a warning to the effect that the change requires that the waveform in the associated row be eliminated, else a bus would be associated with trigger-condition icons applicable to signals, or a signal would be associated with trigger-condition icons applicable to buses.

User 101 can reposition a trigger-condition element by dragging it. User 101 may also delete a trigger-condition element by dragging it off of waveform workspace area 1535, by dragging and dropping on top of it "don't care" trigger-condition icon 1510-F, by selecting it and pressing the delete key on a keyboard, or by using similar known techniques.

GUI 182-5A also includes comment area 1503 that typically is a text box. User 101 may enter text in area 1503 to identify the trigger conditions that user 101 specifies in accordance with the techniques described in relation to FIGS. 15A–X.

In the illustrated embodiment, the waveforms displayed in waveform workspace area 1535 have a temporal sequence proceeding horizontally from earlier time on the left to later time on the right. However, the opposite direction could be used in alternative embodiments, and/or the horizontal orientation described with respect to the illustrated embodiment could be a vertical orientation in other embodiments. Moreover, this temporal sequence need not, and frequently is not, uniform. Vertical lines 1520–1522, hereafter referred to as constant-time lines, each denote a particular time on the horizontal time axis of workspace 1535. In general, constant-time lines do not denote sample times. Time-limit buttons 1523 and 1524 display times, or time-limits, between successive constant-time lines. For example, time-limit button 1523 displays the text "<50 ns," which means that the time represented by constant-time line 1521 occurs at any time less than 50 nanoseconds after the time represented by constant-time line 1520. Similarly, time-limit button 1524 displays the text ">8 ns," which means that the time represented by constant-time line 1522 occurs at any time more than 8 nanoseconds after the time represented by constant-time line 1521. (In various embodiments, either "<" or ">" may also be defined to include "=.") More generally, using techniques described below, user 101 may specify that the time between any two adjacent constant-time lines is greater or less than a specified period of time, within a range of times, or is an indefinite, i.e., unspecified, period of time. An indefinite period of time means that an event (e.g a rising edge of a signal) occurring at the time represented by an earlier constant-time line is eventually followed by an event (e.g. a falling edge of that signal) occurring at the time represented by the later (i.e., to the right of the earlier) constant-time line. This potential for temporal non-uniformity frequently is advantageous because trigger events separated by different time scales may be displayed together in workspace 1535. Also, the range and indefinite time options provide user 101 with flexibility in specifying trigger conditions.

Thus, the only defined times or time ranges in workspace area 1535 are those designated by constant-time lines. Consequently, user 101 may validly place trigger-condition icons that represent an occurrence at a particular time only on a constant-time line. It will be understood that placement of an icon near a constant time-line, or near a row, may be interpreted as an intention to place the icon on the time-line or in the row, and the icon may be snapped to that placement in accordance with known techniques. Also, when an icon approaches a constant-time line, the line may be highlighted to provide visual feedback to user 101 that display coordinator 630 will cause the icon to snap to the line. In the illustrated embodiment, the types of icons that may be validly placed only on a constant-time line are trigger-condition icons 1510-A through E; i.e., those representing edges or logic levels of signals. (However, other icons, such as bus trigger-condition icon 1510-G, may also be placed on a constant-time line. The distinction is that icon 1510-G, unlike icons 1510-A through E, may also validly be placed between constant-time lines, as described below.)

A number of conformance rules are applied by display coordinator 630 to ensure that the placements by user 101 of trigger-condition icons can be translated by trigger specifier 640 into valid trigger condition data 238. The word "valid" generally means in this context that the trigger condition data is unambiguous and may be implemented by trigger condition and position detector 230. In some implementations, actions that are unlikely to be intended by user 101 may also be considered to be invalid. Alternative embodiments may have other, fewer, and/or additional conformance rules depending on how ambiguities are perceived and resolved (by default or by query of user 101, for example) and on the capabilities of the hardware that implements the trigger conditions. Also, display coordinator applies various drawing rules for connecting, forming, revising, and otherwise completing waveforms based on the portions of waveforms (corresponding to icons 1510) dragged by user 101 into workspace 1535. Display coordinator 630 implements these conformance and drawing rules in accordance with any of a variety of known techniques, such as by using a look-up table that correlates various combinations of waveform-placements and conditions with warning and/or drawing actions.

One drawing rule in the illustrated embodiment is that if user 101 drops one trigger-condition icon onto another, a replacement is performed. FIGS. 15B and 15C illustrate one example of this action, and also respectively illustrate the drawing of constant-logic-level waveforms and pulse waveforms. FIG. 15B shows a waveform 1544 that spans an indefinite time period (as denoted by time-limit button 1545) between constant-time lines 1542 and 1543. User 101 draws this waveform by dragging trigger-condition icon 1510-D (low logic state) onto constant-time line 1542 in the row corresponding to the signal for which a trigger condition is being specified. (Hereafter, it will be understood, but not necessarily stated, that user 101 drags trigger-condition icons into the row for the signal or bus for which a trigger condition is being specified.) When icon 1510-D is on line 1542 and user 101 releases the mouse button, waveform portion 1540 consisting of a low horizontal line, representing a low logic state and having generally the same shape as icon 1510-D, snaps into place on line 1542 and in the appropriate row alignment. (This technique by which icons 1510 generate waveform portions of corresponding shape when dragged to and released in workspace will hereafter be understood but not necessarily stated. However, it will be understood that icons having shapes different than the waveform portions they produce may be used in alternative embodiments. Hereafter, waveform portions will simply be referred to by reference to the type of icon used to generate them: .e.g., a falling edge, rising edge, and so on.) User 101 also uses trigger-condition icon 1510-D to draw a second low logic state 1541 that is positioned on constant-time line 1543. Display coordinator 630 causes a connecting waveform portion to be generated between low logic states 1540 and 1541, as shown in FIG. 15B. This action is taken in accordance with a drawing rule of the illustrated embodiment that adjacent and equal logic states are to be connected.

It is now assumed with reference to FIG. 15C that user 101 drags trigger-condition icon 1510-H (positive pulse) between constant-time lines 1542 and 1543. A conformance rule is that pulse icons 1510-H and I are to be dragged between two constant-time lines. This rule avoids a situation in which a pulse icon is placed directly on a constant-time line in a fashion that does not make clear which side of the line the pulse is intended to occupy. The reason is that pulses have duration. Duration, as noted, is indicated in waveform workspace area 1535 by time-limit buttons, such as button 1545, that span the distance between two constant-time lines. A corresponding drawing rule is that, when user 101 drags one of pulse icons 1510-H or I between two constant-time lines, the pulse is widened to span the distance between the lines. The waveform that results when user 101 drags icon 1510-H between lines 1542 and 1543, and when display coordinator 630 applies the pulse-widening drawing rule, is shown as waveform 1546. In accordance with the replacement rule, waveform 1546 replaces waveform 1544.

Figure 15D:
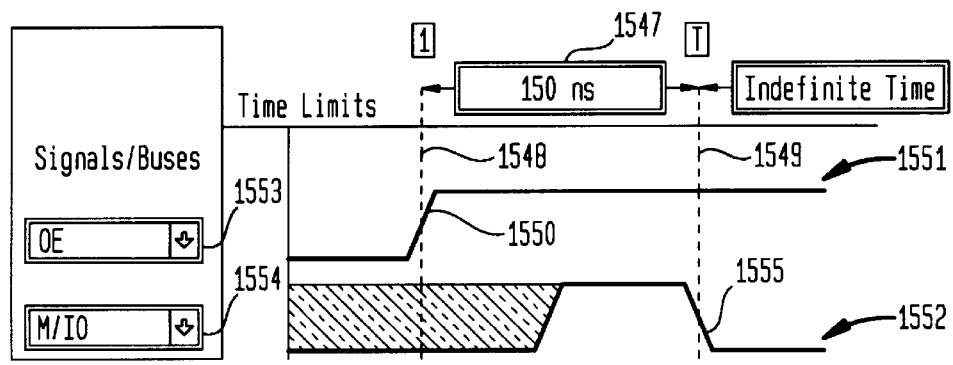
FIGS. 15A–15U, 15W, and 15X are embodiments of graphical user interfaces in accordance with a second technique for display of information from, and/or provision of trigger condition information to, a trigger specifier of the display processor of FIG. 6.
FIG. 15V is a table illustrating one embodiment for implementing rules for interpreting trigger conditions specified by a user in the graphical user interfaces of FIGS. 15A–15U, 15W, and 15X.

FIG. 15D is an example in which user 101 has employed time-limit button 1547 to specify the duration of time between a trigger-condition element relating to one signal and a trigger-condition element relating to another signal. Waveform 1551 specifies the trigger-condition for signal "OE," as indicated by name label 1553. User 101 has drawn waveform 1551 by dragging icon 1510-A onto constant-time line 1548 to draw rising edge 1550. To complete waveform 1551, display coordinator 630 has applied a drawing rule that a logic state specified by user 101 at one constant-time line remains at that state unless and until user 101 otherwise indicates. User 101 has also drawn waveform 1552, associated with the signal "M/IO" as indicated by name label 1554, by dragging trigger-condition icon 1510-F (don't care) to a position prior to (i.e., to the left of) constant-time line 1549 and by dragging trigger-condition icon 1510-B onto constant-time line 1549 to draw falling edge 1555. To complete waveform 1552, display coordinator 630 has applied the drawing rule that a "don't care" condition continues until user 101 specifies another signal icon, i. e., one of trigger-condition icons 1510-A–E, H, or I. User 101 has also specified that the time between constant-time lines 1548 and 1549 is ">150 ns," as shown in time-limit button 1547. User 101 specifies this time period and the "greater than" operation in accordance with any of a variety of techniques described above. For example, button 1547 may be a combo box from which user 101 may select the operator and/or the time, all or part of the duration specification may be typed in or otherwise entered by user 101, and so on. Having entered this specification with respect to time-limit button 1547, user 101 has also specified that the trigger condition includes the requirement that the time between rising edge 1550 of signal OE and falling edge 1555 of signal M/IO is greater than 150 nanoseconds.

As noted, trigger-condition icon 1510-G represents a bus trigger condition. One aspect of a bus trigger condition is a representation of the values of the constituent signals of the bus, hereafter referred to as the bus "pattern." For example, a bus pattern of "FF" denotes, using hexadecimal digits, that the eight signals that user 101 has defined as constituting the bus are all at high logic levels for the duration of the bus trigger condition. As described above in relation to FIG. 14A, a variety of such notations, some using characters in addition to hexadecimal or other-base digits, may be used to specify a bus pattern. For example, the pattern "FX" may be used to indicate that user 101 has specified a "don't care" condition with respect to the group of the least significant four signals represented by "X." It is possible for a bus pattern to be specified as, for example, "XX," which represents a trigger condition in which the signals of the bus may be any value.

User 101 may specify that a bus trigger condition either has, or does not have, a duration. That is, the bus trigger condition may occur at a particular time that user 101 specifies by positioning the bus trigger-condition icon on a constant-time line. Alternatively, the bus trigger condition may persist for a duration that user 101 indicates by positioning the bus trigger-condition icon between constant-time lines. Thus, unlike trigger-condition icons representing conditions of signals, bus trigger-condition icon 1510-G of the illustrated embodiment may be position either directly on a constant-time line or between constant-time lines.

Figure 15E:
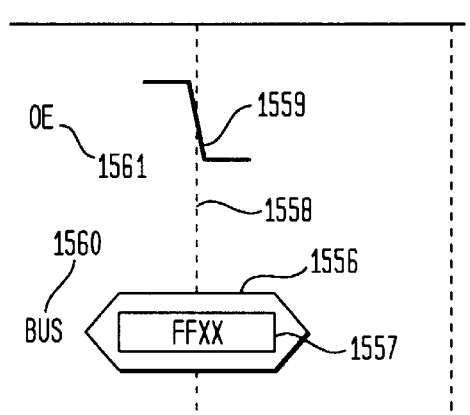

FIG. 15E shows a bus trigger condition 1556 that user 101 has drawn on constant-time line 1558. User 101 has specified that bus trigger condition 1556 has a bus pattern of "FFXX." User 101 makes this specification by typing, selecting patterns from a combo box, or using another known technique. Because user 101 dragged bus-trigger condition icon 1510-G onto line 1558, bus trigger condition 1556 does not have a duration; rather, it occurs at the time represented by line 1558. In addition to specifying this bus trigger condition for the bus "BUS" (label 1560, illustratively assumed to have been selected from a combo box such as box 1553), user 101 has also specified a trigger condition for a signal "OE" (label 1561). In particular, user 101 has drawn falling edge 1559 on constant-time line 1558 (i.e., user 101 has dragged trigger-condition icon 1510-B onto line 1558). Thus, the combined trigger condition is that BUS has the pattern "FFXX" at the time that signal OE has a falling edge.

Figure 15F:
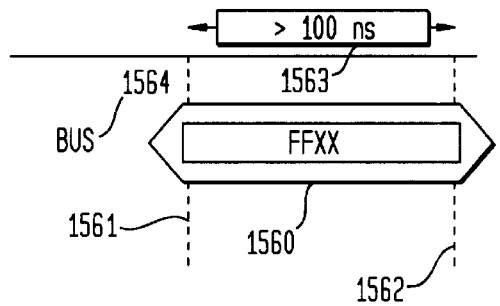

FIG. 15F shows a bus trigger condition 1560 having a duration of greater than 100 nanoseconds. User 101 specified this trigger condition by dragging bus trigger-condition icon 1510-G to any position between constant-time lines 1561 and 1562, and by specifying the duration ">100 ns" in time-limit button 1563. In response to this positioning, display coordinator 630 in the illustrated embodiment highlights the columnar area between lines 1561 and 1562 to provide user 101 with visual feedback that icon 1510-G is correctly placed to draw a bus trigger condition having duration. Similarly, display coordinator 630 may also cause name label 1564 of the associated bus to be highlighted to provide visual feedback that the trigger condition pertains to the bus of that name. In the illustrated embodiment, display coordinator 630 applies a drawing rule that a bus trigger-condition having a duration is stretched to encompass the duration between the constant-time lines surrounding it. User 101 may readily convert bus trigger condition 1560, which has a duration, to a bus trigger condition without duration by dragging it to a constant-time line.

Figure 15G:
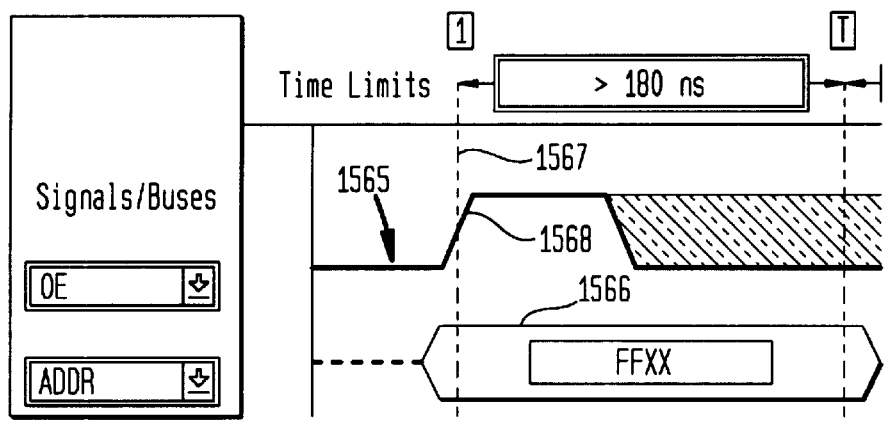

In the illustrated embodiment, the duration of a bus trigger-condition having a duration includes the time represented by the constant-time lines that define its duration. For example, FIG. 15G shows bus trigger-condition 1566 having a duration that includes the time represented by constant-time line 1567. To provide visual feedback of this condition, display coordinator 630 causes bus-trigger-condition 1566 to be drawn so that it extends on and slightly over (i.e., to the left of in this example) line 1567. It is thus visually clear that the indicated bus pattern is stable at the time represented by line 1567. Thus, if user 101 draws a trigger-condition element such as rising edge 1568 of waveform 1565 on constant-time line 1567, then it is clear that this rising edge occurs during bus trigger-condition 1566. More specifically, as shown in FIG. 15G, signal "OE" has a rising edge 1568 that occurs, at a time represented by line 1567, when bus "ADDR" has a pattern "FFXX."

Figure 15H:
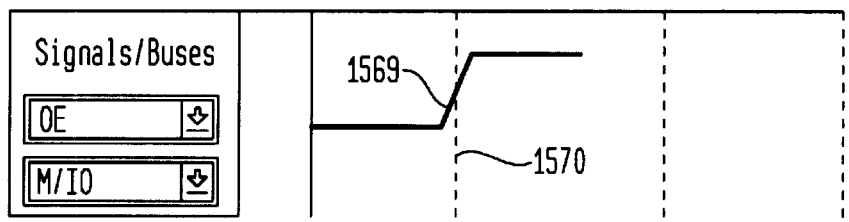
Figure 15I:
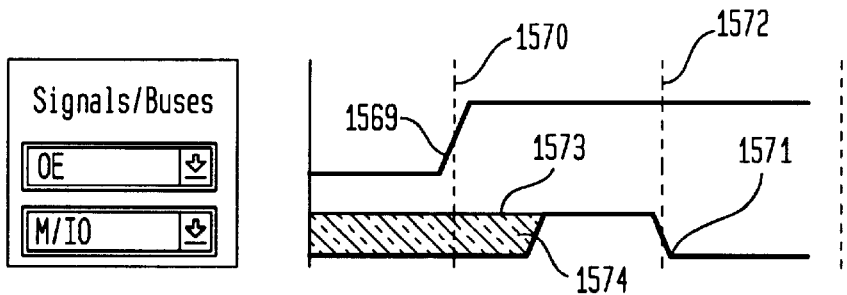

Another drawing rule in the illustrated embodiment involves "backfilling" of trigger-condition waveforms to indicate "don't care" conditions. This rule is illustrated in FIGS. 15H and I. As shown in FIG. 15H, user 101 has drawn rising edge 1569 of the signal "OE" on constant-time line 1570. FIG. 15I shows the same workspace 1535 after user 101 has drawn falling edge 1571 of signal M/IO on constant-time line 1572. While the value of signal OE at the time represented by line 1570 is known (ie., it is a rising edge), user 101 has not specified the value of signal M/IO at that time. In the illustrated embodiment, display coordinator 630 therefore backfills trigger-condition waveform 1573 of signal M/IO in the area prior to (i.e., to the left of) falling edge 1571 by inserting "don't-care" condition 1574. The backfilling extends back to any preceding constant-time line for which a trigger condition is defined for any other signal in the workspace, i.e., signal OE in this example. Backfilling with the "don't-care" condition provides visual feedback to user 101 that, at the time represented by line 1570, the value of signal OE is a rising edge and signal M/IO may have any value. User 101 may override "don't-care" condition 1574 automatically inserted by display coordinator 630 in accordance with the backfilling drawing rule. User 101 may do this by dragging a trigger-condition icon to constant-time line 1569, thus specifying the value of signal M/IO at that time.

Figure 15J:
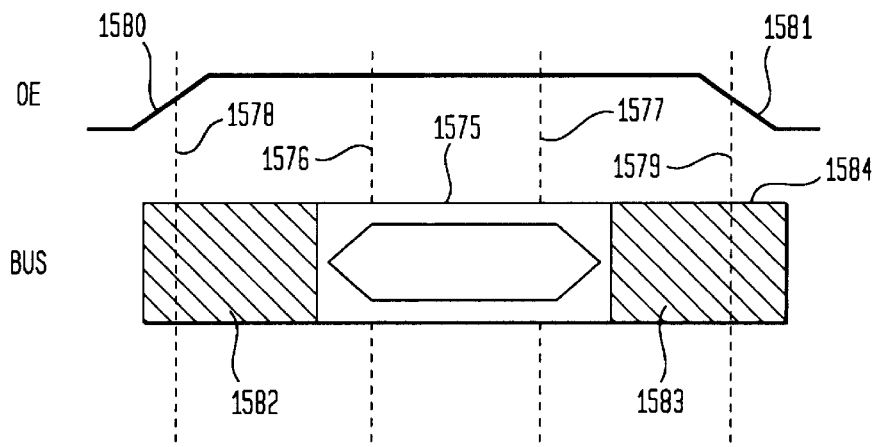

A related drawing rule in the illustrated embodiment is that, when user 101 draws a bus trigger-condition, display coordinator 630 may automatically insert "don't-care" conditions. FIG. 15J shows bus trigger-condition 1575 drawn by user 101 between constant-time lines 1576 and 1579 and stretched by display coordinator 630 to encompass this duration as described above. User 101 has also drawn rising edge 1580 and falling edge 1581 for a signal "OE" during times represented by constant-time lines 1578 and 1579, respectively. In accordance with the rule, display coordinator 630 has backfilled "don't-care" condition 1582 so that bus trigger-condition waveform 1584 extends backward from the beginning of bus trigger-condition 1575 back to and including line 1580. Similarly, display coordinator 630 has inserted "don't-care" condition 1583 so that bus trigger-condition waveform 1584 extends forward from the end of bus trigger-condition 1575 up to and including line 1581. These actions provide visual feedback to user 101 that the value of the bus associated with waveform 1584 is not to be considered with respect to the trigger condition at times 1580 and 1581.

Figure 15K:
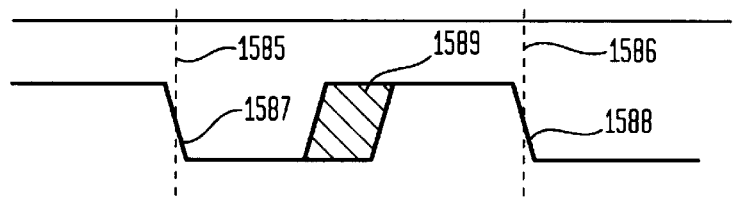

FIG. 15K illustrates a drawing rule applicable to conditions that hereafter are referred to as "discontinuous adjacent trigger events." As shown in the illustrative example of FIG. 15K, user 101 has drawn falling edge 1587 at the time represented by constant-time line 1585. It is illustratively assumed that user 101 has also drawn falling edge 1588 at the time represented by constant-time line 1586. These actions present an ambiguous situation, since it is not clear how the logic level could fall a second time without rising. That is, trigger-condition elements 1587 and 1588 are said to be discontinuous adjacent trigger events. In the illustrated embodiment, the rule is applied that user 101 intended a "don't care" to be inserted between these two events. Display coordinator 630 therefore inserts "don't-care" condition 1589 between discontinuous trigger events 1587 and 1588. The same rule would apply, and the same action taken by display coordinator 630, for two adjacent rising edges. Also, in the illustrated embodiment, an "either-edge" trigger event (drawn using trigger-condition icon 1510-C) is considered to be discontinuous with all other trigger events, including other "either-edge" trigger events, thus resulting in the same action by display coordinator 630 as just described with respect to the example of FIG. 15K.

Figure 15L:
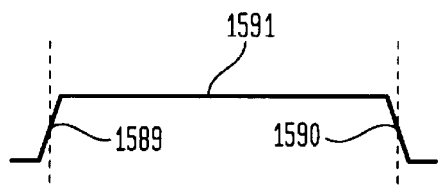
Figure 15M:
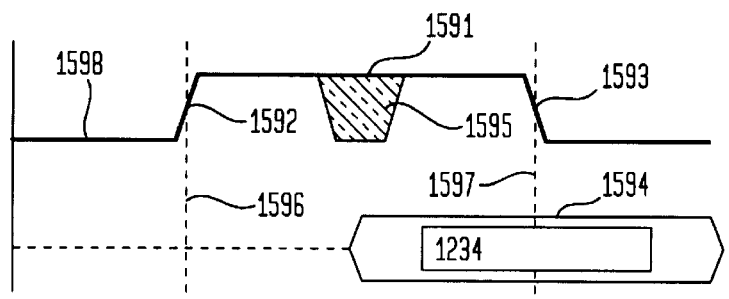

FIG. 15L illustrates the drawing rule of the illustrated embodiment that "continuous adjacent trigger events" are to be connected. Continuous adjacent trigger events in the illustrated embodiment are a high level followed by a low level, or a low level followed by a high level. It is illustratively assumed that user 101 has drawn rising edge 1589 and falling edge 1590. Display processor 630 thus, in accordance with the rule, connects the two edges with connector 1591. Connector 1591 may be displayed in a lighter shade, or otherwise highlight the connector to distinguish it from edges 1589 and 1590. One reason for highlighting connector 1591 is to make it clear to user 101 that the resulting pulse waveform is due to the described actions rather than the drawing by user 101 of a pulse. Another reason to highlight the connector is that user 101 may not want the edges connected. For example, as shown in FIG. 15M, user 101 has drawn rising edge 1592 and falling edge 1593 at the times represented by constant-time lines 1596 and 1597, respectively. User 101 has also drawn bus trigger-condition 1594 occurring at the time represented by constant-time line 1597. In accordance with conventional terminology, it may be said that edge 1593 "qualifies" bus trigger-condition 1594. That is, the significant factor to user 101 is that edge 1593 occurs at a time when the bus pattern of condition 1594 is stable. User 101 may not care what happens to signal 1598 between rising edge 1592 and falling edge 1593. In this case, user 101 may click on connector 1591 or similarly indicate a desire to change connector 1591. Display coordinator 630 then applies the drawing rule that connector 1591 should be replaced by a "don't-care" condition, as shown by "don't-care" condition 1595. In another aspect of this rule in the illustrated embodiment, if user 101 clicks again on "don't-care" condition 1595, display coordinator 630 replaces it with connector 1591.

Figure 15N:
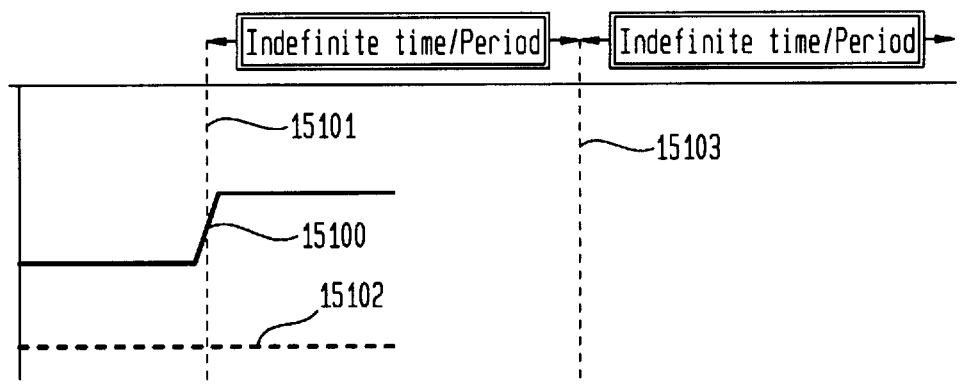
Figure 15O:
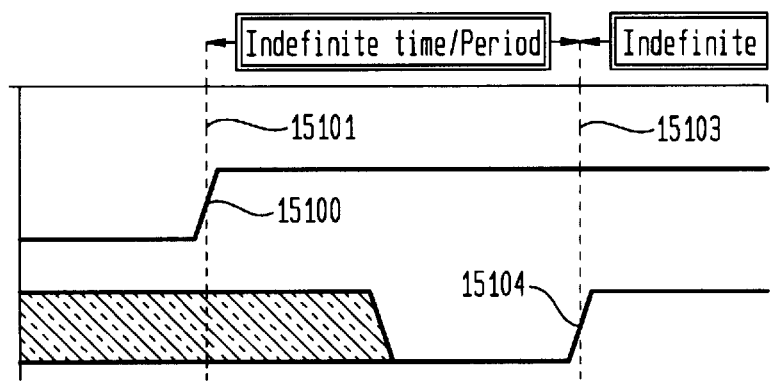

A further drawing rule is illustrated by FIGS. 15N and O. In FIG. 15N, user 101 has drawn rising edge 15100 on constant-time line 15101. User 101 has not yet entered a trigger-condition element for a second signal, as indicated by the dashed waveform 15102. In FIG. 15O, it is shown that user 101 has now drawn rising edge 15104 for the second signal on constant-time line 15103 that follows constant-time line 15101. It is illustratively assumed, however, that user 101 has not drawn a trigger-condition element for the first signal on constant-time line 15103. Display coordinator 630 therefore applies a drawing rule in accordance with the illustrated embodiment so that rising edge 15100 is extended to line 15103. That is, the high logic state resulting from rising edge 15100 is extended to line 15103. More generally, the rule is that when user 101 specifies a trigger-condition element for a first signal on a first constant-time line but not on a subsequent constant-time line, and user 101 specifies a trigger-condition element for a second signal or for a bus on that subsequent constant-time line, display coordinator 630 extends the trigger-condition element for the first signal from the first constant-time line to the subsequent constant-time line. User 101 may override this rule by drawing a trigger-condition element for the first signal on line 15103. This rule for extending signals may be compared with the rule in accordance with the illustrated embodiment for extending buses, as described above with respect to FIG. 15J. As noted, buses are extended under similar circumstances by adding "don't care" conditions rather than by extending the existing trigger condition. The difference is a matter of anticipating the likely intentions of user 101 under typical operating conditions, and the rules may thus be otherwise in alternative embodiments.

Figure 15P:
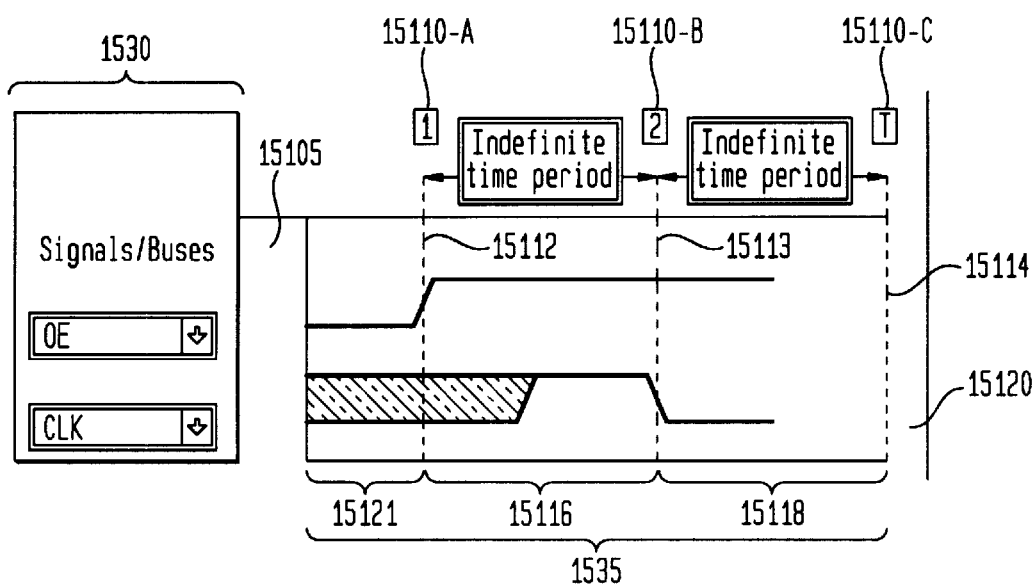

FIG. 15P illustrates one technique by which user 101 may insert trigger-condition elements before those already entered in waveform workspace 1535. In the illustrated embodiment, workspace 1535 typically includes three constant-time lines. For example, in FIG. 15P, workspace 1535 includes lines 15112–15114. These lines vertically divide workspace 1535 into two principal workspace intervals: 15116 and 15118. Additional portions of workspace 1535 extend to the right of line 15114 (space 15120) and to the left of line 15112 (space 15121). Thus, a trigger-condition element that user 101 draws on lines 15112 or 15114 may be extended somewhat into areas 15105 or 15120, respectively, for clarity. Another area, referred to as insert column 15105, is provided in the illustrated embodiment of workspace 1535 between area 15105 and bus/signal name area 1530. Insert column 15105 is provided so that user 101 may insert trigger-condition elements prior to those already drawn on workspace 1535. In this embodiment, user 101 accomplishes an insertion by dragging one of trigger-condition icons 1510 into insert column 15105 and dropping it there. In response to this action, display coordinator 630 changes workspace 1535 by eliminating constant-time line 15114, shifting lines 15112 and 15113 to the right, and inserting a new constant-time line (not shown) at the location formerly occupied by line 15112. The waveforms in areas 15121 and 15116 similarly shift to the right, and any trigger-condition elements in area workspace interval 15118 are deleted. Display coordinator 630 also adds the trigger-condition element that user 101 dragged and dropped into area 15105 into a new workspace interval that now occupies the space formerly occupied by workspace interval 15116. User 101 may restore the workspace to its condition before the drag and drop by selecting an "undo" button, or by using similar known techniques.

Also, user 101 may insert and/or delete any constant-time line. Generally, inserting a constant-time line results in the addition of a workspace interval, and the deletion of a constant-time line results in the deletion of a workspace interval. In one implementation, user 101 may add or delete a workspace interval by clicking on one of sequence labels 15110-A through C, generally and collectively referred to as sequence labels 15110, and using an insertion/deletion dialogue box (not shown) to indicate whether an insertion or a deletion is desired. For example, user 101 may click on sequence label 15110-C and select a delete option button in the dialogue box. In response to this action, display coordinator 630 deletes line 15114 and shifts workspace intervals 15116, and the waveforms contained therein, to the space formerly occupied by workspace interval 15118. If user 101 clicks on sequence label 15110-B, the dialogue box provides an option so that user 101 may indicate whether it is desired that workspace interval 15116 be shifted to the right or that workspace interval 15118 be shifted to the left. In the illustrated embodiment, when a constant-time line is deleted, all pulses or buses are deleted that span across two or more constant-time lines that include the deleted one.

Figure 15Q:
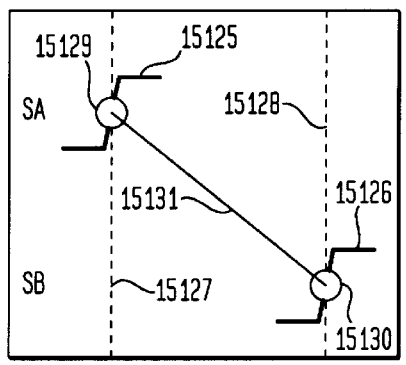
Figure 15R:
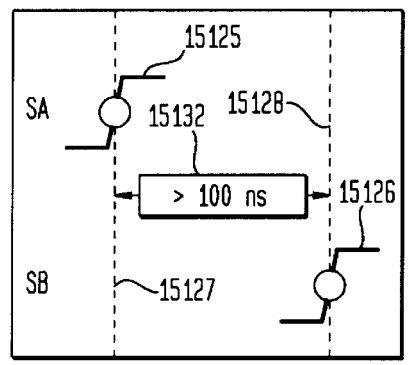

FIGS. Q and R illustrate one embodiment of techniques by which user 101 may graphically specify time limits such as those described above with respect to time limit buttons 1523 and 1524. These techniques may be used in place of, or in addition to, the use of buttons 1523 and 1524. In FIG. 15Q, user 101 has specified a rising-edge trigger event 15125 for signal "SA" at the time represented by constant-time line 15127. User 101 has also specified a rising-edge trigger event 15126 for signal "SB" at the time represented by constant-time line 15128. Rising edges 15125 and 15126 include circles 15129 and 15130, respectively. These circles may be displayed by default as part of each of trigger-condition icons 1510, or display coordinator 630 may cause them to appear, in accordance with known techniques, when user 101 clicks on a trigger event or in accordance with other known techniques. In accordance with known techniques, display coordinator 630 causes line 15131 to be drawn between the circles when user 101 clicks on one of the circles, drags to the other circle, and releases the mouse button on the other circle. A variety of other known techniques could be used to allow user 101 to establish this connection or association, which may be made between any two trigger events and is not limited to the two rising edges of this example. By making the connection or association, user 101 signifies a desire to establish time-limit parameters between the two trigger events. Thus, as shown in the embodiment illustrated in FIG. 15R, display coordinator 630 removes line 15131 and displays in its place time-limit text box 15132. Box 15132 has arrows pointing to constant-time lines 15127 and 15128 to make clear that the time limits that user 101 enters in the text box apply to the interval between those two lines. User 101 may then use any of a variety of known techniques to enter an operator, such as "<," ">," "=," or others, or various combination thereof, into text box 15132. User 101 also enters a time, such as "100 ns" as shown in the example. User 101 may also enter the text "indefinite," or other options predetermined so that they will be recognized by display coordinator 630. The time limit (i.e., time interval or range) thereby specified by user 101 may be changed by entering different operators and/or times in box 15132. Also, user 101 may deleted the specification of the time limit by deleting the entries in the box or by using any of a variety of known techniques, such as selecting the box and pressing a delete key.

Figure 15S:
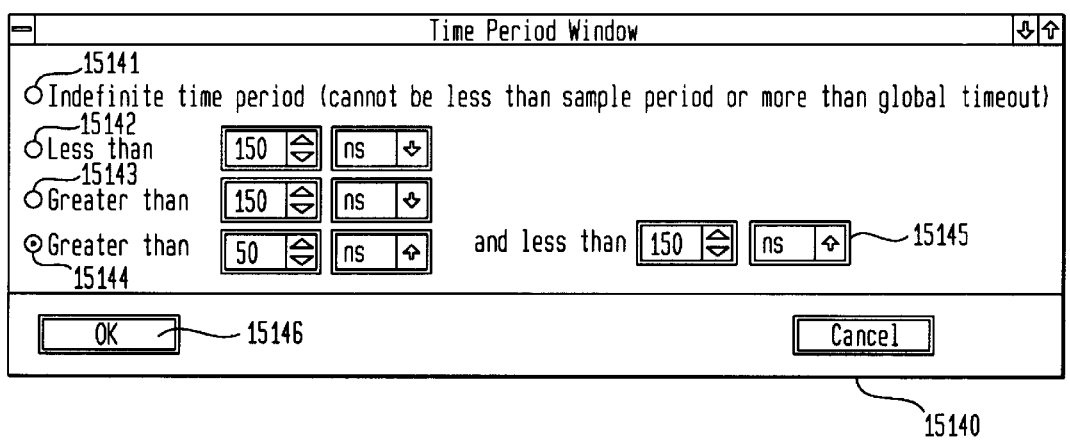

FIG. 15S provides additional detail with respect to another technique by which user 101 may specify time limits, described in more general terms above with respect to time-limit buttons 1523 and 1524. In the illustrated embodiment, these buttons have a default value of "indefinite time period." That is, the interval between the constant-time lines adjacent to each button may be any time greater than one sampling period. In some implementations, the time-limit buttons may be grayed-out, i.e., de-emphasized, until user 101 has positioned at least one trigger-condition element in the workspace interval beneath the button. In some implementations, time limit buttons, such as illustrative buttons 1523 and 1524, may be text boxes as described above with respect to box 15132, they may be combo boxes, or they may enable user input in accordance with other known techniques. For example, in another implementation, user 101 clicks on a time-limit button and time-period window 15140 opens, as shown in FIG. 15S. With reference to FIG. 15A, and in accordance with known techniques, user 101 may move, resize, minimize, and otherwise manipulate this window to reduce interference with viewing of GUI 182-5A. Window 15140 in this implementation includes option buttons 15141–15144. User 101 may select button 15144 to specify that the interval established by the time-limit button is an indefinite time period (equal to or greater than the sample period, and less than a global timeout). Buttons 15142–15144, together with associated combo boxes for time value and time scale, enable user 101 to specify the time interval or specify a range by choosing "less than w," "greater than x," "greater than y and less than z," or any combination thereof. When user 101 clicks on OK button 15146, display coordinator 630 changes the label of the time-limit button to display the interval specified by user 101.

As will be described below, trigger specifier 640 typically uses trigger-condition rules to resolve ambiguities that may be presented when user 101 specifies trigger conditions for more than one signal and/or bus for the same constant-time line. Some or all of these rules may be predetermined, or, alternatively, some or all of them may be user-selectable. It will be understood that various rules may be employed in various embodiments, and the predetermined rules described herein are therefore illustrative only. FIGS. 15S, T, and U illustrate some of these ambiguities and possible implementations of rules. For convenience and clarity in describing rules and operations related to these Figures, the word "edge" may be used to refer to a trigger-condition element resulting from the placement by user 101 of any one of trigger-condition icons 1510-A (rising edge), 1510-B (falling edge), or 1510-C (either edge). The word "bus" may be used to refer to a bus trigger-condition element resulting from the placement by user 101 of bus trigger-condition icons 1510-G. Similarly, the words "high," "low," and "pulse," refer to placements of trigger-condition icons 1510-E, 1510-D, and 1510-H, respectively. "High/low" means high or low.

Figure 15T:
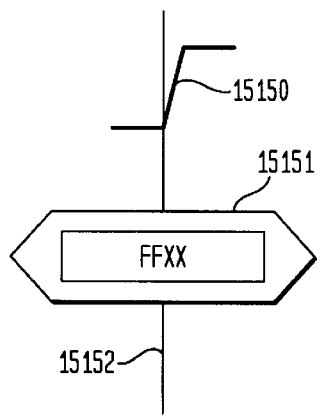
Figure 15U:
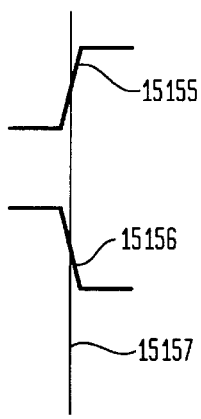

In FIG. 15T, user 101 has positioned rising edge 15150 and bus trigger-condition 15151 on constant-time line 15152. In accordance with predetermined rules applied by trigger specifier 640 in the illustrated embodiment, the occurrence of an edge and a bus on the same constant-time line establishes a trigger condition that is satisfied if, at some point in time, the edge exists while the bus pattern exists. No assumption is made regarding the duration of the bus pattern. This rule is represented in the table shown in FIG. 15V by the word "AND" in the matrix elements corresponding to the combination of "Bus" and "Edge." In FIG. 15U, user 101 has positioned rising edge 15155 and falling edge 15156 on constant-time line 15157. In accordance with the illustrative predetermined rules, the occurrence of two edges on a constant time line establishes a trigger condition that is satisfied if either edge occurs. This rule is represented in the table shown in FIG. 15V by the word "OR" in the matrix elements corresponding to the combination of "Edge" and "Edge." Other rules, as shown in the table of FIG. 15V, are: edge and high/low=AND; Edge and Pulse=OR; high/low and high/low=AND; high/low and pulse=AND; high/low and bus=AND; and pulse and pulse=OR; pulse and bus= AND.

Moreover, trigger specifier 640 applies additional rules to address the occurrences of more than two trigger-condition elements on the same constant-time line. In one implementation of the rules, the OR rule of two edges takes precedence over any AND rule with respect to the same constant-time line. For example, if edge1, edge2, and bus1 are in the same constant-time line, then a boolean expression for the applicable rule in this implementation is ((edge1 or edge2) and bus1).

As noted, rather than relying on predetermined rules, trigger specifier 640 may employ user-specified rules, or a combination thereof. FIG. 15W shows a boolean-expression combo box 15182 by means of which user 101 may specify a boolean expression to override a predetermined rule. In the illustrated embodiment, display coordinator 630 causes this combo box to be displayed when user 101 positions a trigger-condition element on a same constant-time line on which another trigger-condition element is already positioned. In the example of FIG. 15W, user 101 has positioned bus 15180 on the same constant-time line as bus 15184 is already positioned. Thus, display coordinator 630 displays combo box 15182 between the buses so that user 101 may select a boolean expression.

FIG. 15X illustrates an additional feature, exemplified by trigger-description box 15199, that may be included in GUI 182-5A and other embodiments. In FIG. 15X, user 101 has specified trigger conditions for a signal named "OE," as selected from combo box 15192, and a signal named "M/IO," as selected from combo box 15194. With respect to signal OE, user 101 has positioned rising edge 15190 on constant-time line 15193 and high-level 15196 on the subsequent constant-time line 15195. With respect to signal M/IO, user 101 has positioned falling edge 15198 on constant-time line 15195. These graphically portrayed trigger-condition elements, as noted, provide user 101 with a readily understandable representation of the trigger conditions that user 101 has specified. However, user 101 may also benefit from a textual representation of those trigger conditions, especially with respect to resolving ambiguities regarding the combination of trigger conditions occurring at the same constant-time line. Thus, in some implementations, trigger specifier 640 parses and analyzes user-selected trigger data 608, which includes the data generated by GUI 182-5A as further implemented by some or all of the features described in FIGS. 15B–15W. With respect to FIG. 15X, data 608 thus includes names 15192 and 15194, events 15190, 15196, and 15198, and the location of the specified events on constant-time lines 15193 and 15195. Using this information, together with either predetermined or user-selected boolean rules as described above, trigger specifier 640 generates a textual description of the trigger conditions. This operation may be accomplished in accordance with any of a variety of known techniques, such as parsing techniques combined with search and compare techniques applied to look-up tables. Thus, trigger-description box 15199 in this example informs user 101 that the trigger condition represented graphically in FIG. 15X is textually described as "Rising edge of OE followed by High value of EO AND Falling edge of M/IO."

(3) Generating and Storing Trigger Condition State Data 644:

In accordance with known techniques for acquiring data from graphical user interfaces, trigger specifier 640 acquires user-selected trigger data 608 from one or more of the graphical user interfaces described above with respect to FIGS. 14A–D and/or FIGS. 15A–X. With respect to the graphical user interfaces described with respect to FIGS. 14A–D, data 608 includes the trigger-conditions specified by user 101 for signals and/or buses in one or both of sub-areas 1438A and 1438B of trigger-specification area 1438. With respect to the graphical user interfaces described with respect to FIGS. 15A–X, data 608 includes the trigger-condition elements specified by user 101 for signals and/or buses in one or both of the intervals specified by time-limit buttons, such as buttons 1523 and 1524, and as defined by constant-time lines such as 1520–1522 of FIG. 15A.

In either case, the specification by user 101 of trigger data within these two sub-areas or time intervals may be considered as defining various trigger states. For example, with respect to the two sub-areas, user 101 may be said to have defined a trigger state at the beginning of the first sub-area, at the boundary between the first and second sub-areas, and at the end of the second sub-area. Similarly, user 101 may be said to have defined a trigger state at each of the three constant-time lines. It will be understood that although three trigger states have thus been described with respect to the illustrated embodiments, the states could also be fewer or greater than three in alternative embodiments. The data that describes these trigger states is hereafter referred to as trigger condition state data 644.

Figure 16:
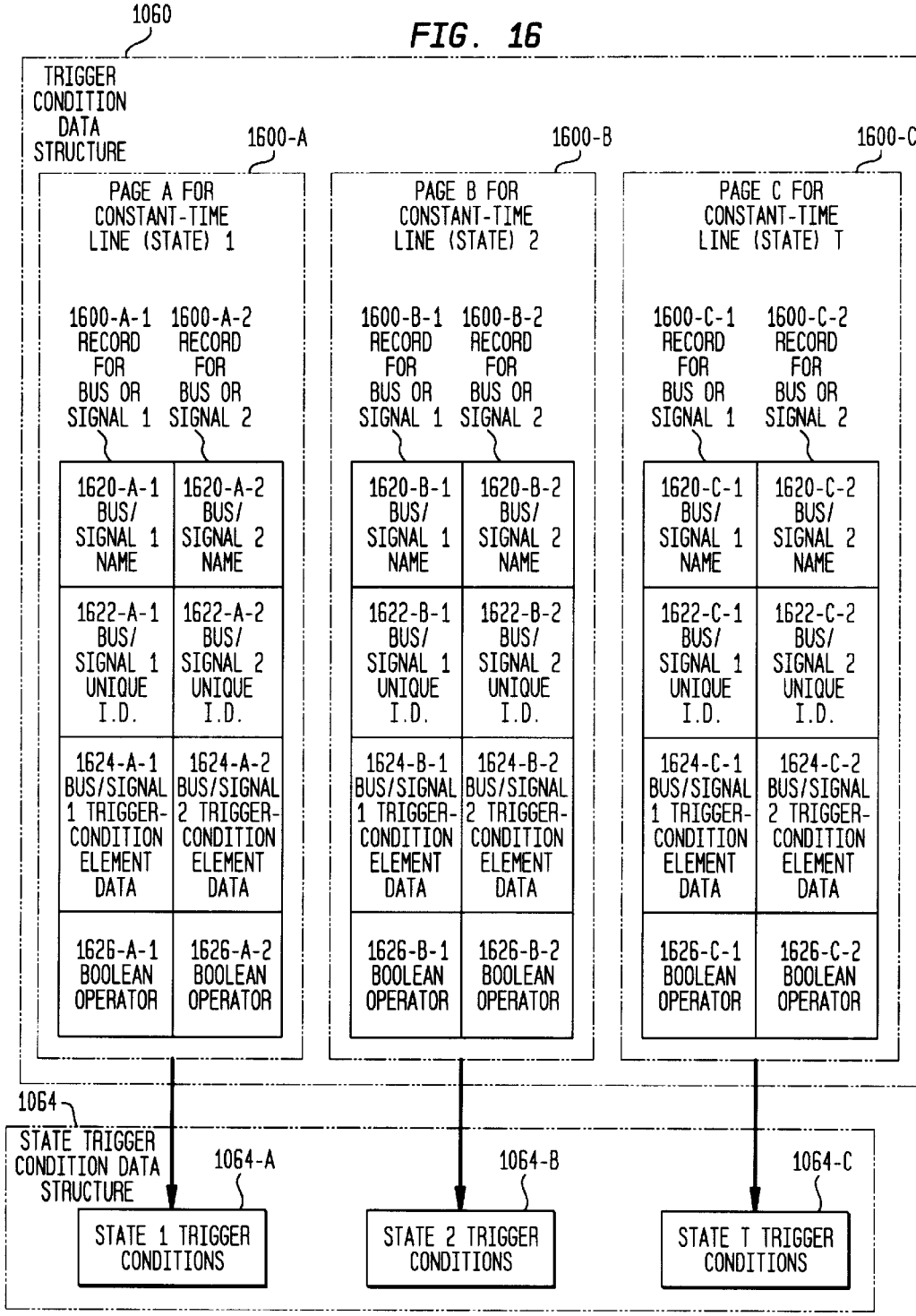
FIG. 16 is a schematic representation of one embodiment of a trigger condition data structure of the data structures of FIG. 10.

Trigger specifier 640 stores trigger condition state data 644 in trigger condition data structure 1060, a simplified schematic representation of one embodiment of which is shown in FIG. 16. It will be understood that many variations of this data structure are possible. For purposes of describing the use of data structure 1060, it is illustratively assumed that user 101 has specified trigger conditions for two signals, signal 1 and signal 2, at three states. As just noted, these three states may correspond, for example, to three constant-time lines or the boundaries of two sub-areas in various ones of GUI's 182. Data structure 1060 in this simplified illustration is divided into three pages, A, B, and C: one for each of the illustrative states. Each page includes two records, one for signal 1 and one for signal 2. Each record includes three fields. In one field of each record, generally and collectively referred to as fields 1620, specifier 640 stores the name specified by user 101 to identify the respective signal. In another field of each record, generally and collectively referred to as fields 1622, specifier 640 stores the unique identifier for the respective record as determined in accordance with known techniques such as a search and compare of data structure 1010. In the third field of each record, generally and collectively referred to as fields 1624, specifier 640 stores the information conveyed by the trigger-condition or trigger-condition element (including time-limit information), if any, that user 101 specified with respect to the respective signal for the state corresponding to the respective page in which the record is located. Thus, this information may be that the trigger condition with respect to that state includes a signal being at a high level, and that this high level occurs within a specified time limit.

For example, if user 101 specified that the trigger condition includes signal 1 having a high level at a first constant-time line, specifier 640 stores this information, in accordance with any of a variety of known techniques for formatting such data, in field 1624-A-1 as shown in FIG. 16. If user 101 further specified that the trigger condition includes signal 1 continuing to have a high level at a time represented by constant-time line 2, and that line 2 is less than 50 nanoseconds after line 1, specifier 640 also suitably formats this information and stores it in field 1624-A-2 (although the time-limit information could has well have been stored in field 1624-A-1).

Trigger specifier 640 optionally includes boolean operators (typically, either "AND," or "OR") in each record of data structure 1060 to indicate the relationship of each record with the others in its page. These boolean operators are determined as described above with respect to FIGS. 15T–W. In the illustrative embodiment, the boolean operators are stored in fields 1626. As noted, the applicable boolean operators may be predetermined, and/or they may be selected by user 101 and included in user-selected trigger data 608. Typically, "AND" operators take precedence over "OR" operators.

The results of the application by trigger specifier 640 of boolean operators 1626 to bus or signal trigger-condition element data in fields 1624 is schematically shown in FIG. 16 as state trigger condition data structure 1064. It will be understood that this representation is illustrative only, and that many ways of storing and/or manipulating this information are possible and that, in some implementations, a data structure need not be used to store the information. The information stored in, or represented by, state trigger conditions 1064A–C (state trigger conditions 1064) may be of any of a variety of forms typically used in, or compatible with, logical analysis using high-level programming languages. Continuing and expanding upon the present illustrative example, state 1 trigger conditions 1064-A may be of the form: "state 1 trigger condition is TRUE IF signal1=high AND signal2=rising edge." The value of "signal1" depends on the information in field 1624-A-1; i.e., the information represented by the trigger condition or trigger-condition element for signal 1, if any, for state 1 (or, for example, constant-time line 1). Similarly, state 2 trigger conditions 1064-B may be of the form: "state 2 trigger condition is TRUE IF signal1=high AND signal2=high AND time-limit LESS THAN 50 nanoseconds." The state 3 trigger conditions 1064-C may be similar.

Trigger specifier 640 provides state trigger conditions 1064 to trigger condition and position detector 230 in accordance with known techniques. Detector 230 then applies these state trigger conditions to determine whether the trigger condition, for each state, is satisfied by sampled data 212. Although sampled data is shown in FIGS. 3 and 5 for convenience and clarity as consisting simply of high ("1") or low ("0") levels, other conditions are possible (e.g., edges) and other constraints (e.g., time-limits) are typically applied in the illustrated embodiments. Thus, continuing the present example, detector 230 acquires a set of sampled data (i.e., data sampled at the same time) and applies the state 1 trigger conditions (1064-A) as provided by trigger specifier 640. In particular, detector 230 determines whether the sampled data for signal1 indicates a high level AND the sampled data for signal2 indicates a rising edge. If this is the case, then detector 230 applies state 2 trigger conditions (1064-B). Otherwise, detector 230 continues to apply state 1 trigger conditions until the conditions are satisfied. Similarly, if the state 1 trigger conditions are satisfied and the state 2 trigger conditions are satisfied (i.e., in this example, signal 1 is high AND signal 2 is high AND the set of sampled data that satisfied state 2 occurred less than 50 nanoseconds after the set of sampled data that satisfied state 1), then detector 230 continues to determine whether state T trigger conditions (1064-C) are satisfied. The symbol "T" is used for this state to indicate that this is the "trigger" state; i.e., if this state (being the last one in this example) is satisfied, then the trigger condition is satisfied. As noted above, when this event occurs, detector 230 communicates to data switch 240 that the trigger condition has been satisfied, or enables data switch 240 in response to this condition (see step 470 of FIG. 4), as represented by memory transfer data 232 of FIG. 2.

Display Coordinator 630

Display processor 160 also includes display coordinator 630. Display coordinator 630 coordinates the display of user-selected trigger condition data and the transfer of that data to trigger specifier 640. Display coordinator 630 also, responsive to trigger condition detector 230, causes sampled data to be displayed to user 101. Display coordinator 630 similarly provides bus and signal definition, grouping, and hierarchy data for display to user 101.

Figure 17:
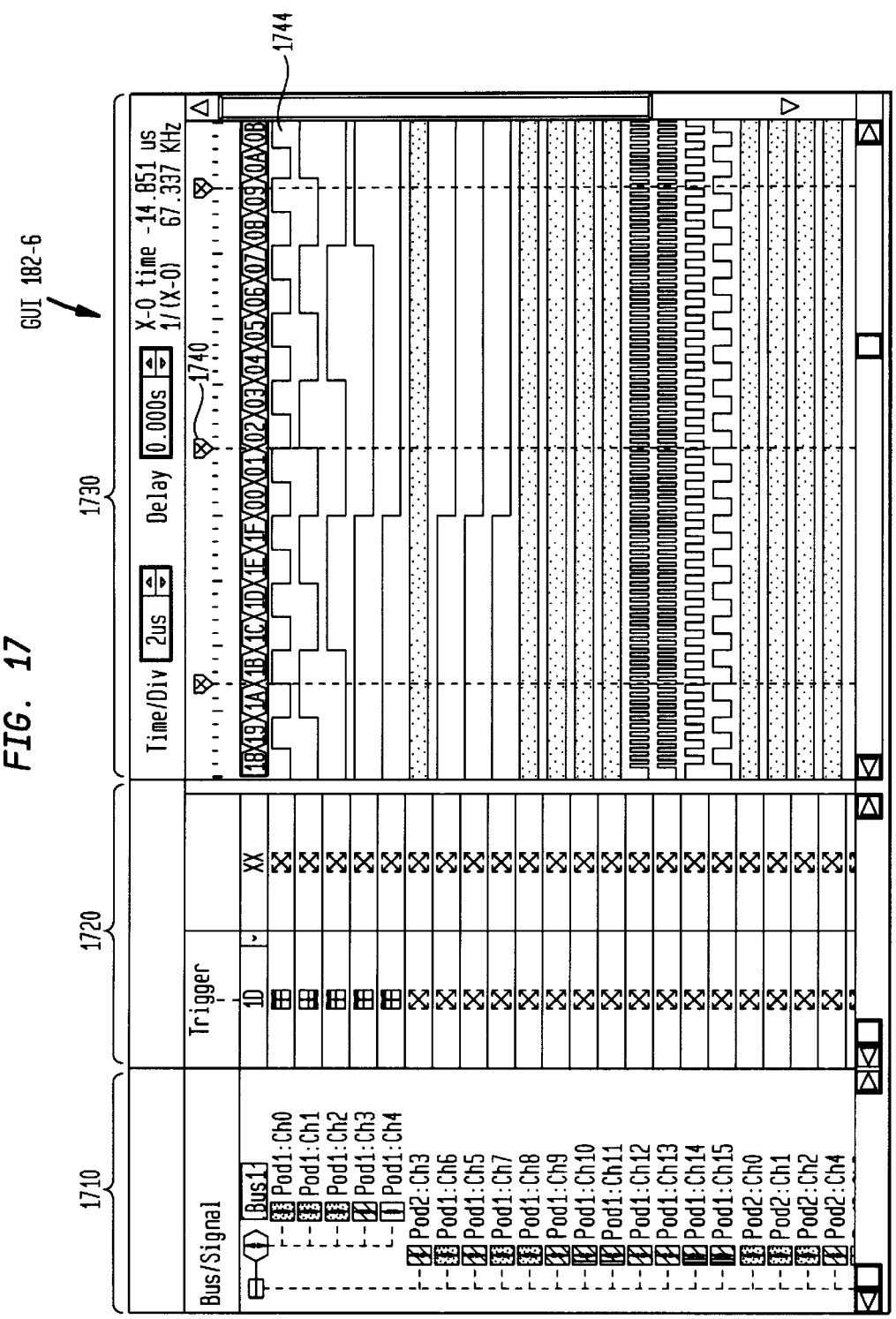
FIG. 17 is one embodiment of a graphical user interface as generated by a display coordinator of the display processor of FIG. 6.

Various coordinating functions of display coordinator 630, carried out generally in accordance with known techniques, have been described above with respect to the operations of specifiers 610, 620 and 640. The principal ones of these functions are now summarized in reference to one illustrative embodiment of a graphical user shown in FIG. 17. FIG. 17 includes bus-signal hierarchy area 1710 (similar to area 1410 of FIG. 14); trigger specification area 1720 (similar to area 1438); and signal display area 1730 (similar to area 1430).

Coordinator 630 coordinates the display of the graphical elements included in bus-signal hierarchy area 1710 as follows. In response to user-selected definition data 604 and user-selected hierarchy data 605, bus and signal specifier 620 generates bus and signal definition data 622 and bus and signal hierarchy data 624 and stores them in data structures 1010 and 1040, as described above. In response to the selection by user 101 of one or more of GUI's 182 predetermined to include all or aspects of these data, coordinator 630 accesses data structures 1010 and/or 1040. In accordance with known techniques for formatting and otherwise providing data for use in a graphical user interface, coordinator 630 provides these data as aspects of GUI display data 609 to computer 103A or B for display to user 101. In particular, with reference to the illustrative example of FIG. 17, coordinator 630 thus causes the bus and signal definition, grouping, and hierarchy data of area 1710 to be displayed.

Responsive to user-selected trigger data 608, coordinator 630 causes the graphical elements included in trigger specification area 1720 to be displayed in accordance with known techniques for responding to user selections in a graphical user interface.

Also in response to user-selected trigger data 608, trigger specifier 640 generates trigger condition data 236 and trigger position data 238 that, in coordination with trigger condition detector 230, enables the collection of sampled display data in display data structure 250. When by trigger condition detector 230 that the data in data structure 250 is ready for display, coordinator 630 causes the display of this data in signal display area 1730. This data may be displayed as waveforms, such as waveform 1744, for each bus and signal having a name displayed in area 710, or as a listing of data values for those buses and signals (as in signal display area 1478 of FIG. 14D). Coordinator 630 may determine which of these types of formats to use for the display of data samples based on predetermined formats for particular ones of GUI's 182 selected by user 101, or based on user-selected definition data 604. Trigger specifier 640 provides trigger condition information to display coordinator 630 so that, for example, trigger line 1740 of FIG. 17 may be displayed to show user 101 the temporal location at which the user-specified trigger condition was satisfied.

Having now described various embodiments of the present invention, it should be apparent to those skilled in the relevant art that the foregoing is illustrative only and not limiting, having been presented by way of example only. Many other schemes for distributing functions among the various functional elements of the illustrated embodiment are possible in accordance with the present invention. The functions of any element may be carried out in various ways in alternative embodiments. Also, the functions of several elements may, in alternative embodiments, be carried out by fewer, or a single, element.

For example, for purposes of clarity the functions of logic analyzer 100 are described as being implemented by signal processor 140 and display processor 160, although the invention need not be divided into these distinct functional elements. That is, some or all of the functions of signal processor 140 could be implemented by display processor 160, and vice versa. Similarly, operations of a particular functional element that are described separately for convenience need not be carried out separately. For instance, the operations of bus and signal specifier 620 are separately described with respect to receiving and generating data for storage in bus/signal definition data structure 1010 and for receiving and generating data for storage in hierarchy display data structure 1040. However, these operations need not be separated, nor need separate data structures be used.

Also, the sequencing of functions or portions of functions generally may be altered. For example, some of the method steps shown in FIG. 4 need not be carried out in the order suggested by the figure: step 420 may be carried out before step 410, and so on. The functions of bus and signal specifier 620 generally need not be carried out before the functions of trigger specifier 640, and so on.

Also, some of the functions of processors 140 and 160 are described with respect to the illustrated embodiment as being coordinated by, or implemented in conjunction with, computer 103. Either or both of processors 140 and 160 may, in alternative embodiments, carry out the functions ascribed above to computer 103, or computer 103 could carry out various functions of processors 140 or 160. Also, it will be understood that, for purposes of clarity, some well-known operations of computer 103 have not explicitly been shown in the figures or described above. For example, sampling data 162 is shown in FIG. 2 as being communicated directly from display processor 160 to sampler 210 of signal processor 140. In a typical implementation, however, this communication may be controlled and coordinated by computer 103 using communication channels such as system bus 104 and other elements of computer 103, such as input-output controllers 130, processor 105, and operating system 110.

Similarly, in some embodiments, any functional element may perform fewer, or different, operations than those described with respect to the illustrated embodiment. For example, in some embodiments, display processor 160 may not provide sampling data 162 to sampler 210. As another example, sampler 210 may not store sampled data 212 in memory buffer 220 in some implementations. Rather, this data may be stored directly into data structure 250.

Certain functional elements, data structures, instructions, data, graphical elements, displays, applications, and so on, are described in the above embodiment as located in system memory 120 or memory storage device 125 of computer 103 and/or in data structure 250 or memory buffer 220 of signal processor 140. In other embodiments, however, they may be located on, or distributed across, computer systems or other platforms that are remote from either or both of computer 103 or signal processor 140. For example, any one or more of data structures 1010, 1040, 1060–1064, and 250 may be located in a computer system or systems remote from computer 103 and/or signal processor 140. In this case, the operations of logic analyzer 100 with respect to processing and/or displaying information stored in these data structures may be carried out over a network or by any of numerous other known means for transferring data and/or control to or from a remote location.

There are many possible variations of the architecture for the data structures referred to above. It will be understood that the term "data structure" is used broadly herein to include any known or future method or technique for storing information or otherwise making it available to be operated upon or used. For example, a data structure may be data included in an "object" as that term is used in object-oriented programming languages and techniques. As additional non-limiting examples, a data structure may be an array, a map, a hash table, or a list. A data structure also includes data communicated or provided, during one or many procedures, by passing arguments, naming or establishing variables, or by similar methods.

Data in data structures may, in alternative embodiments, be saved in different combinations of data structures than those shown in the illustrative embodiment, or in a single data structure. Data may be saved in, or shifted between, data structures in a variety of ways. For example, sampler 210 may store groups of two or more samples in memory buffer 220 rather than storing each sample as it is generated. Similarly, the contents of memory buffer 220 may be switched in two or more phases to data structure 250 rather than being switched when memory buffer 220 has been filled with sampled data appropriate for use as display data. For instance, sampler 210 may store sampled data 212 in memory buffer 220 until the trigger condition has been met, and thereafter store sampled data 212 directly into data structure 250 until the trigger position specification has been satisfied. As an example of combined data structures, the fields of the records of trigger condition data structure 1060 could be combined with the fields of bus/signal definition data structure 1010. As yet another example, data shown as being transferred between functional elements, such as data 216 between specifier 610 and sampler 210, may be passed as arguments, stored in separate and/or intermediate data structures or objects, stored in the same data structures or objects, and so on. Also, as will be evident to those skilled in the relevant art, the values in data structures generally are initialized or re-initialized in accordance with any of a variety of known techniques to provide that such values are accurate.

In addition, it will be understood by those skilled in the relevant art that control and data flows between and among functional elements of the invention and various data structures may vary in many ways from the control and data flows described above. More particularly, intermediary functional elements (not shown) may direct control or data flows; the functions of various elements may be combined, divided, or otherwise rearranged to allow parallel processing or for other reasons; intermediate data structures may be used; various described data structures may be combined; the sequencing of functions or portions of functions generally may be altered; and so on. Numerous other embodiments, and modifications thereof, are contemplated as falling within the scope of the present invention as defined by appended claims and equivalents thereto.

What is claimed is:

1. A signal measurement system comprising:
   a display device;
   a display processor configured to display a graphical user interface on the display device and to enable a user to draw on the graphical user interface a pictorial representation of a waveform specifying a trigger condition for a desired signal or bus; and
   a signal processor that captures the signal or bus upon the occurrence of the user-specified trigger condition, wherein the waveform comprises one or more waveform portions drawn by the user in different positions on the graphical user interface defining a relative temporal sequence between the waveform portions, and wherein the waveform portions collectively define the trigger condition for the desired signal or bus.

2. The signal measurement system of claim 1, wherein the display processor renders each of the one or more waveform portions in response to the user graphically positioning trigger condition icons on the graphical user interface, wherein each trigger condition icons on the graphical user interface, wherein each trigger condition icon represents a trigger condition of a signal or bus for which a representative waveform portion is rendered.

3. The signal measurement system of claim 2, wherein each trigger condition icon has an image of the shape of the represented trigger condition, and wherein the waveform portion generated in response to the positioning thereof has a shape that corresponds to the displayed shape of the represented trigger condition.

4. The system of claim 2, wherein:
   the display processor is further configured to enable the user to position the trigger condition icons using graphical drag and drop techniques.

5. The signal measurement system of claim 1, wherein the graphical user interface comprises:
   a waveform workplace area in which the user draws the waveform to specify the trigger condition; and
   a bus/signal name area in which is displayed name labels for one or more signals or buses including the desired signal or bus.

6. The signal measurement system of claim 5, wherein the waveform drawn by the user in the waveform workplace area is visually associated with the name label of the desired signal or bus.

7. The signal measurement system of claim 6, wherein the visual association is achieved by horizontal alignment of the name label of the desired signal or bus and the waveform.

8. The signal measurement system of claim 6, wherein the name labels are user-specified.

9. The signal measurement system of claim 8, wherein the bus/signal name area has rendered therein an arrangement of combo boxes each of which enables the user to graphically select a name label for a desired signal or bus.

10. The signal measurement system of claim 5, wherein the display processor renders the name labels so that they are visually associated with each other in a hierarchical structure.

11. The signal measurement system of claim 10, wherein the hierarchcal structure is a vertically-aligned hierarchical structure.

12. The signal measurement system of claim 5, wherein the graphical user interface comprises:
   a palette area having displayed therein trigger condition icons from the group consisting of rising-edge icon, falling-edge icon, either-edge icon, high-level icon, don't care icon, bus icon, positive pulse icon, and negative pulse icon.

13. the signal measurement system of claim 12, wherein time line buttons are displayed on the graphical user interface so as to be associated with the constant time lines and which enable the user to specify time or time limits between successive constant time lines.

14. The signal measurement system of claim 5, wherein the waveform workspace area is divided into regions each corresponding to and visually associated with a name label of a signal or bus and adapted to have displayed therein the wafeform drawn by the user for the corresponding name label.

15. The signal measurement system of claim 14, wherein the regions of the waveform workspace area are delineated by constant time lines extending through the regions of the waveform workplace area orthogonal to a direction indicative of time.

16. The signal mesurement system of claim 1, wherein the signal measurement system is a logic analyzer.

17. A method for enabling a user to graphically specify, in a signal measurement system gaving a display device, a trigger condition for a desired signal or bus, the method comprising the steps of:
   (1) displaying on the display device a graphical user interface having a bus/signal name area in which name labels of signals and buses can be displayed, and a waveform workspace area in which is displayed a waveform defining a trigger condition for a signal or bus represented by a name label visually associated with the waveform;
   (2) receiving user inputs through the graphical user interface indicating the user has graphically specified a desired signal or bus in the bus/signal name area; and
   (3) receiving user inputs through the graphical user interface indicating the user has drawn a waveform in the waveform workspace area to define a trigger condition for the desired bus or signal.

18. The method of claim 17, wherein the graphical user interface displayed in step (1) also comprises a waveform palette area in which a plurality of trigger condition icons are displayed, each trigger condition icon representing a trigger condition, and wherein step (3) comprises the steps of:
   (a) receiving user inputs indicating that the user has graphically repositoned one or more trigger condition icons from the waveform palette area to a position in a region of the waveform workspace area associated with the desired signal or bus; and
   (b) rendering at each location at which a trigger condition icon is positioned, a waveform portion, wherein the rendered waveform portions have a relative temporal sequence determined by the relative position of the trigger condition icons in the associated region of the waveform workplace area.

19. The method of claim 18, wherein each trigger condition icon has an image of the shape of the represented trigger condition, and wherein the waveform portion generated in response thereto has a shape that corresponds to the displayed shape of the represented trigger conditions.

20. The method of claim 18, wherein the graphical repositioning of one or more trigger conditions icons is achieved by dragging and dropping the trigger condition icons.

21. The method of claim 17, wherein the visual association is achieved by horizontal alignment of the name label and the waveform.

22. The method of claim 17, wherein step (2) of receiving user inputs through the graphical user interface indicating the user has graphically specified a desired signal or bus in the bus/signal name area comprises the step of:

(a) displaying combo boxes adapted to display a user-specified signal or bus name label, wherein the combo boxes are arranged such that they are visually associated with each other in a hierarchical structure; and (b) receiving an indication that the user has specified in one or more combo boxes a name label for the desired signal or bus.

23. The method of claim 22, wherein the hierarchical structure is vertically-aligned hierarchical structure.

24. The method of claim 17, wherein the step (1) of displaying on the display device a graphical user interface having a waveform workspace area comprising displaying a waveform workspace area divided into regions each such region corresponding to and visually associated with a name label of a signal or bus and adapted to have displayed therein the waveform drawn by the user for the corresponding name label.

25. The method of claim 24, wherein the step (1) further comprising displaying constant time lines that extend through the regions of the waveform workspace area in a direction that is orthogonal to a direction of the regions that is indicative of time, wherein the constant time lines delineate the regions of the waveform workspace area.

26. The method of claim 25, wherein the step (1) of displaying on the display device a graphical user interface having a waveform workspace area comprising displaying time line buttons on the graphical user interface so as to be associated with the constant time lines and which enable the user to specify time or time limits between successive constant time lines.

27. A logic analyzer comprising;

a display device;

a display processor configured to display on the display device a graphical user interface comprising, a bus/signal name area in which is displayed user-specified name labels for one or more signals or buses including the desired signal or bus, and a waveform workplace area in which a user can draw on the graphical user interface a pictorial representation of a waveform specifying a trigger condition for a visually-associated signal or bus, the waveform comprising one or more waveform portions rendered in response to the to the user graphically positioning trigger condition icons on the graphical user interface, wherein each trigger condition icon represents a trigger condition of a signal or bus, and for which a representative waveform portion is rendered, the relative position of the user-positioned icons defining a relative temporal sequence between the waveform portions; and a signal processor that captures the signal or bus upon the occurrence of the user-specified trigger condition.

28. The logic analyzer of claim 27, wherein each trigger condition icon has an image of the shape of the represented trigger condition, and wherein the waveform portion generated in response to the positing thereof has a shape that corresponds to the displayed shape of the represented trigger condition.

29. The logic analyzer of claim 27, wherein the visual association is achieved by horizontal alignment of the name label of the desired signal or bus and the waveform, wherein the display processor renders the name labels so that they are visually associated with each other in a vertically-oriented hierarchical structure.

* * * * *